US007679667B2

(12) United States Patent
Goto

(10) Patent No.: US 7,679,667 B2
(45) Date of Patent: *Mar. 16, 2010

(54) SOLID-STATE IMAGE SENSOR USING JUNCTION GATE TYPE FIELD-EFFECT TRANSISTOR AS PIXEL

(75) Inventor: Hiroshige Goto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 385 days.

This patent is subject to a terminal disclaimer.

(21) Appl. No.: 11/691,225

(22) Filed: Mar. 26, 2007

(65) Prior Publication Data

US 2007/0187788 A1    Aug. 16, 2007

Related U.S. Application Data

(62) Division of application No. 10/292,487, filed on Nov. 13, 2002, now Pat. No. 7,236,197.

(30) Foreign Application Priority Data

Nov. 13, 2001   (JP)   ............................ 2001-347690

(51) Int. Cl.
*H04N 3/14* (2006.01)
*H01L 29/768* (2006.01)
*H01L 27/148* (2006.01)
*H01L 31/113* (2006.01)

(52) U.S. Cl. .................. 348/308; 257/230; 257/223; 257/258; 257/292

(58) Field of Classification Search ............. 348/308, 348/241; 257/223, 230, 292, 258
See application file for complete search history.

(56) References Cited

U.S. PATENT DOCUMENTS 3,721,839 A    3/1973    Shannon (Continued)

FOREIGN PATENT DOCUMENTS

DE    43 31 391 A1    3/1995

(Continued)

OTHER PUBLICATIONS

P. Klein, et al. "A DEPFET pixel Bioscope for the use in autoradiography", Nuclear Instruments and Methods in Physics Research, XP-004238231, vol. 454, No. 1, Nov. 1, 2000, pp. 152-157.

(Continued)

*Primary Examiner*—John M Villecco
(74) *Attorney, Agent, or Firm*—Oblon, Spivak, McClelland, Maier & Neustadt, L.L.P.

(57) ABSTRACT

A source region and drain region are formed in a surface region of a first semiconductor region. Moreover, a second semiconductor region connected to the drain region is formed in the surface region of the first semiconductor region. A third semiconductor region is formed in the first semiconductor region under the second semiconductor region, connected to the second semiconductor region, and accumulates signal charges in accordance with an incident light. A fourth semiconductor region is formed in the surface region of the first semiconductor region between the drain region and source region. Moreover, these source region, drain region, second semiconductor region, and third semiconductor region constitute a pixel, and different voltages are supplied to the drain region in an accumulation period of the signal charges in the pixel, signal readout period, and discharge period of the signal charges.

8 Claims, 35 Drawing Sheets

U.S. PATENT DOCUMENTS

| | | | |
|---|---|---|---|
| 4,586,084 A | 4/1986 | Imai | |
| 4,587,562 A | 5/1986 | Imai et al. | |
| 4,626,915 A | 12/1986 | Takatsu | |
| 4,878,120 A | 10/1989 | Matsumoto et al. | |
| 4,952,996 A | 8/1990 | Nishizawa et al. | |
| 5,430,312 A | 7/1995 | Yamada | |
| 5,528,059 A * | 6/1996 | Isogai | 257/187 |
| 5,619,049 A | 4/1997 | Kim | |
| 5,808,333 A | 9/1998 | Maruyama et al. | |
| 5,898,195 A | 4/1999 | Harada | |
| 5,936,270 A | 8/1999 | Kamada | |
| 5,942,774 A | 8/1999 | Isogai et al. | |
| 6,046,466 A | 4/2000 | Ishida et al. | |
| 6,051,857 A | 4/2000 | Miida | |
| 6,150,676 A | 11/2000 | Sasaki | |
| 6,188,093 B1 * | 2/2001 | Isogai et al. | 257/230 |
| 6,504,194 B1 | 1/2003 | Miida | |
| 6,521,920 B2 | 2/2003 | Abe | |
| 6,661,045 B2 | 12/2003 | Ishiwata | |
| 6,765,246 B2 | 7/2004 | Inagaki | |
| 6,950,134 B2 | 9/2005 | Miida | |
| 7,046,296 B2 * | 5/2006 | Shinomiya | 348/374 |
| 7,067,860 B2 | 6/2006 | Yato | |
| 2002/0167030 A1 | 11/2002 | Miida | |

FOREIGN PATENT DOCUMENTS

| | | |
|---|---|---|
| EP | 0 978 878 A2 | 2/2000 |
| EP | 1 032 049 A2 | 8/2000 |
| EP | 1 107 315 A1 | 6/2001 |
| EP | 1 128 437 A2 | 8/2001 |
| JP | 57-25777 | 2/1982 |
| JP | 59-108470 | 6/1984 |
| JP | 60-206063 | 10/1985 |
| JP | 2-304973 | 12/1990 |
| JP | 6-77454 | 3/1994 |
| JP | 8-78653 | 3/1996 |
| JP | 8-236741 | 9/1996 |
| JP | 9-260627 | 10/1997 |
| JP | 10-233964 | 9/1998 |
| JP | 2935492 | 6/1999 |
| JP | 11-195778 | 7/1999 |
| JP | 2000077539 A | 3/2000 |
| JP | 2001053260 A | 2/2001 |
| JP | 2001-160620 | 6/2001 |

OTHER PUBLICATIONS

Fiorini et al. "Continuous Charge Restoration in Semiconductor Detectors by Means of the Gate-to-Drain Current of the Integrated Front-End JFET"; Jun. 1999; IEEE Transactions of Nuclear Science; vol. 46, No. 3, pp. 761-764.

P. Lechner, et al., "Active Pixel Sensor for X-ray Imaging Spectroscopy", 2001 IEEE Nuclear Science Symposium Conference Record, XP-002436154, vol. 1, Nov. 4, 2001, pp. 15-19.

P. Holl, et al., "Active Pixel Matrix for X-ray Satellite Missions", Nuclear Science Symposium, XP-010500109, vol. 1, Oct. 24, 1999, pp. 171-175.

* cited by examiner

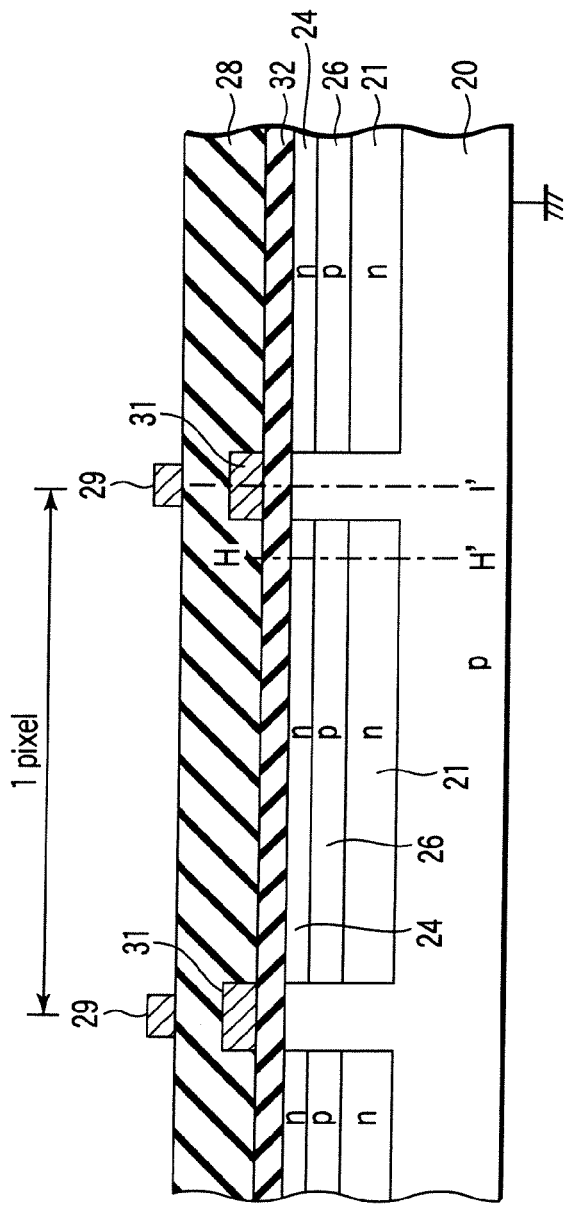
F I G. 17
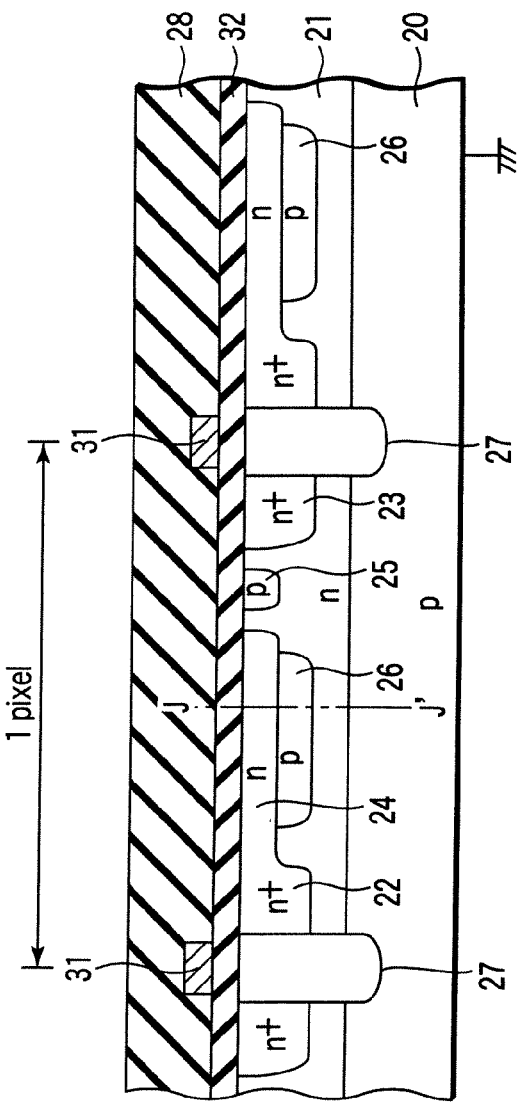
F I G. 18

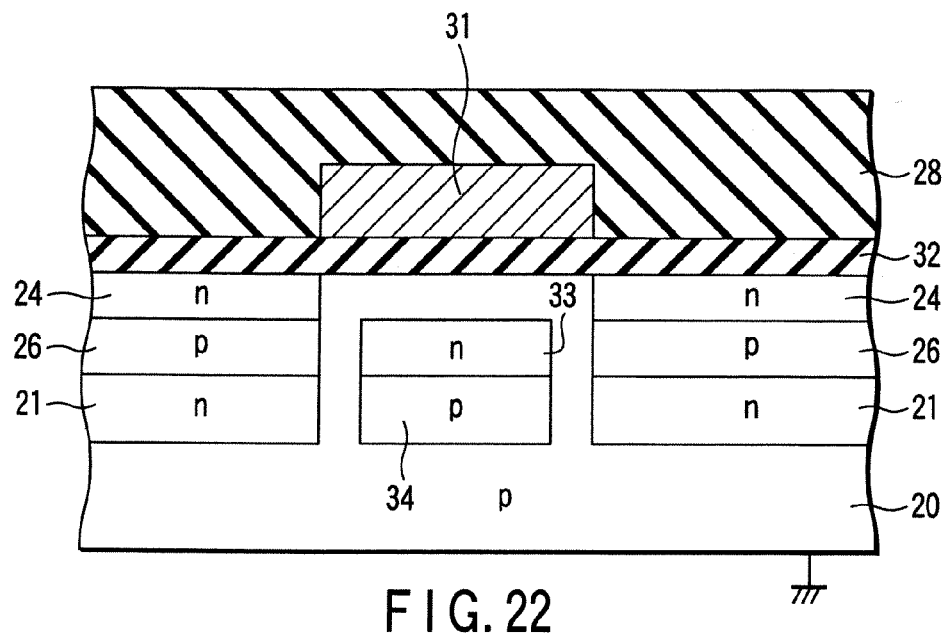
F I G. 22
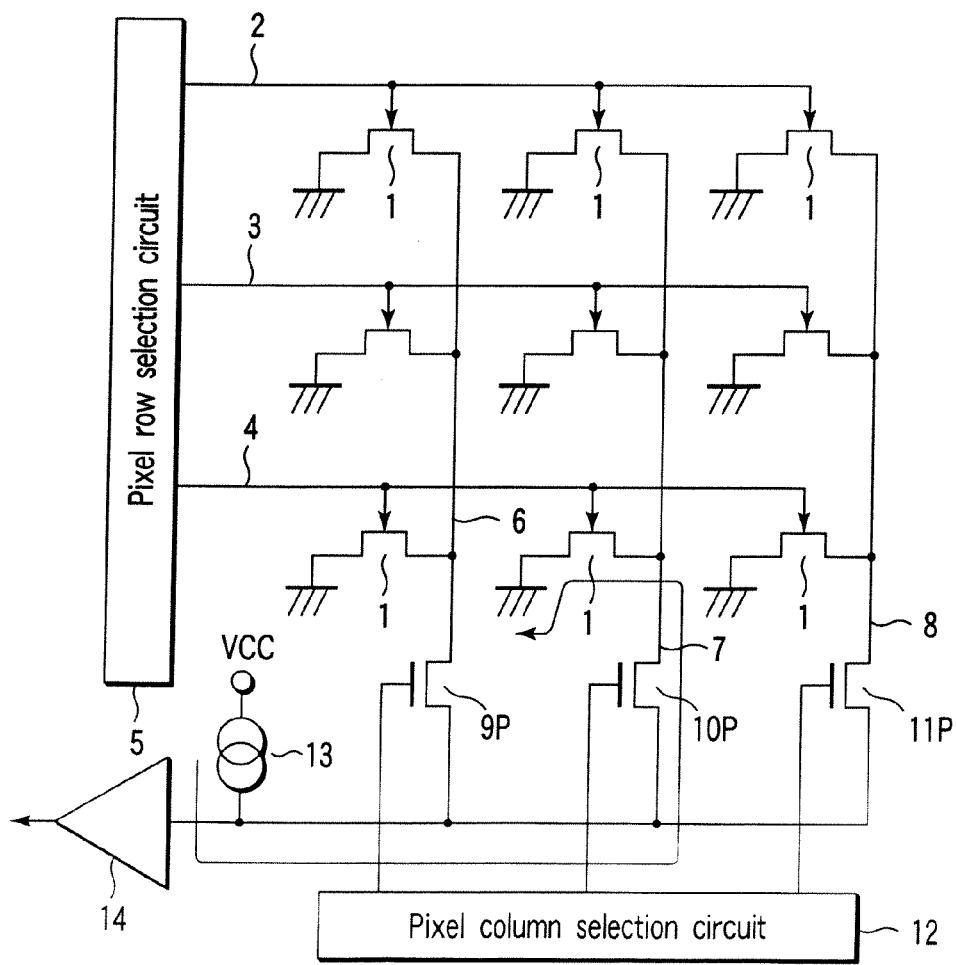
F I G. 23

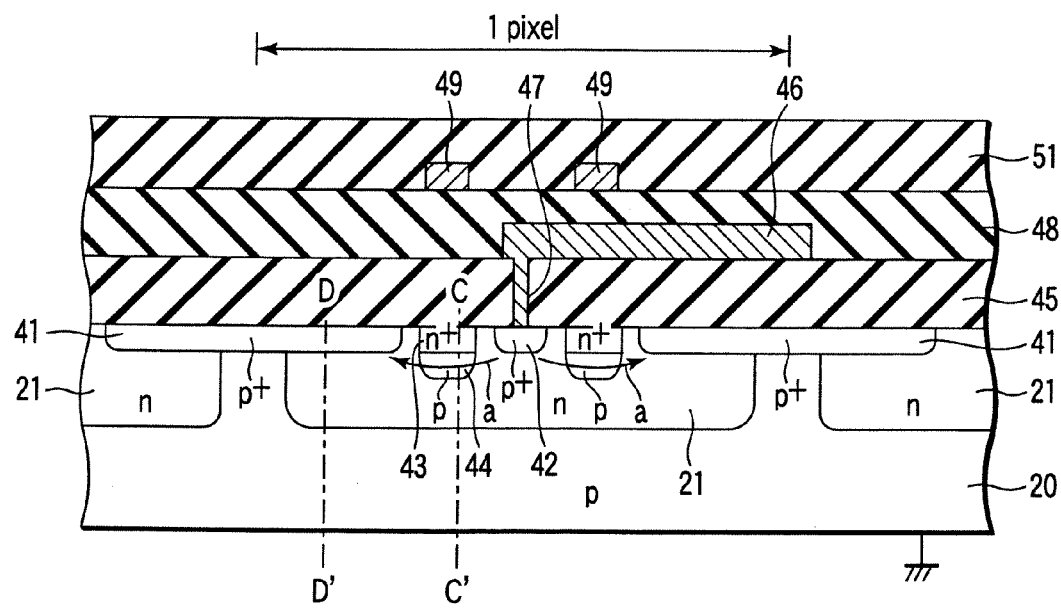
F I G. 25
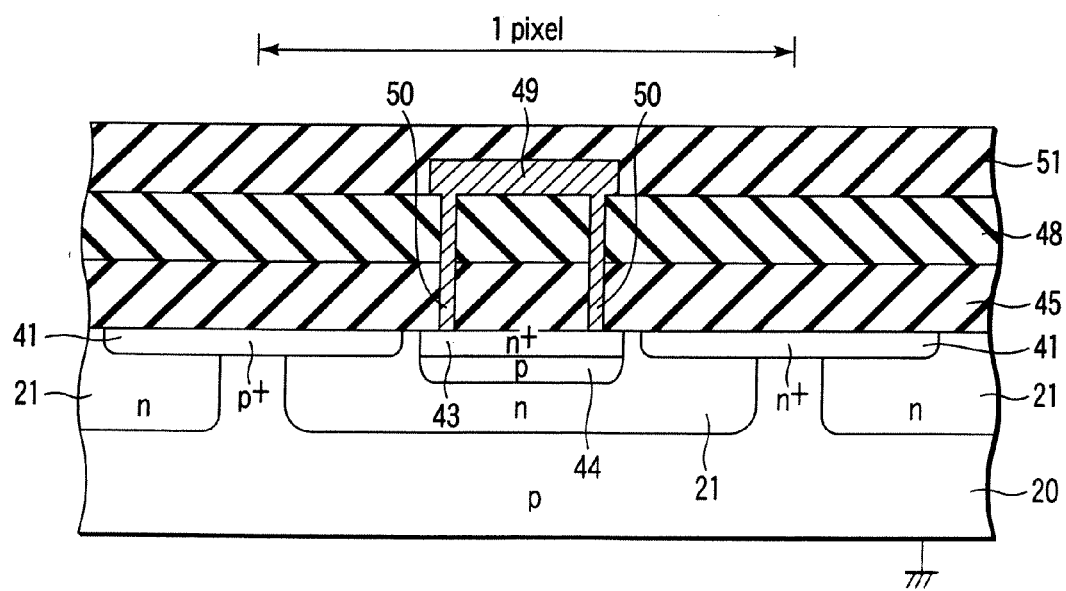
F I G. 26

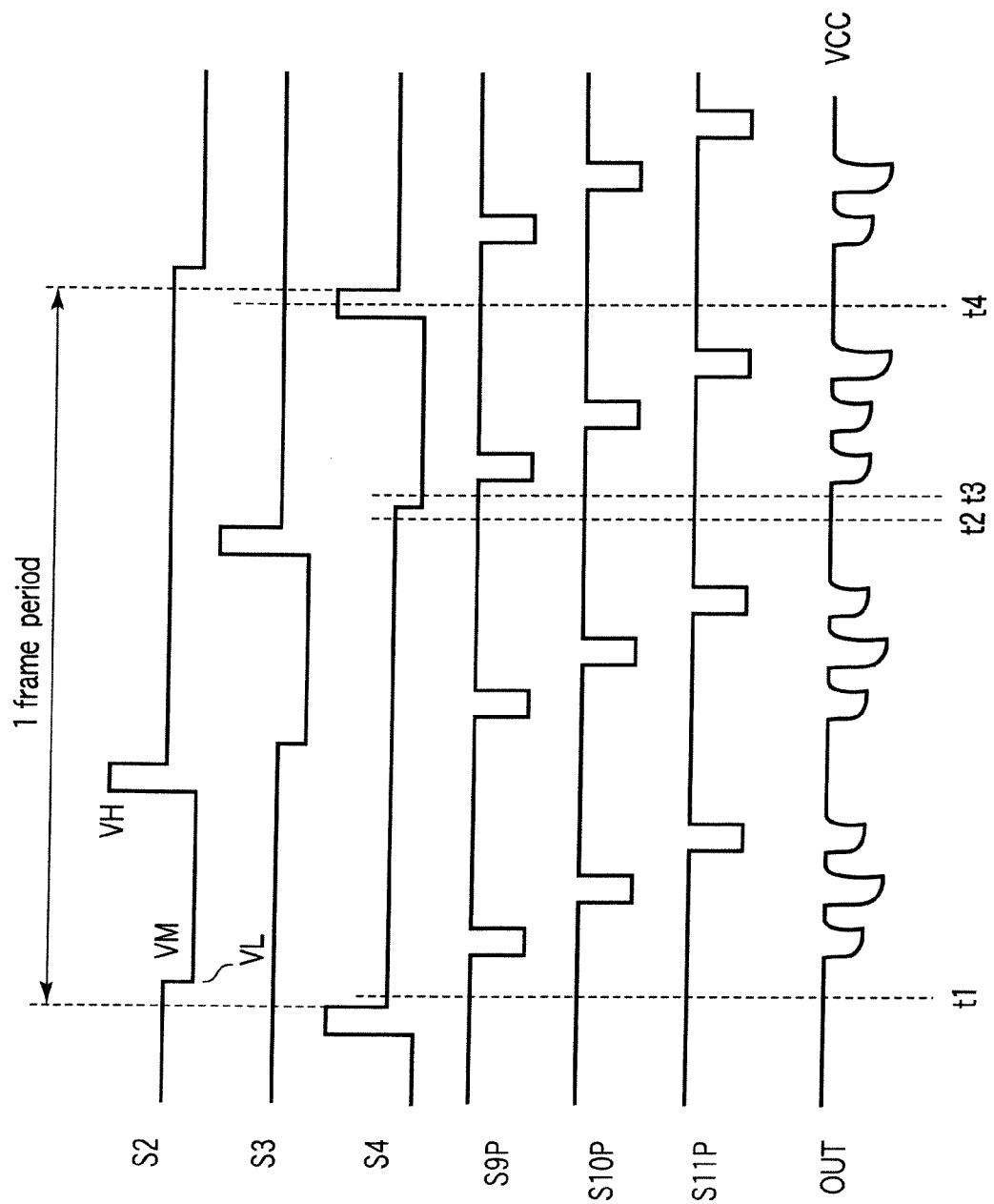
F I G. 27

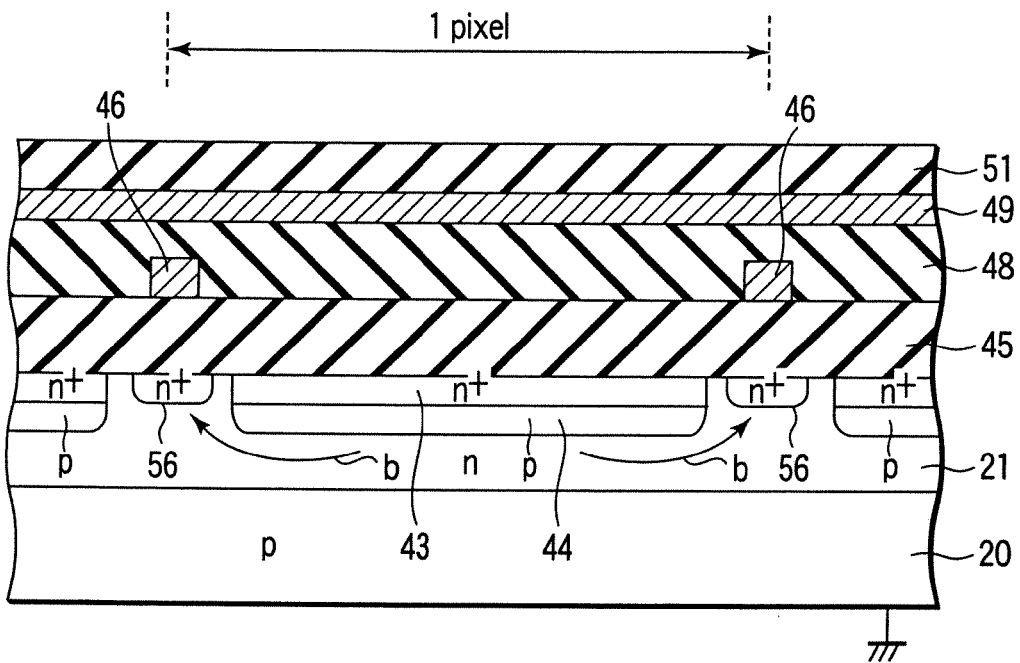
F I G. 36
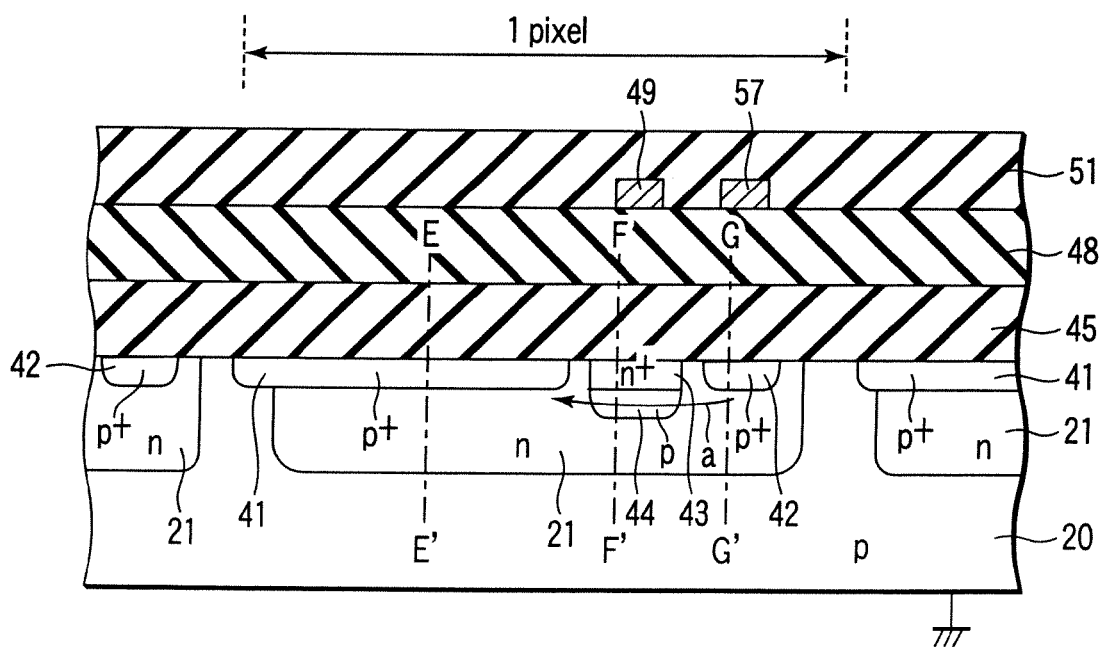
F I G. 37

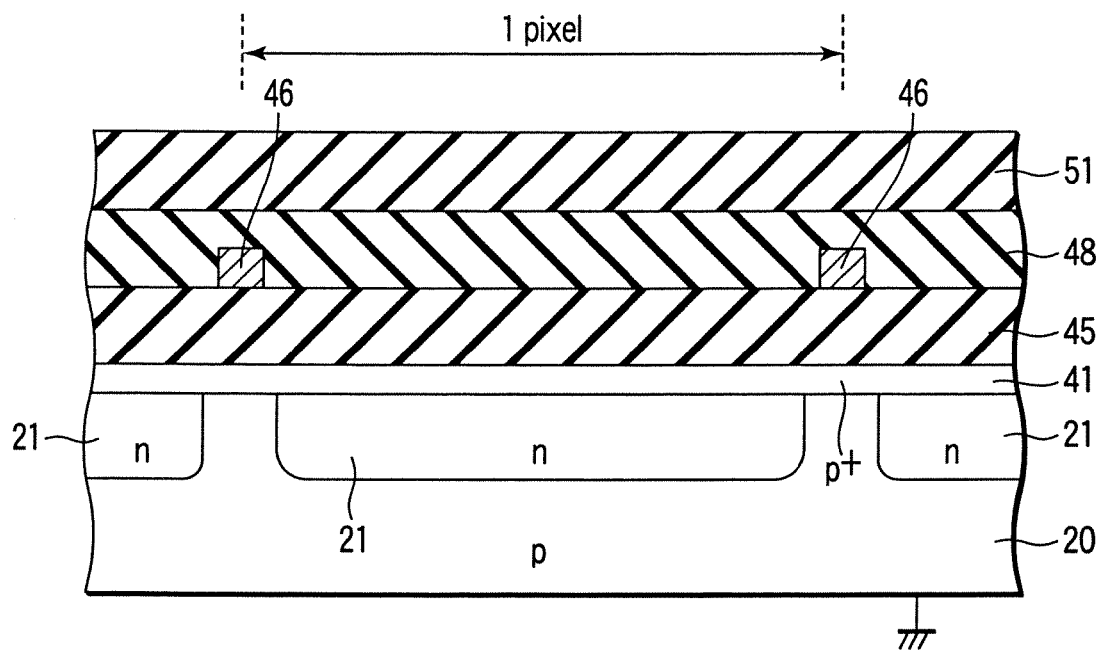
F I G. 38
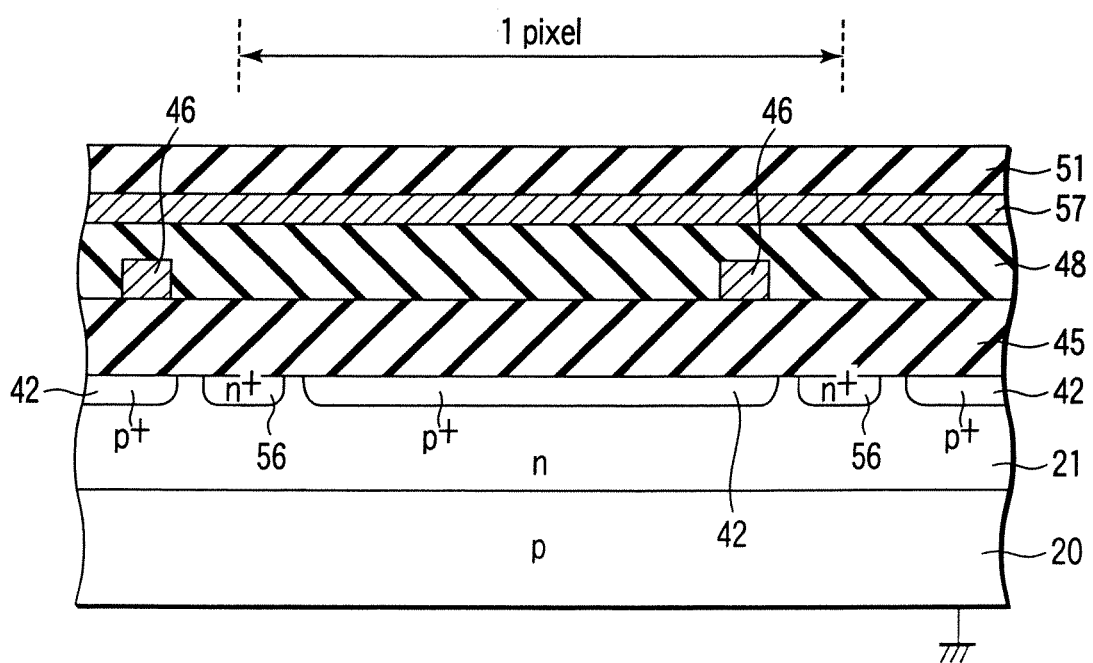
F I G. 39

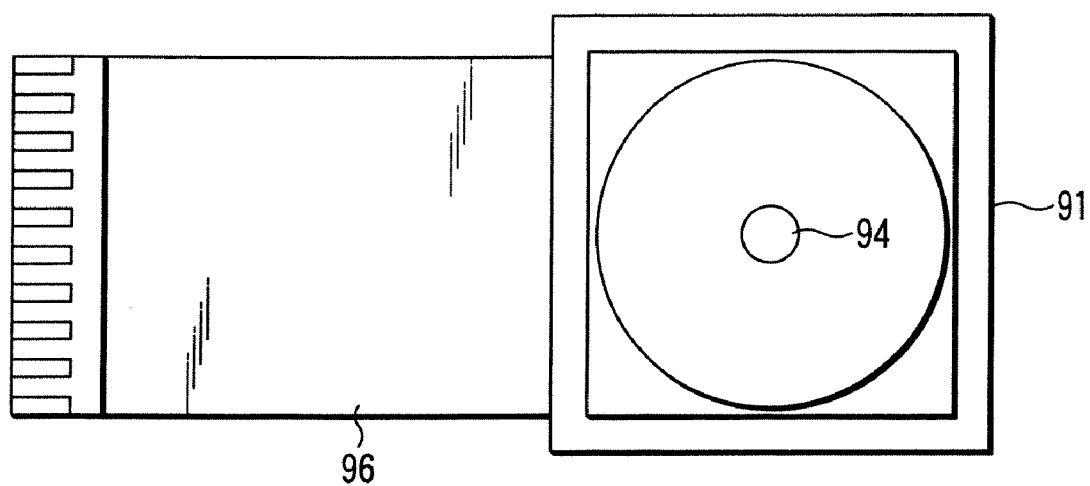
F I G. 45A
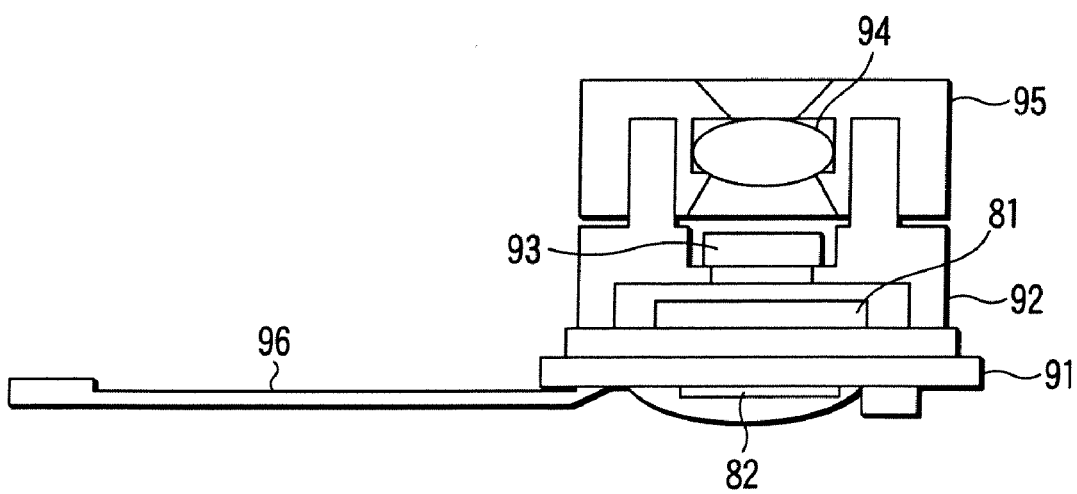
F I G. 45B

SOLID-STATE IMAGE SENSOR USING JUNCTION GATE TYPE FIELD-EFFECT TRANSISTOR AS PIXEL

CROSS-REFERENCE TO RELATED APPLICATIONS

This application is a Divisional Application of, and claims the benefit of priority under 35 U.S.C. § 120 from, U.S. application Ser. No. 10/292,487, filed Nov. 13, 2002, and claims the benefit of priority under 35 U.S.C. § 119 from Japanese Patent Application No. 2001-347690, filed Nov. 13, 2001. The entire contents of each of the above applications are incorporated herein by reference.

BACKGROUND OF THE INVENTION

1. Field of the Invention

The present invention relates to an amplification-type solid-state image sensor, particularly to a threshold voltage modulation-type solid-state image sensor using a junction gate type field-effect transistor whose threshold voltage is modulated in accordance with an incident light as a pixel.

2. Description of the Related Art

In recent years, a solid-state image sensor referred to as an amplification-type has intensively been developed in which a charge detection circuit is disposed for each pixel. Above all, a solid-state image sensor referred to as a threshold voltage modulation-type has been noted. In the solid-state image sensor, a plurality of pixels including junction-type field-effect transistors (hereinafter referred to as FET) is arranged in a matrix. Moreover, when light is incident, a signal charge is generated in each pixel, and the signal charges are accumulated in each pixel for a constant time. In each pixel, a change in a potential or threshold voltage is generated in a channel region of FET in each pixel in accordance with an accumulated amount of signal charges. Furthermore, a plurality of pixels is successively scanned following a predetermined order, and image signals are successively read, for example, by source follower type potential detection means.

A structure disclosed, for example, in FIG. 14 of Jpn. Pat. Appln. KOKAI Publication No. 8-78653 has heretofore been known as the threshold voltage modulation-type solid image sensor.

FIG. 1 shows a sectional structure of a device for one pixel of the sensor. An n-type layer 72 is formed in a p-type substrate 71, and an n+-type drain region 74 and source region 75 are formed in the surface region of the n-type layer 72 via a P+-type junction gate 73. Moreover, a MOS type gate electrode 76 for charge reset is formed adjacent to the junction gate 73.

In this solid-state image sensor, when light is incident, a plurality of electron-hole pairs is generated by photoelectric conversion. The electrons of the generated electron-hole pairs flow out to the drain region 74, and the holes are accumulated in the junction gate 73 to form the signal charge. Since the junction gate 73 is in a floating state, the potential of the junction gate 73 changes in accordance with the accumulated signal charge. Accordingly, the potential of the n-type layer 72 changes, and this is read out as the potential or current change of a source.

The solid-state image sensor shown in FIG. 1 is simple in the structure, and has a latent advantage suitable for miniaturization as compared with a charge coupled device (CCD) type. However, it cannot necessarily be said that the sensor is used in a broad range. Reasons are as follows.

That is, the junction gate 73 in which the signal charge is accumulated includes a P+-type region which contains p-type impurities with high density, and the junction gate 73 is potentially brought into the floating state. Therefore, when the MOS type gate electrode 76 is turned on, and the signal charge accumulated in the junction gate 73 is discharged to the p-type substrate 71, a remaining background charge exists without being discharged via the junction gate 73. This background charge amount changes by a so-called kTC noise in which a heat noise of on resistance of the MOS type gate electrode 76 is reflected. Therefore, even after the signal charge is reset, the background charge remains in the junction gate 73. A noise charge is superimposed upon the background charge, and this is read out as noise which appears on the signal.

Therefore, it is considered that the density of p-type impurities in the junction gate 73 is lowered in order to reduce the influence of the background charge. In this case, however, since the operation becomes unstable by a charged state of the chip surface, a capacitance between the junction gate 73 and n-type layer 72 drops, and a sufficient amount of signal charges cannot be accumulated, a problem of decrease of a saturated charge amount occurs. Therefore, there has heretofore been a demand for solving a problem that the saturated charge amount drops.

BRIEF SUMMARY OF THE INVENTION

According to one aspect of the present invention, there is provided a solid-state image sensor comprises: a semiconductor substrate; and a plurality of pixels formed in the semiconductor substrate and each having an accumulation period of signal charges, signal readout period and discharge period of the signal charges, and each of the plurality of pixels including: a first semiconductor region of a first conductive type formed in the semiconductor substrate; a source region of the first conductive type formed in a surface region of the first semiconductor region; a drain region of the first conductive type which is formed apart from the source region in the surface region of the first semiconductor region and to which different voltages are supplied in the accumulation period of the signal charges, signal readout period, and discharge period of the signal charges; a second semiconductor region of the first conductive type electrically connected to the drain region and formed in the surface region of the first semiconductor region; a third semiconductor region which is formed in the first semiconductor region under the second semiconductor region and electrically connected to the second semiconductor region and which is of a second conductive type opposite to the first conductive type to accumulate the signal charges in accordance with an incident light; and a fourth semiconductor region of the second conductive type formed in the surface region of the first semiconductor region between the source and drain regions.

BRIEF DESCRIPTION OF THE SEVERAL VIEWS OF THE DRAWING

FIG. 17 is a sectional view of the pixel of FIG. 16;

FIG. 18 is a sectional view of the pixel of FIG. 16, different from FIG. 17;

FIG. 22 is a sectional view showing the device structure in the vicinity of the MOS type gate electrode of the pixel according to a second modification example of the third embodiment;

FIG. 23 is a whole circuit diagram of the solid image sensor according to a fourth embodiment of the present invention;

FIG. 25 is a sectional view of the pixel of FIG. 24;

FIG. 26 is a different sectional view of the pixel of FIG. 24;

FIG. 27 is a waveform diagram of the major signal in the solid-state image sensor of FIG. 24;

FIG. 36 is a sectional view of the pixel of FIG. 35;

FIG. 37 is a different sectional view of the pixel of FIG. 35;

FIG. 38 is a further different sectional view of the pixel of FIG. 35;

FIG. 39 is a still further different sectional view of the pixel of FIG. 35;

FIGS. 45A and 45B are plan and sectional views of a camera module in which an integrated circuit chip for solid image sensing and integrated circuit chip for DSP shown in FIG. 44 are formed together with lenses.

DETAILED DESCRIPTION OF THE INVENTION

Figure 1:
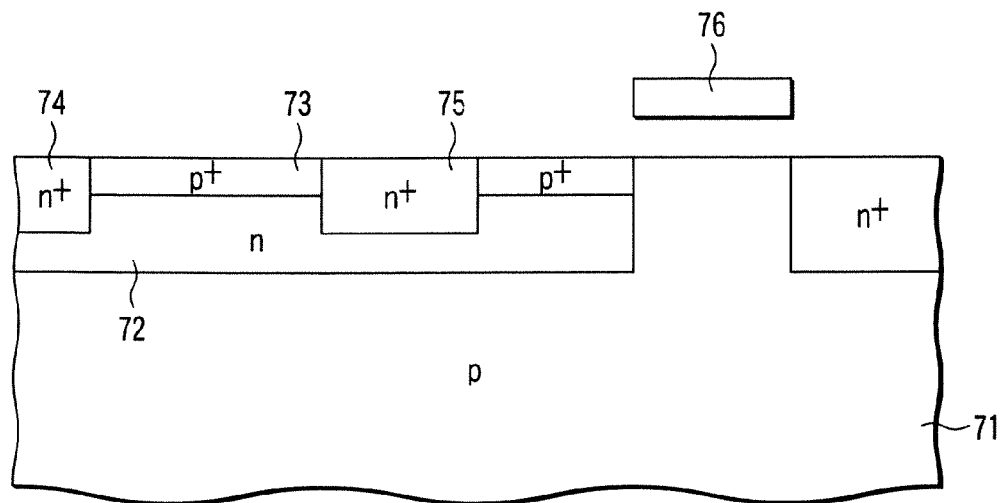
FIG. 1 is a sectional view showing a device structure of a pixel for use in a conventional threshold voltage modulation-type solid image sensor.

Embodiments of the present invention will be described hereinafter in detail with reference to the drawings. It is to be noted that corresponding parts over all the drawings are denoted with the same reference numerals and redundant description is avoided.

FIRST EMBODIMENT

Figure 2:
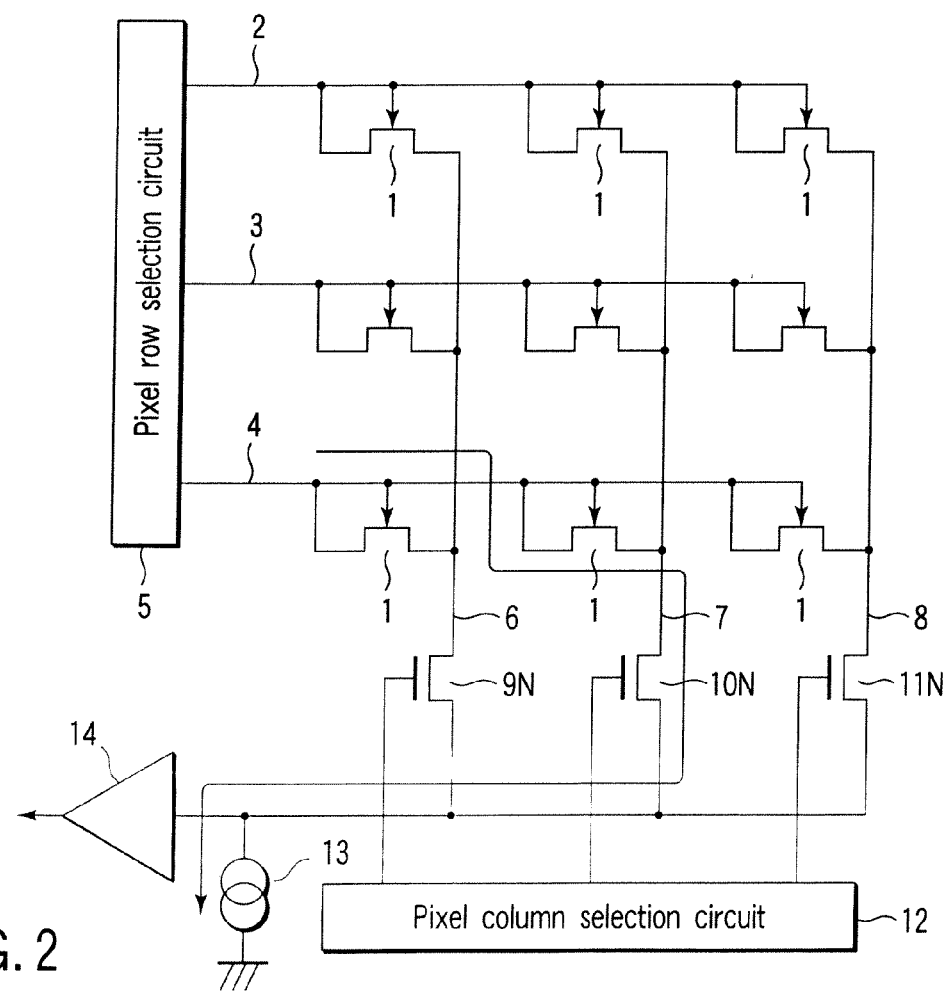
FIG. 2 is a circuit diagram of a whole solid-state image sensor according to a first embodiment of the present invention.

FIG. 2 is a circuit diagram of a whole solid image sensor according to a first embodiment of the present invention. It is to be noted that FIG. 2 shows a two-dimensional solid image sensor including 3×3, that is, nine pixels to simplify the description, but another number of pixels may also be disposed.

In FIG. 2, a plurality of (nine in the present example) pixels 1 including junction-type FETs are arranged in a matrix form. Drains and gates of three pixels 1 in the same row are connected in common to one of a plurality of (three in the present example) selection lines 2 to 4. The selection lines 2 to 4 are connected to a pixel row selection circuit 5 including, for example, shift registers which output predetermined pulse signals at a selection time of the pixel row.

Moreover, the sources of three pixels 1 of the same column are connected in common to one of a plurality of (three in the present example) signal lines 6 to 8. Each of the signal lines 6 to 8 is connected to one end of each of N-channel MOS transistors 9N to 11N for switch for selecting the signal line, and other ends of the MOS transistors 9N to 11N are connected in common. Furthermore, gates of the MOS transistors 9N to 11N are connected to a pixel column selection circuit 12 including, for example, the shift registers which output the predetermined pulse signals at the selection time of a pixel column. A current source 13 is connected between a common connection node of the MOS transistors 9N to 11N and ground potential. Furthermore, an impedance conversion circuit 14 for outputting the read signal is connected to the common connection point of the MOS transistors 9N to 11N and current source 13.

The solid-state image sensor shown in FIG. 2 is integrated in a semiconductor substrate. It is to be noted that, as not especially shown, a compensation circuit for offset compensation of each pixel and a signal processing circuit for performing various types of signal processing such as A/D conversion of an output of the impedance conversion circuit 14 are integrated in the same semiconductor substrate.

In the solid-state image sensor shown in FIG. 2, when the light is incident, signal charges are accumulated in each pixel 1 in accordance with each light amount. A threshold voltage of each pixel 1 changes in accordance with an accumulated signal charge amount. Moreover, when a pulse signal outputted from the pixel row selection circuit 5 is applied to any one of the selection lines 2 to 4, the pixel row is selected. Furthermore, when the pulse signal outputted from the pixel column selection circuit 12 is applied to any one of the gates of the MOS transistors 9N to 11N, and the MOS transistor is turned on, the pixel column is selected, and thereby one pixel 1 is selected. In this case, as shown by arrows in FIG. 2, a current path is formed to extend to the current source 13 from the selection line (selection line 4 in the present example) via the selected pixel and further via the signal line (signal line 7 in the present example) and the MOS transistor having an on state (MOS transistor 10N in the present example), and a signal is outputted via the impedance conversion circuit 14 in accordance with the threshold voltage of the selected pixel.

Figure 3:
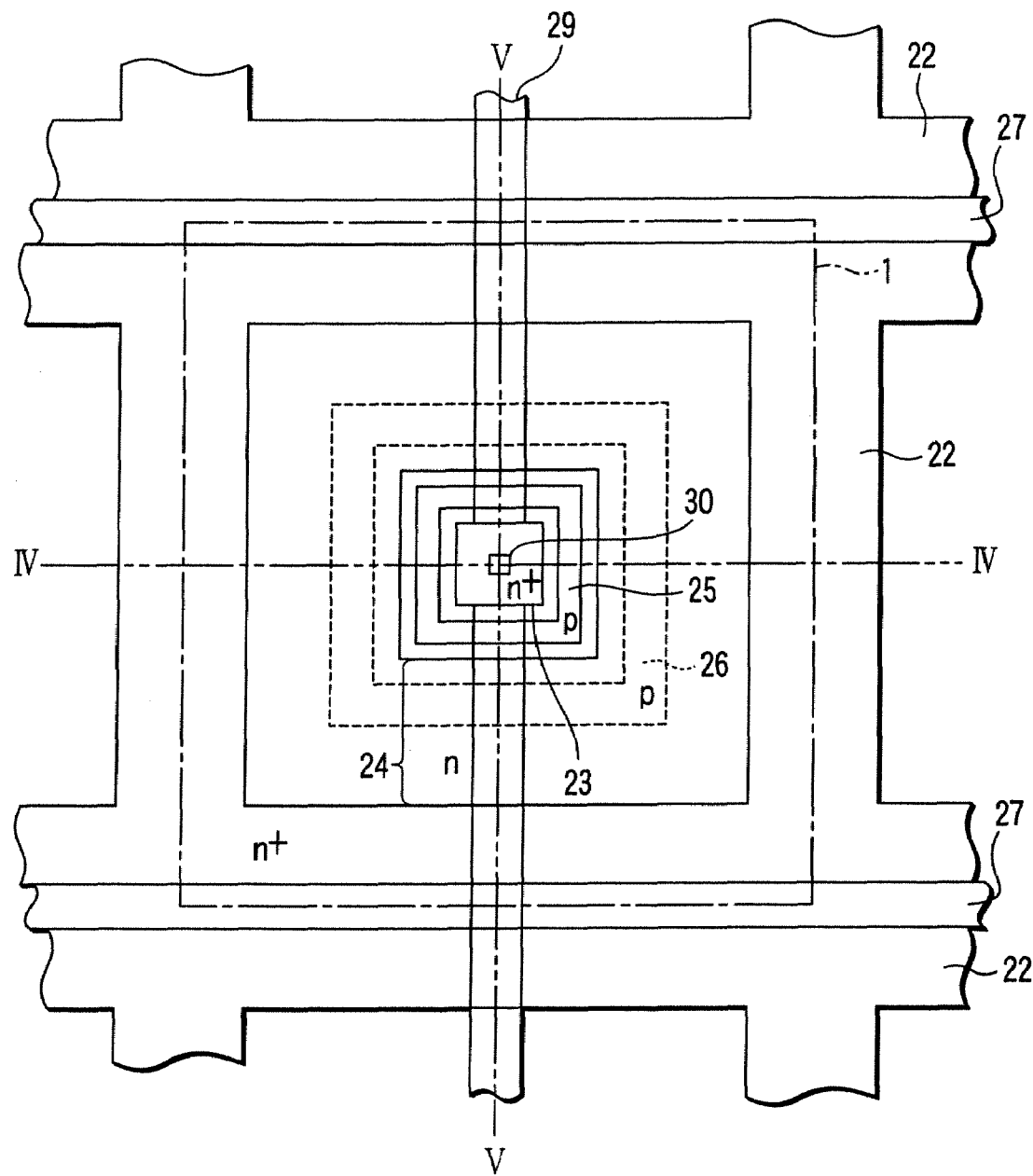
FIG. 3 is a pattern plan view showing the device structure of one pixel of the solid-state image sensor of FIG. 2.
Figure 4:
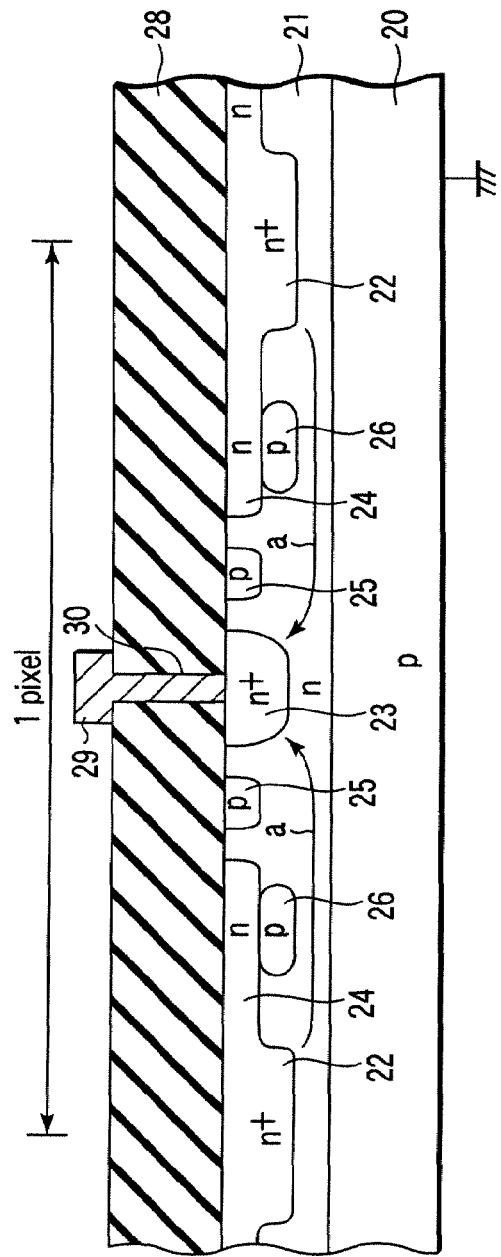
FIG. 4 is a sectional view of the pixel of FIG. 3.
Figure 5:
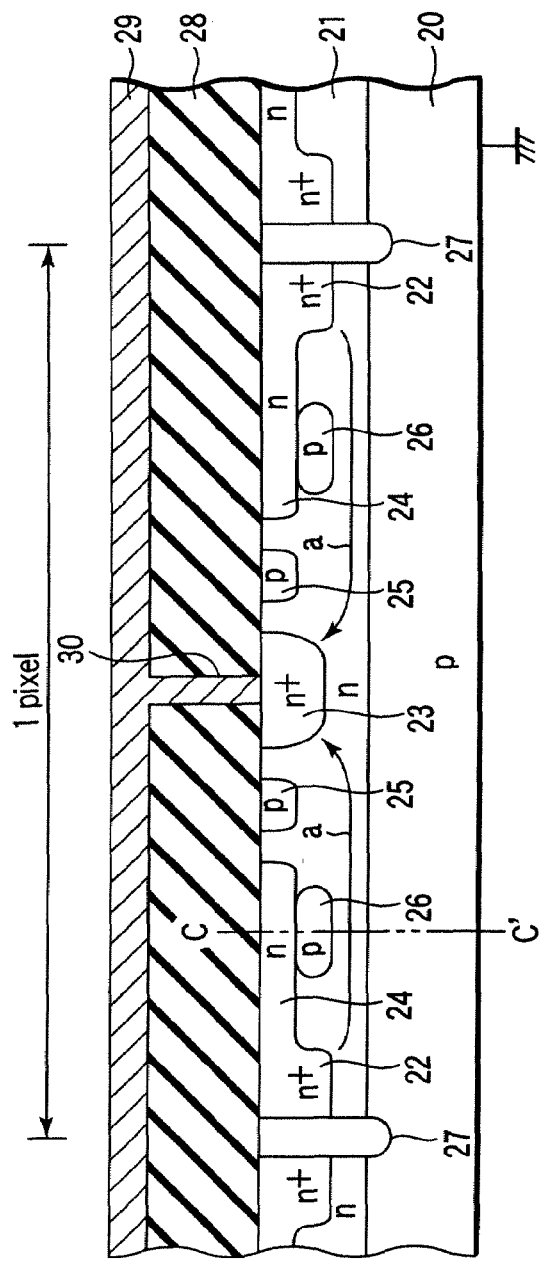
FIG. 5 is a sectional view of the pixel of FIG. 3, different from FIG. 4.

FIG. 3 is a pattern plan view showing the device structure of one pixel 1 in FIG. 2, and FIGS. 4 and 5 are different sectional views of FIG. 3.

An n-type well region 21 is formed in a surface region of a p-type semiconductor substrate 20. A ground potential is supplied to the substrate 20. Furthermore, in the surface region of the n-type well region 21, a drain region 22 and a source region 23 including n+-type diffusion regions are formed apart from each other. Additionally, in the surface region of the n-type well region 21, an n-type diffusion region 24 connected to the drain region 22 and extended in a direction of the source region 23 is formed. The n-type diffusion region 24 corresponds to the junction gate of a junction-type FET constituting the pixel 1 in FIG. 2, and is formed to have a diffusion depth smaller than that of the drain region 22. Moreover, a p-type diffusion region 25 for parasitic channel prevention is formed in the surface region of the n-type well region 21 between the n-type diffusion region 24 and the source region 23. Furthermore, a p-type embedded region 26 for signal charge accumulation is formed in contact with the n-type diffusion region 24 in the well region 21 under the n-type diffusion region 24.

The source region 23 is disposed substantially in a middle of a pixel region defined on a one-dot chain line in FIG. 3. The p-type diffusion region 25 is disposed to surround the source region 23. Furthermore, the drain region 22 and the n-type diffusion region 24 connected to the drain region are disposed to surround the p-type diffusion region 25. Additionally, the drain region 22 is extended to be common to the pixels for one row disposed adjacent to each other in a lateral direction in FIG. 3.

Moreover, the n-type well regions 21 are separated from each other in a row direction by a device isolation region 27 extended in a direction parallel to the extension direction of the drain region 22 as shown in FIG. 3.

An interlayer insulating film 28 is formed on the n-type well region 21. Furthermore, a wiring layer 29 corresponding to the signal lines 6 to 8 shown in FIG. 2 is formed on the interlayer insulating film 28. Moreover, an opening connected to the surface of the source region 23 is formed with respect to the interlayer insulating film 28, and a contact 30 which connects the source region 23 and wiring layer 29 is formed in the opening.

It is to be noted that a micro lens for focusing an incident light is formed for each pixel on the interlayer insulating film 28, but the lens is not shown in the drawing to simplify the description.

In the pixel including the above-described section structure, when the incident light focused by the on-chip micro lens is emitted, a photodiode including the n-type diffusion region 24 and p-type embedded region 26 under the diffusion region performs photoelectric conversion with a photodiode including the n-type well region 21 and p-type embedded region 26, and a plurality of electron-hole pairs are generated. In the generated electron-hole pairs, the electrons are discharged to the outside via the drain region 22 without or after drifting in the n-type well region 21. The holes are accumulated and integrated in the p-type embedded region 26. The accumulated amount of the hole corresponds to a product of intensity of the incident light and integration time. Moreover, the threshold voltage of each pixel is modulated in accordance with the accumulated amount of the holes.

Moreover, after the integration of the holes, each pixel is successively scanned by the pixel row selection circuit 5 and pixel column selection circuit 12, and the change of the threshold voltage of each pixel is read as the signal. After reading out the signal from the pixel, the holes accumulated in each pixel are discharged to the substrate 20, and a reset operation is performed.

Figure 6:
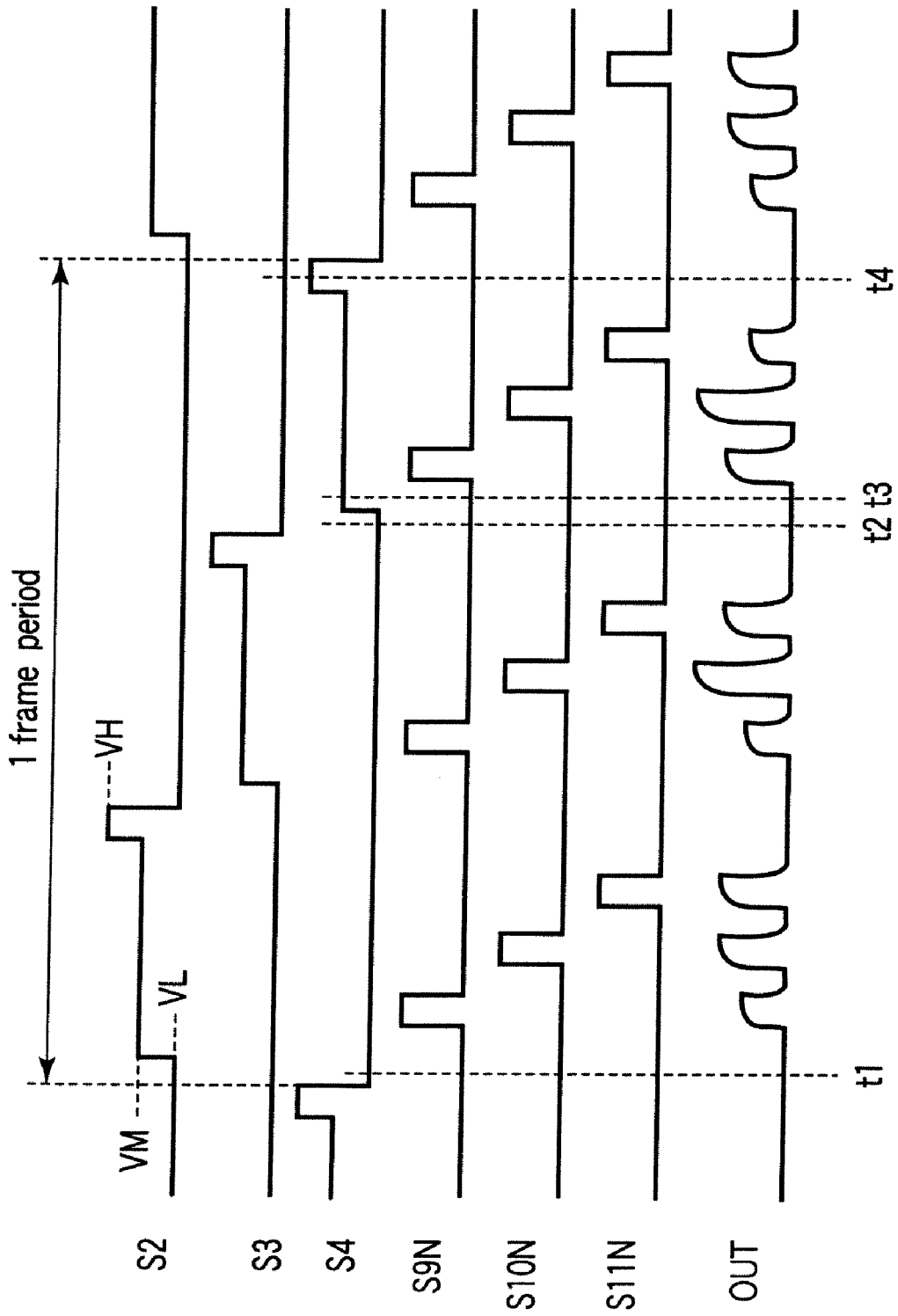
FIG. 6 is a waveform diagram of a major signal in the solid-state image sensor of FIG. 2.

FIG. 6 is a waveform diagram of major signals in the solid-state image sensor shown in FIG. 2. In FIG. 6, signals S2, S3, S4 are outputted from the pixel row selection circuit 5, and indicate waveforms of the pulse signals applied to the selection lines 2 to 4. Signals S9N, S10N, S11N are outputted from the pixel column selection circuit 12, and indicate the waveforms of the pulse signals applied to the gates of the MOS transistors 9N, 10N, 11N. A signal OUT indicates the waveform of the signal outputted from the impedance conversion circuit 14. As shown in FIG. 6, the pulse signal having a voltage indicating three values VL, VM, VH is applied to the selection lines 2 to 4. In the three-valued voltage, VL is lowest, VM is higher than VL, and VH is higher than VM.

An operation of the solid-state image sensor of FIG. 2 will next be described with reference to FIG. 6.

A period in which the signals are read out of all the pixels is referred to as one frame period. In one frame period, the signals of the selection lines 2 to 4 drop to VL from VH and then drop to VL from VH. In one frame period, a period in which the signals S2 to S4 of the selection lines 2 to 4 indicate VL is an accumulation period of the holes. A period of VM is a readout period in which the change of the threshold voltage of each pixel is read out as the signal. Furthermore, a period of VH is a reset period in which the holes integrated in each pixel are discharged.

For example, in the period in which the signal S2 of the selection line 2 indicates VM, three pixels 1 in the row connected to the selection line 2 are selected. When the signal S9N is set to a high level in this period, the MOS transistor 9N is turned on, the pixel column is selected, and the current flows into the current source 13 via the signal line 6 and the pixels 1 of the selected row and column. Moreover, the signal indicating the threshold voltage of the selected pixel is outputted as the signal OUT via the impedance conversion circuit 14. Furthermore, when the signals S10N, S11N are successively set to the high level, the MOS transistors 10N, 11N are successively turned on, different pixel columns are successively selected, current flows into the current source 13 via the signal lines 7, 8 and the corresponding pixels 1 of the selected column, and the signal indicating the threshold voltage of the selected pixel is outputted as the signal OUT via the impedance conversion circuit 14. The pixel row is changed and successively subjected to this operation, so that the signals are read out of all the pixels.

Moreover, after the signals are read out of three pixels in each pixel row, the signals S2 to S4 of the selection lines 2 to 4 turn to VH, the holes are discharged from these three pixels, and the reset operation is performed to prepare for the next accumulation of the holes.

Figure 7:
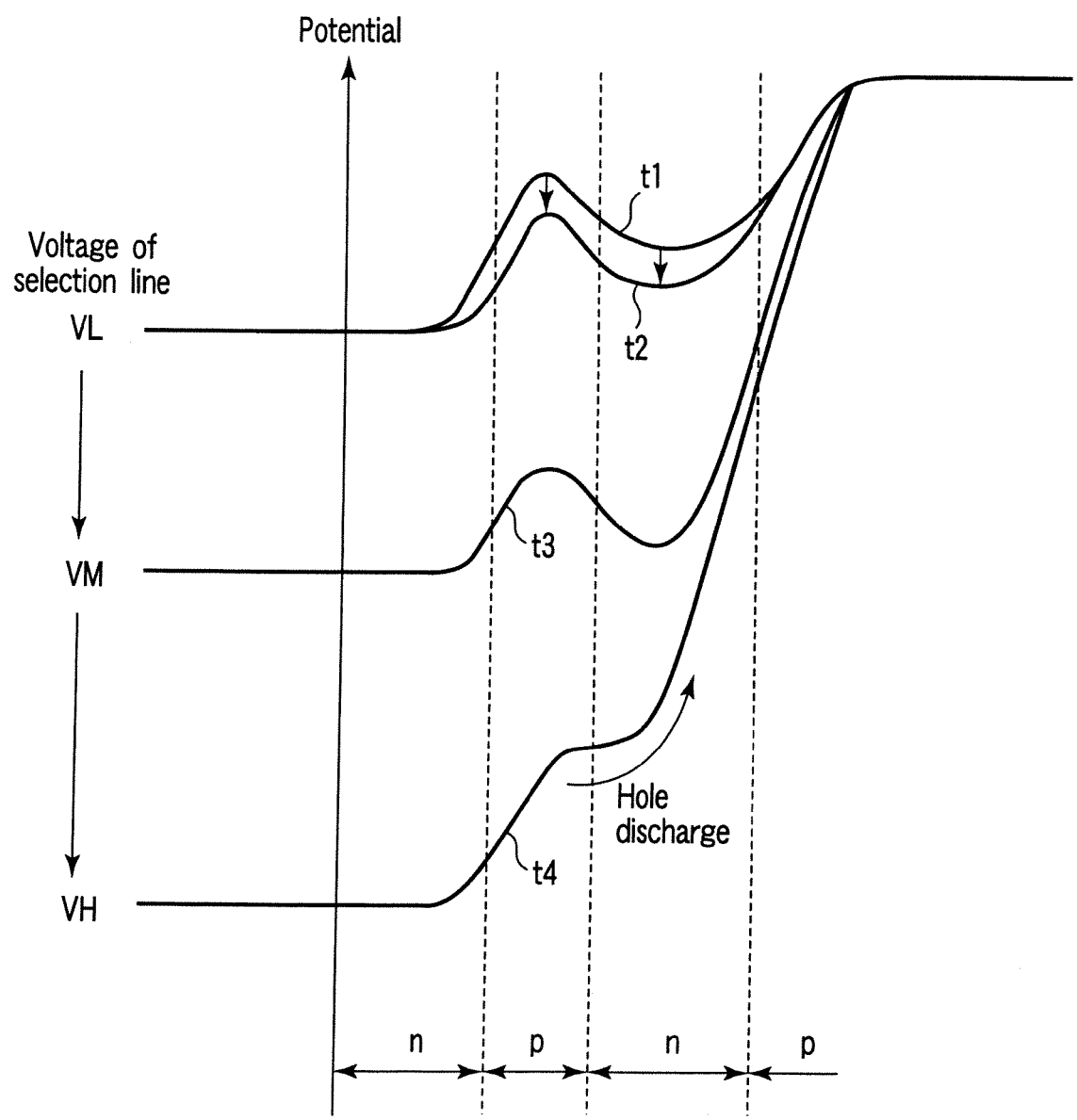
FIG. 7 is a diagram showing a potential state in a section taken along a line C-C' of FIG. 5 in timings t1 to t4 in the waveform diagram of FIG. 6.

FIG. 7 shows a potential state in a section taken along a line C-C' of FIG. 5 in timings t1 to t4 in the waveform diagram of FIG. 6. An accumulation operation of the holes in each pixel, signal readout operation, and reset operation will next be described in detail with reference to the potential diagram of FIG. 7.

In the timing t1 immediately after the start of the accumulation period immediately after the voltage value of the pulse signal S4 applied to the selection line 4 changes to VL, as described above, for the plurality of electron-hole pairs generated in accordance with the incident light, the holes are accumulated and integrated in the p-type embedded region 26. Accordingly, the potential of the p-type embedded region 26 drops. Furthermore, accordingly the potential in the n-type well region 21 under the p-type embedded region 26 is also modulated and lowered. In the timing t2 immediately before the end of the accumulation period, the potential in the n-type well region 21 is lower than that of the timing t1.

Subsequently, when the readout period is started, and the pulse signal S4 applied to the selection line 4 changes to VM, the whole potential accordingly drops in proportion to (VM-VL). Additionally, since the p-type substrate 20 is fixed at the ground potential, the potential of the substrate 20 is constant and does not change. Thereafter, when the signal S9 reaches the high level, and the MOS transistor 9N in FIG. 2 turns on, for three pixels of the same column, an electron current flows via the pixel indicating the lowest potential of the n-type well region 21 and the constant current source 13. In this case, while VL is applied to the other selection lines 2, 3 excluding the selection line 4, VM is applied to the selection line 4, the potential of the n-type well region 21 of the pixel connected to the selection line 4 is lowest, and therefore the electron current flows via the pixel connected to the selection line 4. The electron current flowing at this time is shown by arrows in FIGS. 4 and 5. That is, a source follower is thereby formed in which the selection line 4 is a power source, the selected pixel 1 connected to the selection line 4 and signal line 6 is a junction gate type FET, and the current source 13 is a current source. The potential is outputted as the signal OUT via the impedance conversion circuit 14 in accordance with a potential value of a minimum point of the potential of the n-type well region 21 of the selected pixel 1. In this case, since the minimum point of the potential of the n-type well region 21 is modulated by the integrated value of the holes generated by the incident light, all the pixels are scanned by the pixel row selection circuit 5 and pixel column selection circuit 12, the signal is successively read out of the impedance conversion circuit 14, and thereby a video signal can be obtained.

Subsequently, in the timing t4 after the readout period ends and the pulse signal S4 applied to the selection line 4 changes to VH, the potential of the p-type embedded region 26 further drops, and the hole accumulated in the p-type embedded region 26 is thereby discharged into the substrate 20 via the n-type well region 21.

As described above, in the solid-state image sensor of the first embodiment, each pixel 1 is constituted by one junction-type FET, and the structure is simple and suitable for miniaturization as compared with the CCD type.

Here, the solid-state image sensor of the first embodiment will be compared with the conventional apparatus shown in FIG. 1. In FIG. 1, to accumulate the charges in the junction gate 73 in the floating state, an impurity density needs to be set to be sufficiently high. The reason is that the operation is prevented from being unstable by charging of a chip surface. As a result, one portion of the junction gate 73 having the high density forms a neutral region constantly filled with the electrons or holes, and the charges are accumulated to neutralize adjacent acceptors or donors of an opposite conductive type existing in a depletion layer region in the n-type layer 72. For example, with reference to FIG. 1, a surface side of the junction gate 73 containing the p-type impurity in the high density is constantly filled with the holes, and the holes as the signals are accumulated in the depletion layer region formed between the gate and n-type layer 72. Since the acceptor in the depletion layer is neutralized in this state, an electric force line from the donor in the n-type layer 72 terminated in the acceptor has to terminate in the acceptor of the substrate 71, and thereby a potential fluctuation of the P-type junction gate 73 increases. That is, a capacitance between the ground potential and the junction gate 73 is remarkably small. The same is repeated, but it is to be noted that the n-type layer 72 is completely depleted, a capacitance is therefore formed between the P-type junction gate 73 and substrate 71, and a capacitance to ground can be regarded as extremely small because of a large distance of the capacitance. Therefore, under a normal operation voltage, the signal charge amount accumulated in the floating region is limited, and the complete depletion of the region is not achieved. Additionally, when the potential fluctuation is large with respect to the signal charge, sensitivity can advantageously be set to be high.

On the other hand, according to the first embodiment, a sufficient capacitance between the p-type embedded region 26 and the n-type well region 21, drain region 22 can be secured, and a sufficient amount of signal charges (holes) can be accumulated. Furthermore, the complete depletion of the p-type embedded region 26 is possible under the usual operation voltage. In other words, after all, the first embodiment is different from the conventional example in the size of the capacitance to the ground in the accumulation region of the signal charges (holes). Priority is given to the sensitivity, and a drop of saturated signal amount causing shot noise deterioration, and kTC noise by a background charge are permitted. Alternatively, compromise is made on the drop of the sensitivity, the generation of the noise is prevented, and improvement of a general S/N ratio is aimed. The scope by the first embodiment lies in the latter way of thinking.

Furthermore, for the solid-state image sensor using a polysilicon gate electrode such as the charge coupling device type or MOS transistor, since a photoelectric conversion region is disposed under the polysilicon gate electrode, influence of absorption of the light by the polysilicon gate electrode is exerted, and sensitivity to blue drops.

However, in the solid-state image sensor of the first embodiment, the junction gate FET is used in which the polysilicon gate electrode is not used. Therefore, an effect that the sensitivity to blue can be prevented from dropping can also be obtained.

Furthermore, since the photodiode including the p-type embedded region 26 under the n-type diffusion region 24 and n-type well region 21 to perform the photoelectric conversion, and the p-type embedded region 26 for accumulating the charges are integrated in a vertical direction of the substrate, the size of the pixel can effectively be miniaturized as compared with the photodiode and region formed separately from each other.

SECOND EMBODIMENT

Figure 8:
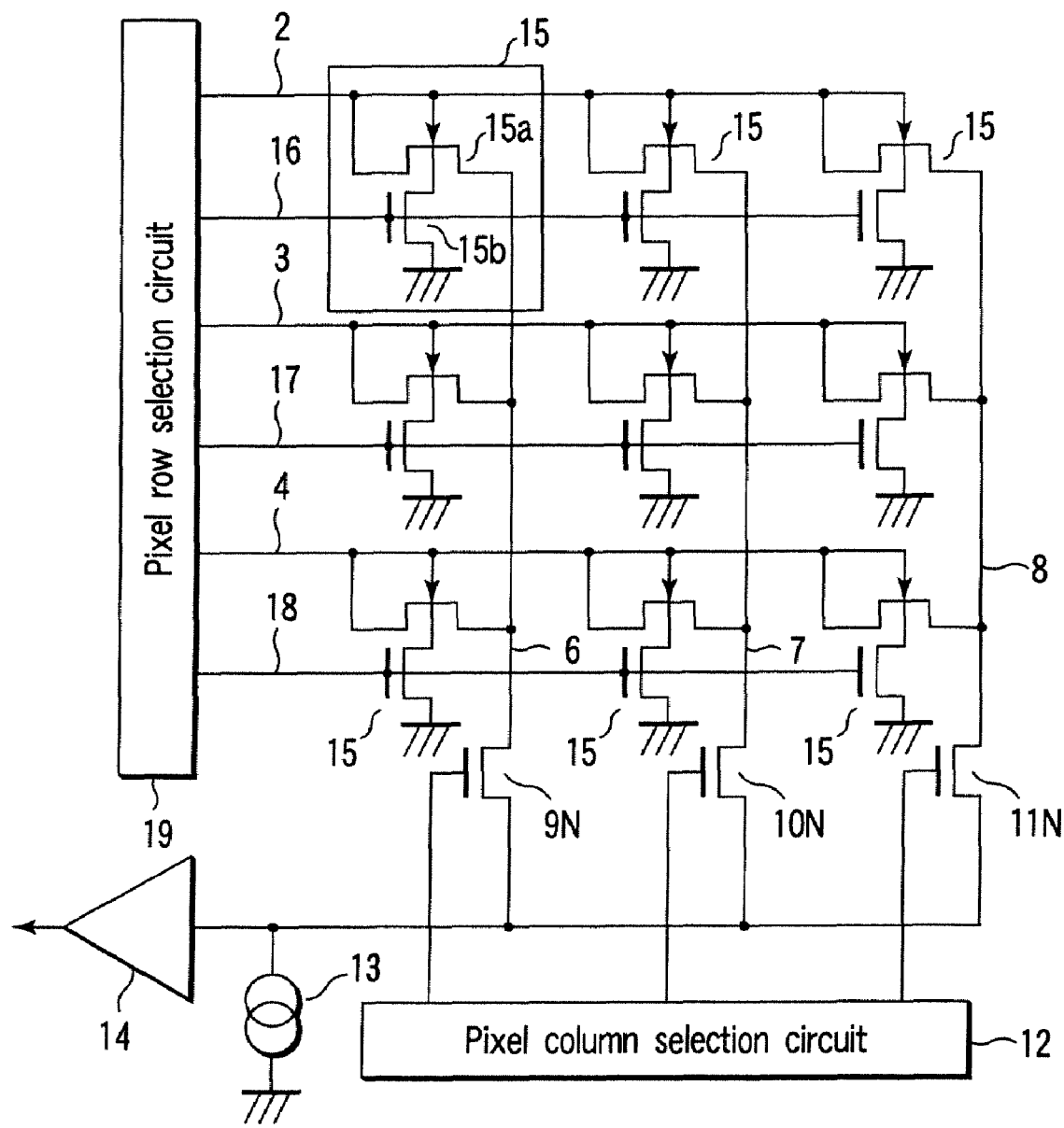
FIG. 8 is a whole circuit diagram of the solid-state image sensor according to a second embodiment of the present invention.

FIG. 8 is a whole circuit diagram of the solid-state image sensor according to a second embodiment of the present invention. It is to be noted that the two-dimensional solid-state image sensor including 3×3, that is, nine pixels is illustrated also in this embodiment in order to simplify the description, but more pixels may also be disposed.

The solid-state image sensor shown in FIG. 8 is slightly different from that of FIG. 2 in the constitutions of the pixel and pixel row selection circuit, the other constitution is similar to that of FIG. 2, and therefore only respects different from FIG. 2 will be described.

In FIG. 8, each pixel 15 includes a constitution in which a MOS type gate portion 15b for discharging the accumulated charges of the gate of a junction-type FET portion 15a to a ground potential is added to the junction-type FET portion 15a including the source, drain, and gate.

The drains and gates of three pixels 15 of the same row are connected in common to one corresponding line of a plurality of (three in the present example) selection lines 2 to 4 for pixel row selection. Moreover, the gates of the MOS type gate portions 15b of three pixels 15 of the same row are connected in common to one corresponding line of a plurality of (three in the present example) selection lines 16 to 18 for electric discharge of the pixel row.

The selection lines 2 to 4 and 16 to 18 are connected to a pixel row selection circuit 19 including, for example, the shift registers which output the predetermined pulse signals at the selection time of the pixel row.

Figure 9:
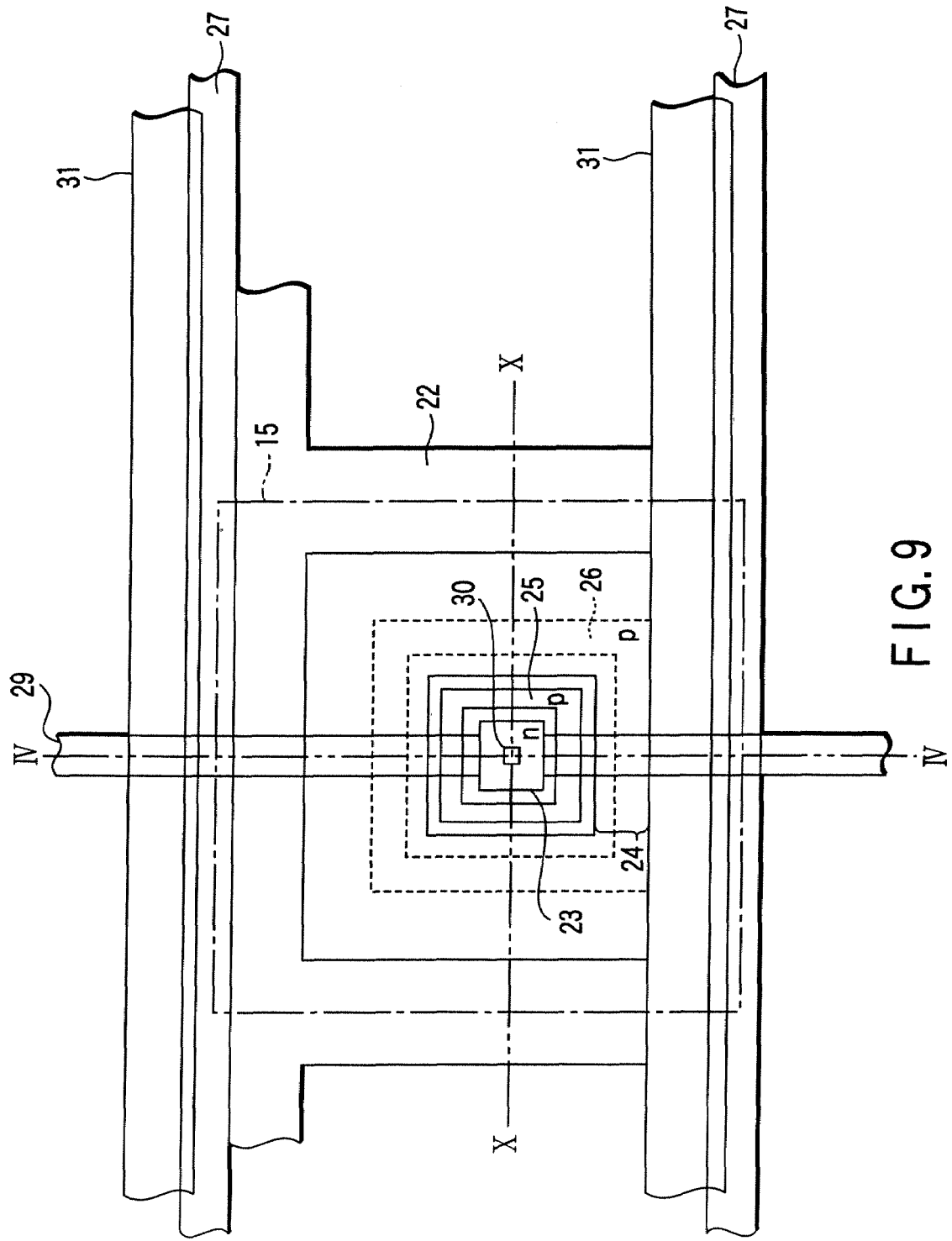
FIG. 9 is a pattern plan view showing the device structure of one pixel of the solid-state image sensor of FIG. 8.
Figure 10:
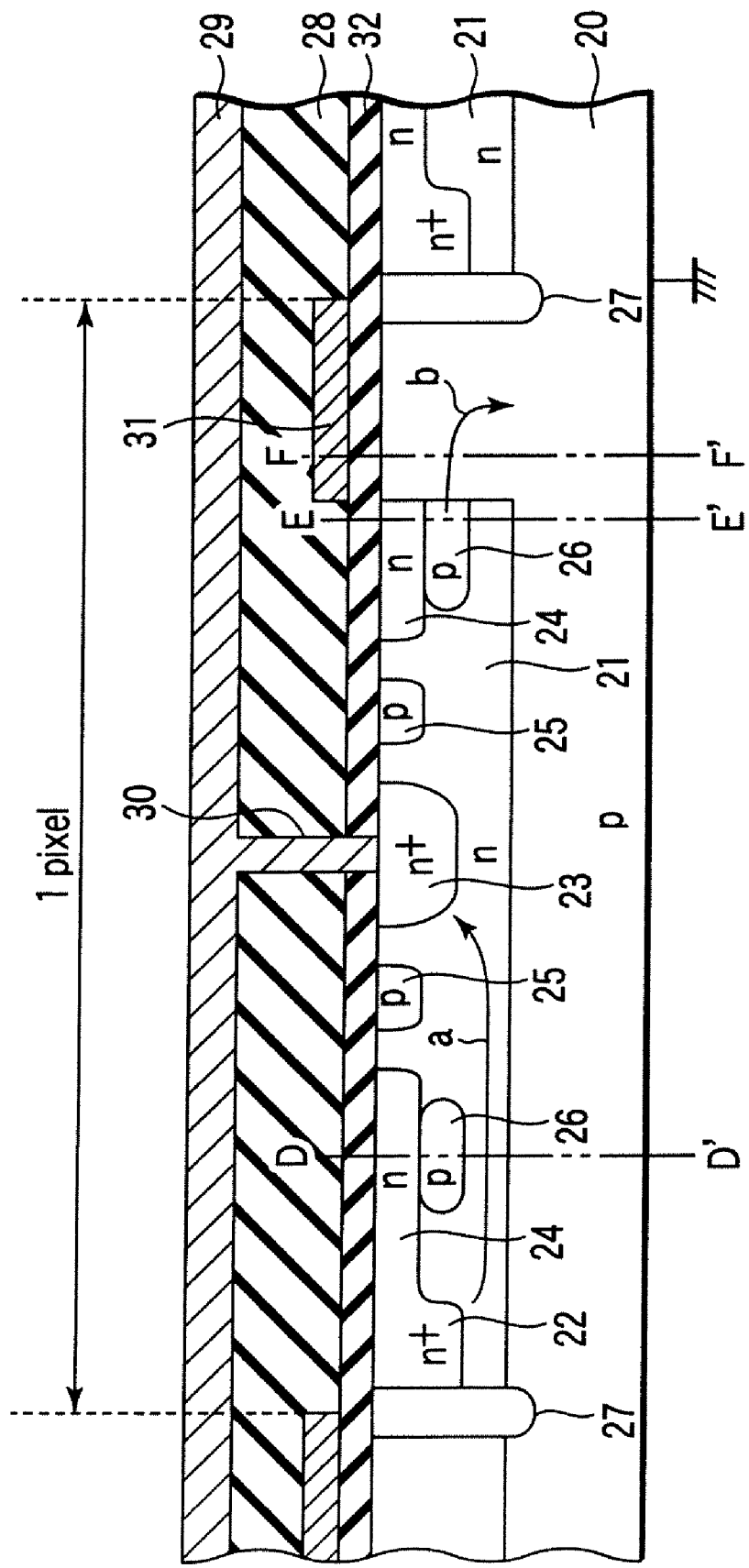
FIG. 10 is a sectional view of the pixel of FIG. 9.

FIG. 9 is a pattern plan view showing the device structure of one pixel 15 in FIG. 8, and FIG. 10 is a sectional view of FIG. 8. It is to be noted that for a section crossing at right angles to the section of FIG. 10, the gate insulating film of the MOS type gate portion 15b is simply added to FIG. 4, the other constitution is similar to that of FIG. 4, and the section is therefore omitted from the drawing.

In the first embodiment, the drain region 22 is formed to surround the whole periphery of the p-type diffusion region 25. On the other hand, in the second embodiment, the drain region 22 is formed to surround three sides of the p-type diffusion region 25 whose plane shape is substantially rectangular. Moreover, a MOS type gate electrode 31 is formed so as to contact the p-type embedded region 26 in a portion in which the drain region 22 is not formed. The MOS type gate electrode 31 corresponds to the gate of the MOS type gate portion 15b in FIG. 8, and further corresponds to any one of the selection lines 16 to 18 in FIG. 8. As shown in FIG. 10, the MOS type gate electrode 31 is formed on the substrate 20 via a gate insulating film 32. It is to be noted that the p-type substrate 20 is extended to the surface under the MOS type gate electrode 31. Moreover, similarly as the first embodiment, the micro lens is formed for each pixel on the interlayer insulating film 28, and is omitted from the drawing so as to simplify the description.

In the solid-state image sensor, when each pixel is irradiated with the incident light focused by the micro lens, the photodiode including the n-type diffusion region 24 and p-type embedded region 26 under the diffusion region 26 performs the photoelectric conversion with the photodiode including the n-type well region 21 and p-type embedded region 26 to generate the plurality of electron-hole pairs. In the generated electron-hole pairs, the electrons are discharged to the outside via the drain region 22 without or after drifting in the n-type well region 21. The holes are accumulated and integrated in the p-type embedded region 26. The accumulated amount of the holes corresponds to the product of the intensity of incident light and the integration time. Moreover, the threshold voltage of each pixel is modulated in accordance with the accumulated amount of the holes.

Moreover, after the integration of the holes, each pixel is successively scanned by the pixel row selection circuit 19 and pixel column selection circuit 12, and the change of the threshold voltage of each pixel is read as the signal. After reading out the signal from the pixel, the holes accumulated in each pixel is discharged to the substrate 20 via the MOS type gate portion 15b controlled by the pixel row selection circuit 19, and the reset operation is performed.

Figure 11:
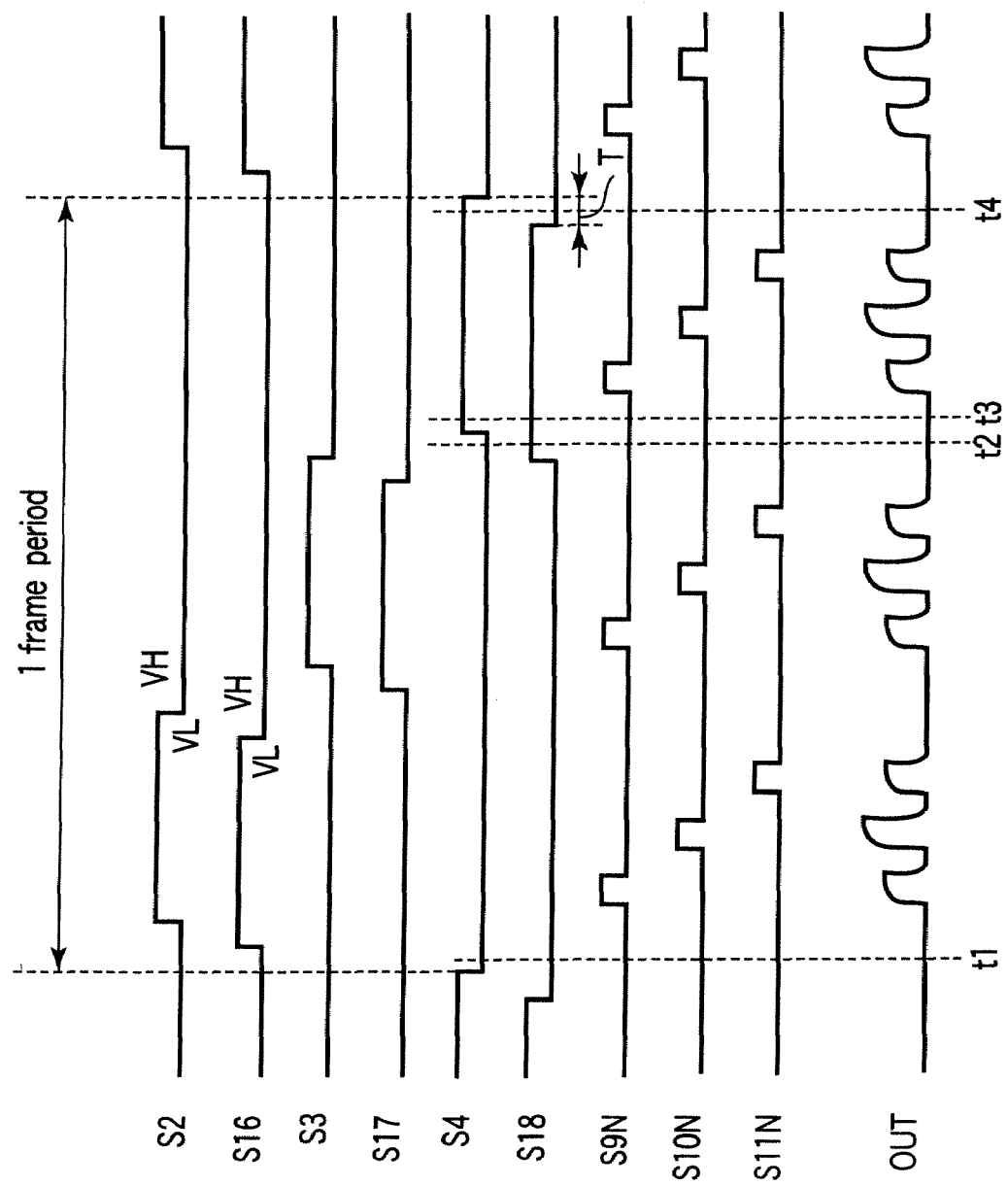
FIG. 11 is a waveform diagram of the major signal in the solid-state image sensor of FIG. 8.

FIG. 11 is a waveform diagram of the major signals in the solid-state image sensor shown in FIG. 8. In FIG. 11, the signals S2, S3, S4 are outputted from the pixel row selection circuit 19, and indicate the waveforms of the pulse signals applied to the selection lines 2 to 4 for row selection. Signals S16, S17, S18 are outputted from the pixel row selection circuit 19, and indicate the waveforms of the pulse signals applied to the selection lines 16 to 18 for electric discharge. The signals S9N, S10N, S11N are outputted from the pixel column selection circuit 12, and indicate the waveforms of the pulse signals applied to the gates of the MOS transistors 9N, 10N, 11N. The signal OUT indicates the waveform of the signal outputted via the impedance conversion circuit 14.

An operation of the solid-state image sensor of FIG. 8 will next be described with reference to FIG. 11.

As shown in FIG. 11, the pulse signals S2 to S4 having the voltages indicating two values VL and VH are applied to the selection lines 2 to 4, and the pulse signals S16 to S18 having the voltages indicating two values VL and VH are also similarly applied to the selection lines 16 to 18. In the voltage indicating two values, VL is lower than VH.

The period in which the signals are read out of all the pixels is referred to as one frame period. In one frame period, the signals S2 to S4 of the selection lines 2 to 4 drop to VL from VH and then drop to VL from VH. In one frame period, the period in which the signals S2 to S4 of the selection lines 2 to 4 indicate VL is the accumulation period of the holes. The readout period in which the change of the threshold voltage of each pixel is read out as the signal is a period in which the signals S2 to S4 of the selection lines 2 to 4 indicate VH and the signals S16 to S18 of the selection lines 16 to 18 indicate VH. In the reset period in which the holes accumulated in each pixel 15 are discharged, the signals S2 to S4 of the selection lines 2 to 4 indicate VH and the signals S16 to S18 of the selection lines 16 to 18 indicate VL. The reset period is a period T in FIG. 11.

For example, in the period in which the signal S2 of the selection line 2 indicates the high level (VH), three pixels 15 in the same row connected to the selection line 2 are selected. When the signal S9N is set to the high level (VM) in this period, the MOS transistor 9N is turned on, the pixel column is selected, the electron current flows into the current source 13 via the signal line 6 and the pixels 15 of the selected row and column, and the signal indicating the threshold voltage of the selected pixel is outputted as the signal OUT via the impedance conversion circuit 14. Furthermore, when the signals S10N, S11N are successively set to the high level, the MOS transistors 10N, 11N are successively turned on, different pixel columns are selected, electron current flows into the current source 13 via the signal lines 7, 8 and the corresponding pixels 15 of the selected column, and the signal indicating the threshold voltage of the selected pixel is successively outputted as the signal OUT via the impedance conversion circuit 14. The pixel row is changed and successively subjected to this operation, so that the signals are read out of all the pixels.

Moreover, immediately before the end of the signal readout period from three pixels in each pixel row, the signals S16 to S18 of the selection lines 16 to 18 indicate a low level (VL). Thereby, the depletion layer of the surface of the p-type substrate 20 under the MOS type gate electrode 31 constituting the MOS type gate portion 15b of each pixel in FIG. 10 disappears, and a uniform potential is obtained. As a result, the holes accumulated in the p-type embedded region 26 flows into the substrate 20 via the portion under the MOS type gate electrode 31, and the reset operation is performed.

It is to be noted that the reset operation is performed, when the signals S2 to S4 of the signal lines 2 to 4 indicate VM and the signals S16 to S18 of the selection lines 16 to 18 indicate VL. Therefore, the signals S16 to S18 of the signal lines 16 to 18 are raised to VM, before the signals S2 to S4 of the selection lines 2 to 4 reach VM and the readout period is started. Thereby, the reset operation is prevented from being performed.

Figure 12:
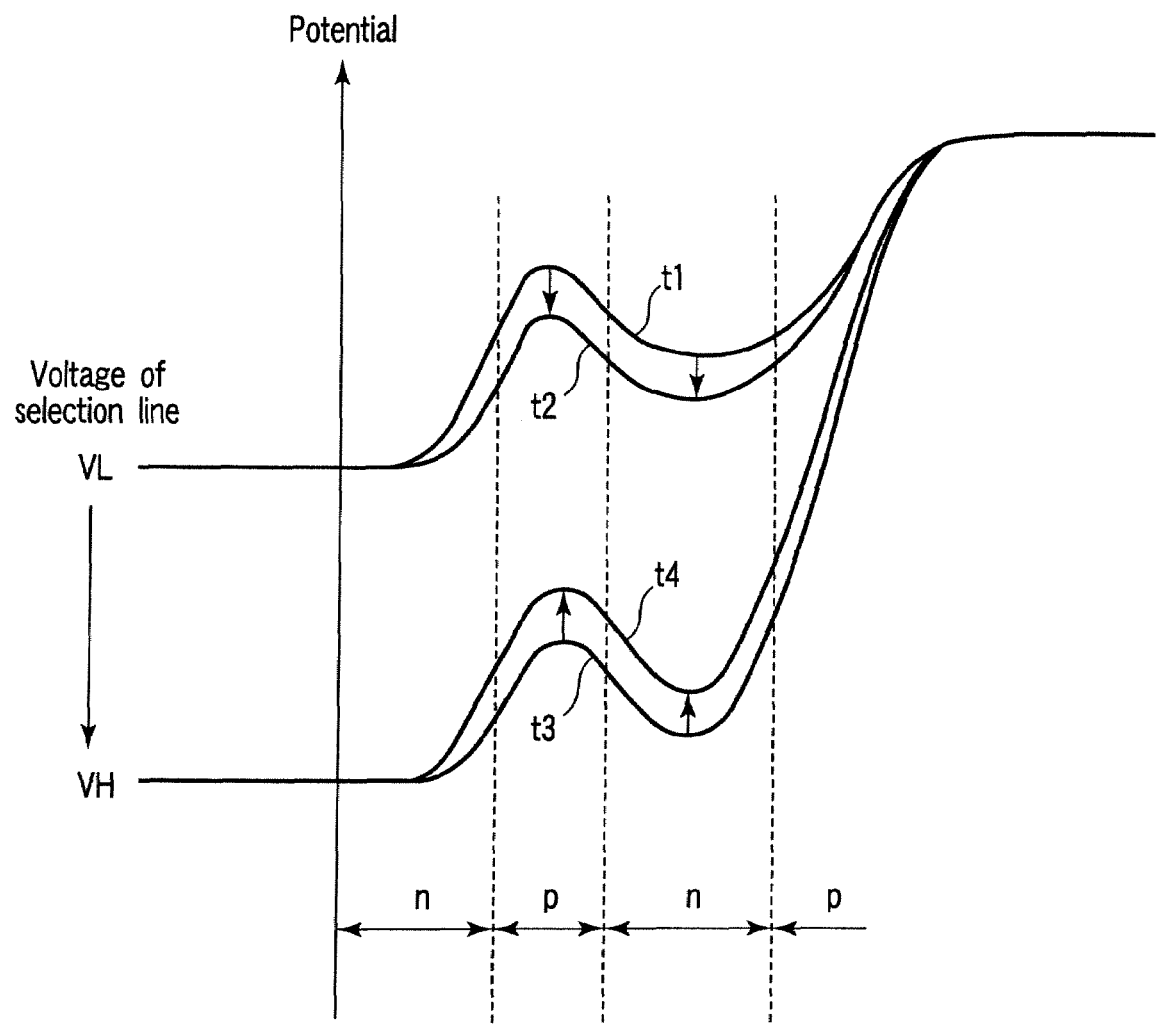
FIG. 12 is a diagram showing the potential state in the section taken along a line D-D' of FIG. 10 in the timings t1 to t4 in the waveform diagram of FIG. 11.

FIG. 12 shows the potential state in the section taken along a line D-D' of FIG. 10 in the timings t1 to t4 in the waveform diagram of FIG. 11.

The accumulation operation of the holes in each pixel, signal readout operation, and reset operation will next be described in detail with reference to the potential diagram of FIG. 12.

In the timing t1 immediately after the start of the accumulation period immediately after the pulse signal S4 applied to the selection line 4 changes to VL, as described above, for the electron-hole pairs generated in accordance with the incident light, the holes are accumulated and integrated in the p-type embedded region 26. Accordingly, the potential of the p-type embedded region 26 drops. Furthermore, accordingly the potential in the n-type well region 21 under the p-type embedded region 26 is also modulated and lowered. In the timing t2 immediately before the end of the accumulation period, the potential in the n-type well region 21 is lower than that of the timing t1.

Subsequently, when the readout period is started, and the pulse signal S4 applied to the selection line 4 changes to VH, the whole potential accordingly drops in proportion to (VH-VL). Additionally, since the p-type substrate 20 is fixed at the ground potential, the potential of the substrate 20 is constant and does not change. Thereafter, when the signal S9 reaches the high level (VH), and the MOS transistor 9N in FIG. 8 turns on, for three pixels of the same column, the electron current flows via the pixel indicating the lowest potential of the n-type well region 21 and the constant current source 13. In this case, while VL is applied to the other selection lines 2, 3 excluding the selection line 4, VH is applied to the selection line 4, the potential of the n-type well region 21 of the pixel connected to the selection line 4 is lowest, and therefore the electron current flows via the pixel connected to the selection line 4. A path of the current flowing at this time is shown by an arrow a in FIG. 10. That is, the source follower is thereby formed in which the selection line 4 is the power source, the selected pixel 15 connected to the selection line 4 and signal line 6 is the junction gate type FET, and the current source 13 is the current source. The potential is outputted as the signal OUT via the impedance conversion circuit 14 in accordance with the potential value of the minimum point of the potential of the n-type well region 21 of the selected pixel 15. In this case, since the minimum point of the potential of the n-type well region 21 is modulated by the integrated value of the holes generated by the incident light, all the pixels are scanned by the pixel row selection circuit 19 and pixel column selection circuit 12, the signal is successively read out of the impedance conversion circuit 14, and thereby the video signal can be obtained.

Subsequently, in a state in which the pulse signal S4 applied to the selection line 4 indicates VH, and in the timing t4 after the pulse signal S18 applied to the selection line 18 changes to VL from VH, the depletion layer of the surface of the p-type substrate 20 under the MOS type gate electrode 31 in FIG. 10 disappears, and the holes accumulated in the p-type embedded region 26 flows into the substrate 20 along a path of a shown arrow b. Thereby, the potential of the p-type embedded region 26 increases, the potential of the n-type well region 21 accordingly increases, and the reset operation is performed.

As described above, also in the solid-state image sensor of the second embodiment, each pixel is substantially constituted by one junction-type FET, and the structure is simple and suitable for miniaturization as compared with the CCD type.

Furthermore, similarly as the first embodiment, the capacitance between the p-type embedded region 26 and the n-type well region 21, drain region 22 can sufficiently be secured, and the sufficient amount of signal charges (holes) can be accumulated. Additionally, the complete depletion of the p-type embedded region 26 is possible under the usual operation voltage. As a result, the noise is prevented from being generated and the improvement of the general SN ratio can be achieved.

Furthermore, similarly as the first embodiment, the junction-type gate FET is used in which the polysilicon gate electrode is not used. Therefore, the effect that the sensitivity to blue can be prevented from dropping is obtained.

Moreover, since the photodiode including the p-type embedded region 26 under the n-type diffusion region 24 and n-type well region 21 to perform the photoelectric conversion, and the p-type embedded region 26 for accumulating the charges are integrated in the vertical direction of the substrate, the size of the pixel can effectively be miniaturized as compared with the photodiode and region formed separately from each other.

In the second embodiment, the signals each having two voltage values can be used as the pulse signals S2 and S3 and S16 to S18 for controlling the readout and discharge of the signals, it is therefore unnecessary to generate a pulse signal which has a large voltage amplitude, and an effect is obtained that a circuit scale of the pixel row selection circuit 19 can be reduced as compared with the pixel row selection circuit 5 of the embodiment of FIG. 2.

The operation of the solid-state image sensor of the second embodiment will next be further studied.

Figure 13:
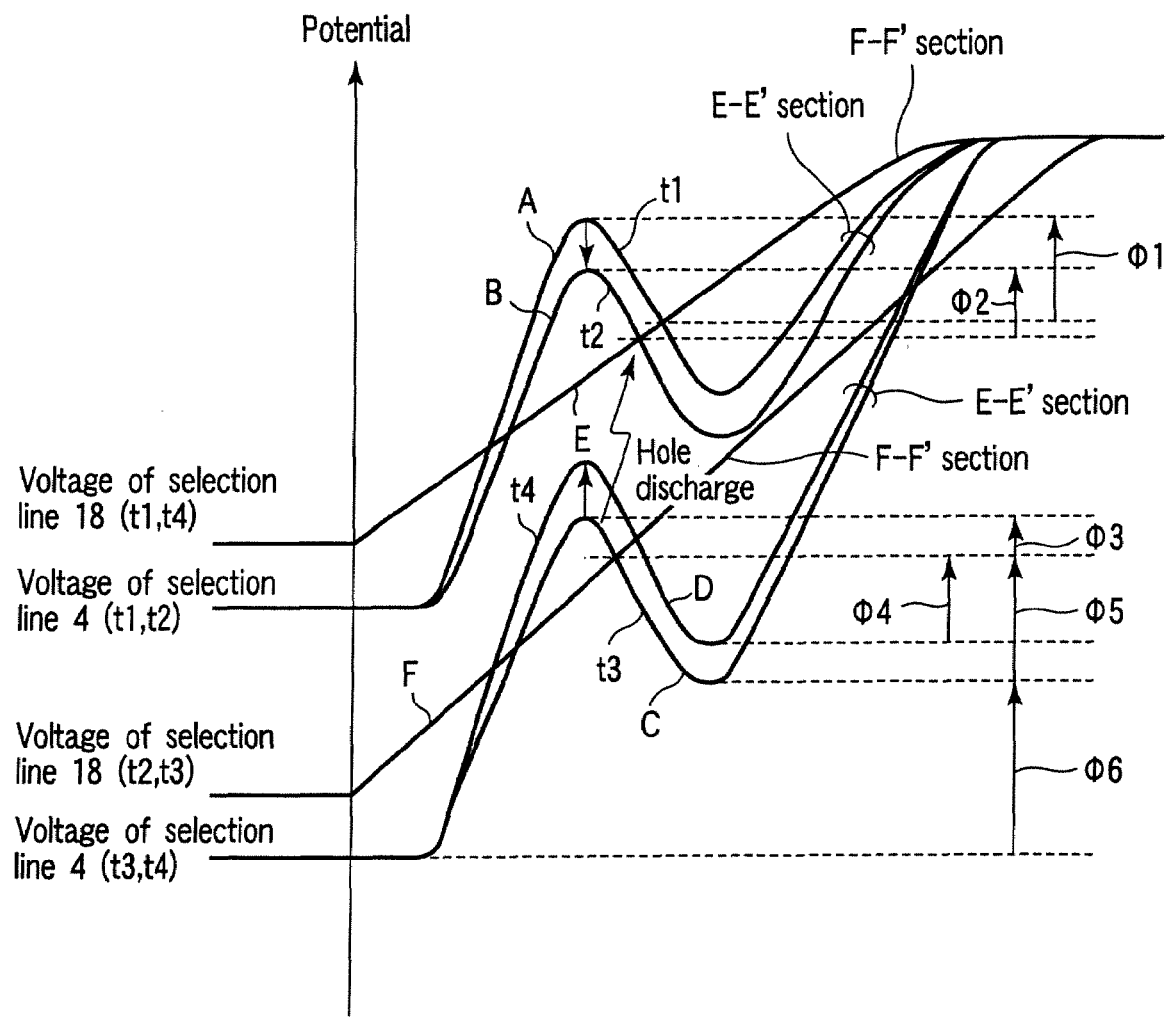
FIG. 13 is a diagram showing the potential states in the sections along lines E-E' and F-F' of FIG. 10.

FIG. 13 shows the potential state in the section taken along lines E-E' and F-F' of FIG. 10. Concretely, the selection lines 4 and 18 in FIG. 8, and the potential states of the pixels connected to both the selection lines in the respective timings t1 to t4 in FIG. 11 are shown.

In FIG. 13, A to D show the potential states in an E-E' section, A shows the state of the timing t1 immediately after the integration start, B shows the state of the timing t2 immediately before the integration end, C shows the state of the timing t3 immediately after the readout start, and D shows the state of the timing t4 in the signal charge discharge period. Similarly, E and F show the potential states in the E-E' section, E shows the state of the timing t1 immediately after the integration start, F shows the state of the timing t2 immediately before the integration end, F shows the state of the timing t3 immediately after the readout start, and E shows the state of the timing t4 in the signal charge discharge period.

Furthermore, in FIG. 13, φ1 to φ6 have potentials: φ1 has the potential which determines a maximum amount of accumulatable holes; φ2 shows the potential indicating an allowance for preventing the integrated holes from overflowing at an integration end time; φ3 shows the potential indicating an allowance for preventing the integrated holes from overflowing at a readout start time; φ4 shows the potential corresponding to an allowable value of a rise of the potential by the source follower for electron current detection of the pixel in which the holes are not accumulated at the readout time; φ5 shows the potential corresponding to the allowable value of the rise of the potential by a source follower current for the current detection of the pixel in which the holes are accumulated at the readout time; and φ6 shows the potential corresponding to a drain voltage allowance for setting the source follower operation for the current detection of the pixel to be normal at the readout time. It is to be noted that the direction of the arrow of each potential indicates positive polarity.

For the normal operation, each potential needs to be in the detection shown in FIG. 13. In other words, all the potentials need to have positive polarity. Moreover, for φ4 and φ5, when φ4 has the positive polarity, φ5 also has the positive polarity. Furthermore, when the value of φ4 is extremely small, the source follower current cannot have a sufficient value, and operation speed is limited. Therefore, design consideration is necessary.

One-dimensional consideration has been described. In actual, since the potential two-dimensionally spreads, further consideration is necessary.

Figure 14:
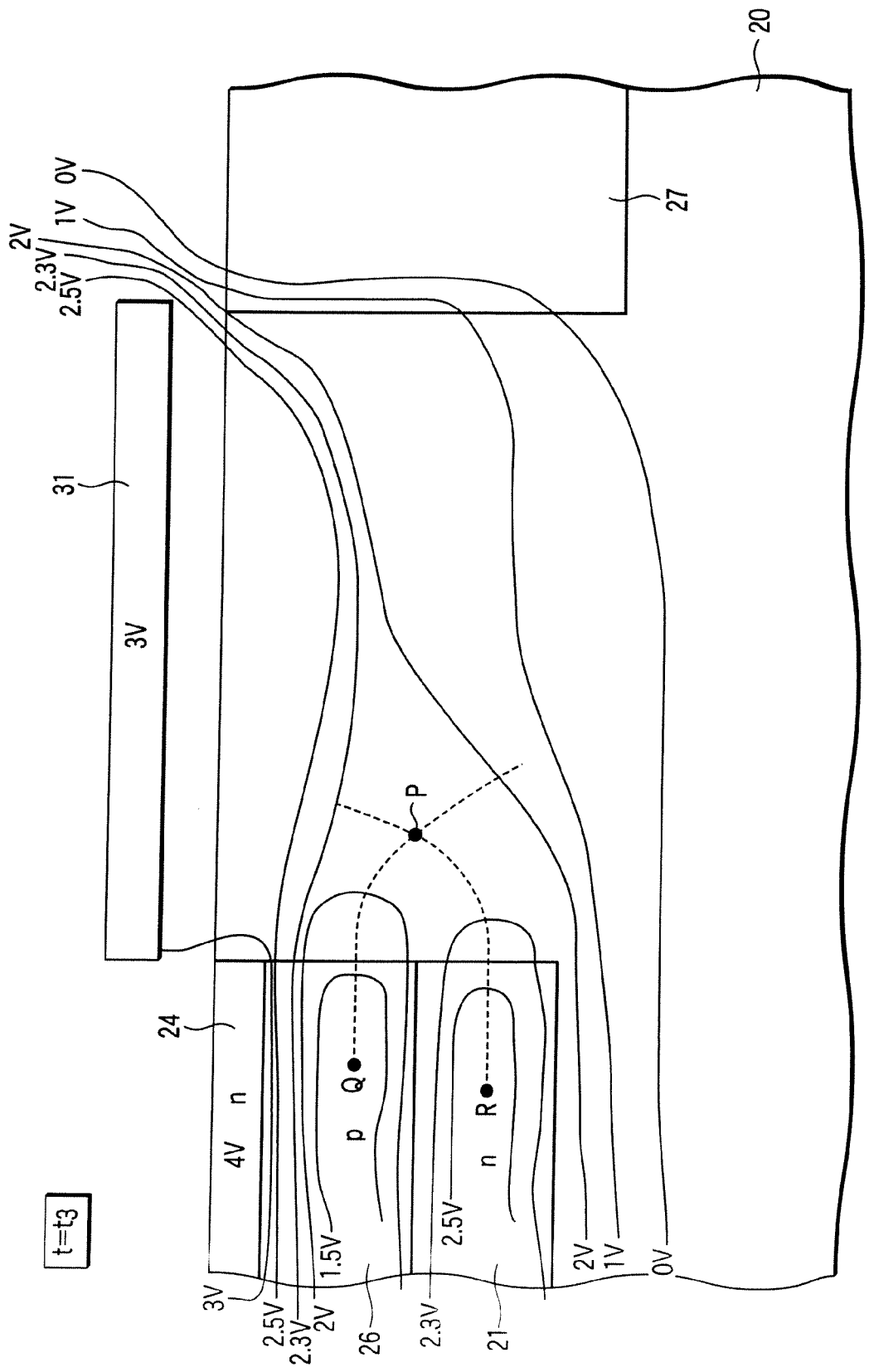
FIG. 14 is a diagram two-dimensionally showing the potential state in the vicinity of a MOS type gate electrode in FIG. 10.
Figure 15:
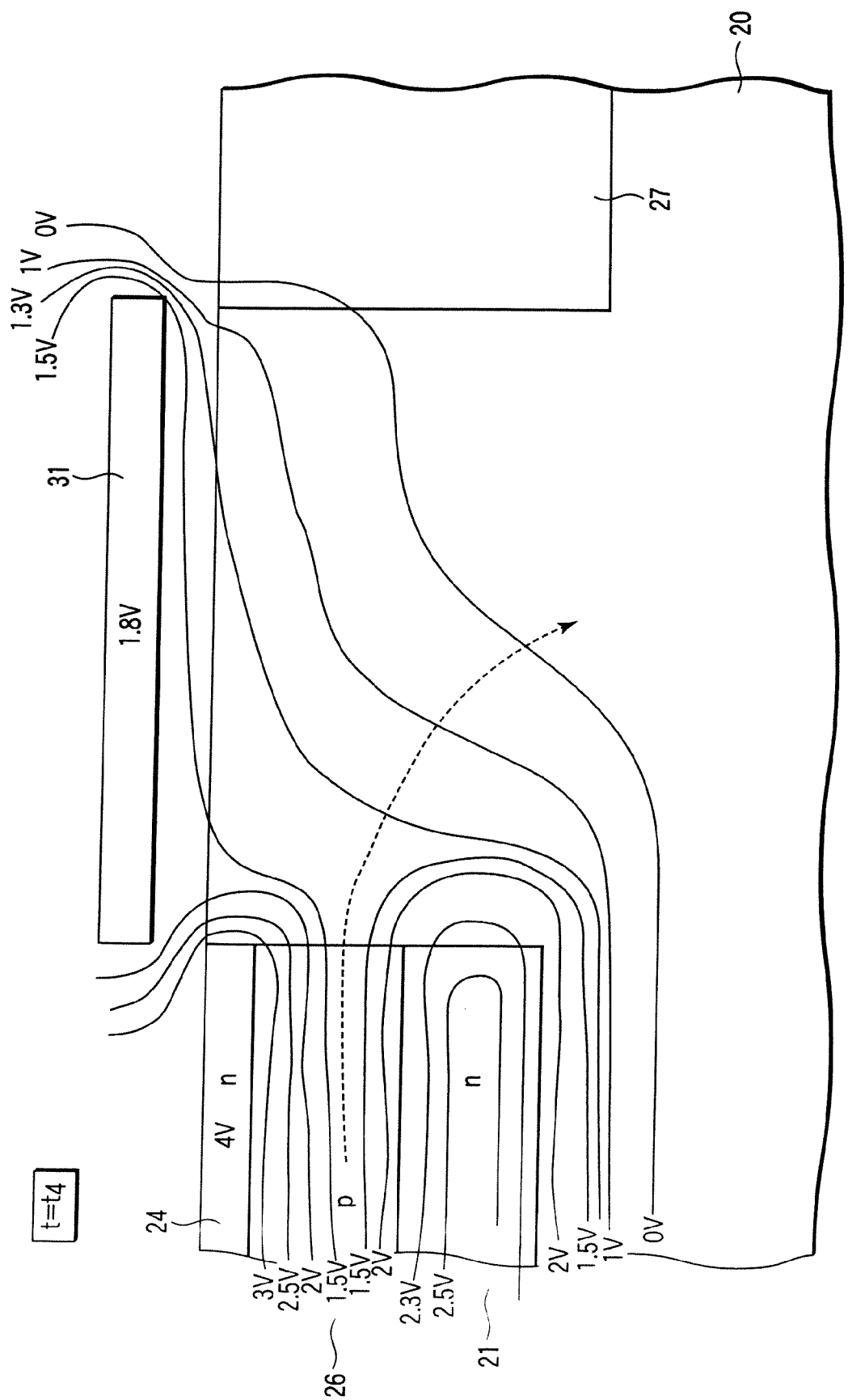
FIG. 15 is a diagram two-dimensionally showing the potential state in the vicinity of the MOS type gate electrode in FIG. 10 in the timings different from those of FIG. 14.

FIGS. 14 and 15 two-dimensionally show the potential state in the section in the vicinity of the MOS type gate electrode 31 in FIG. 10. It is to be noted that FIG. 14 shows the state in the timing t3 immediately after the readout start, and FIG. 15 shows the state in the timing t4 at the electric discharge time. Moreover, each voltage shown in the drawing indicates the potential. When the voltage value increases, the potential deepens. This follows a conventional notation of the solid-state image sensor.

As shown in FIG. 14, immediately after the readout start (t=t3), a maximum point R of the potential is positioned in the n-type well region 21, and a minimum point Q is positioned in the p-type embedded region 26. That is, the maximum and minimum points of the potential are separated from each other. Moreover, potential differences of the maximum point R and minimum point Q of the potential from saddle points P are operation allowances.

At the signal charge discharge time (t=t4), as shown by an arrow in FIG. 15, the potential successively drops toward the substrate from the p-type embedded region 26, and the charge accumulated in the p-type embedded region 26 is discharged to the substrate.

THIRD EMBODIMENT

Figure 16:
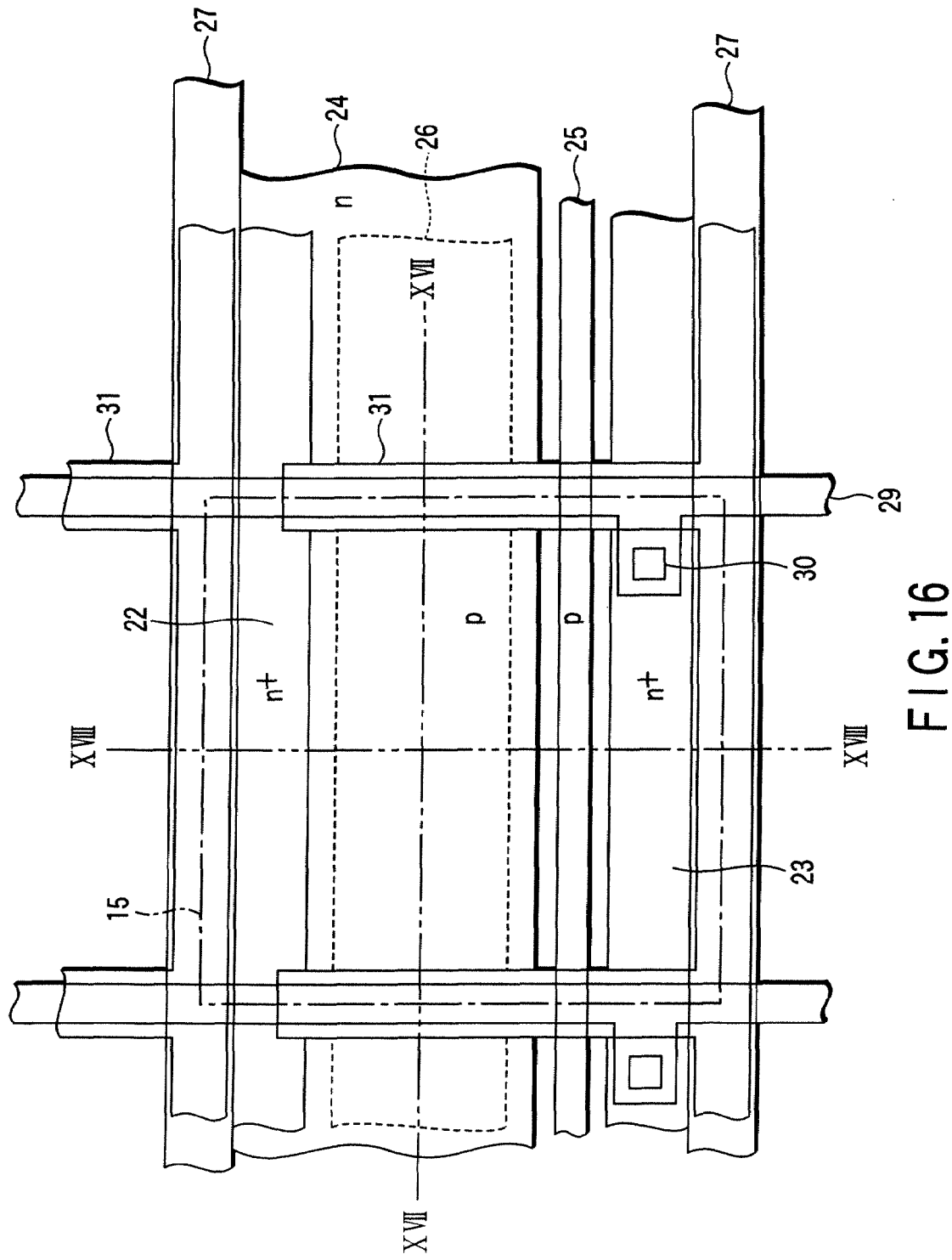
FIG. 16 is a pattern plan view showing the device structure of one pixel according to a third embodiment of the present invention.

FIG. 16 is a pattern plan view showing the device structure of the pixel 15 which includes a constitution different from that of FIG. 9, and FIGS. 17 and 18 are different sectional views in FIG. 16.

In the pixel shown in FIG. 9, the p-type diffusion region 25 is formed to surround the source region 23 in a middle, the p-type embedded region 26 is further formed to surround the p-type diffusion region 25, and the drain region 22 is formed to surround three sides of the p-type diffusion region 25. This case has been described.

On the other hand, according to the third embodiment, the source region 23, p-type diffusion region 25, p-type embedded region 26, and drain region 22 are extended in parallel with one another in the same direction.

Moreover, the MOS type gate electrode 31 includes a portion extended/formed in parallel with the source region 23, p-type diffusion region 25, p-type embedded region 26, and drain region 22 on the device isolation region 27, and a portion positioned under the wiring layer 29 and extended in parallel with the wiring layer 29. Furthermore, the portion of the MOS type gate electrode 31 positioned under the wiring layer 29 is interrupted midway in the drain region 22 so that the portions are separated from each other between the pixels disposed adjacent to each other in a vertical direction in the drawing.

It is to be noted that the p-type diffusion region 25 is extended/formed over a plurality of pixels so that the region is common to the plurality of pixels, but may also be separated for each pixel.

In this constitution, the potential state in each of the timings t1 to t4 in the section taken along lines H-H' and I-I' in FIG. 17 is similar to that shown in FIG. 13, the potential state in each of the timings t1 to t4 in the section taken along line J-J' in FIG. 18 is similar to that shown in FIG. 11, and the description thereof is omitted.

According to the third embodiment, when the electron current is passed through the source region 23 from the drain region 22 in accordance with the charge (hole) accumulated in the p-type embedded region 26, the current flows in a direction XVIII-XVIII in FIG. 16 (vertical direction of FIG. 16). On the other hand, when the charge accumulated in the p-type embedded region 26 is discharged, the charge (hole) is discharged in a direction XVII-XVII in FIG. 16 (horizontal direction of FIG. 16).

According to the third embodiment, effects similar to those of the first and second embodiments are obtained, and additionally the following effect is obtained. That is, the source region 23, p-type diffusion region 25, p-type embedded region 26, and drain region 22 are extended in parallel with one another in the same direction, and the source region 23 is disposed in a peripheral portion rather than in the middle of the pixel. Therefore, the contact 30 for connecting the wiring layer 29 to the source region 23 can be disposed in the peripheral portion, not in the middle of the pixel, a photodiode region can be disposed in the middle of the pixel, and an improvement effect of a focus ration by the on-chip micro lens can be obtained.

Figure 19:
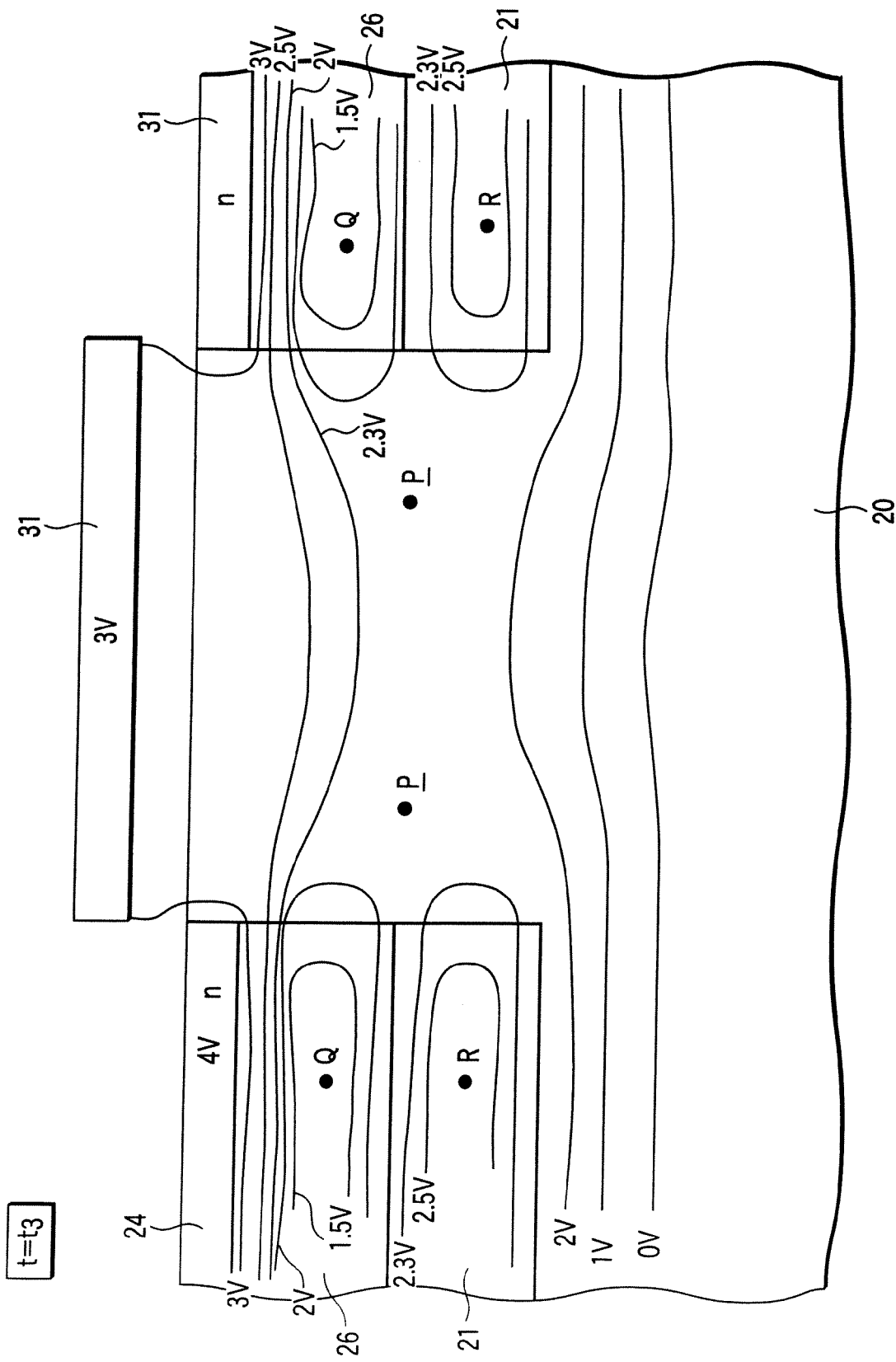
FIG. 19 is a diagram two-dimensionally showing the potential state in the vicinity of the MOS type gate electrode in the timing t3 immediately after a read start of the pixel shown in FIG. 16.

FIG. 19 two-dimensionally shows the potential state of the section in the vicinity of the MOS type gate electrode 31 in the timing t3 immediately after the readout start of the pixel shown in FIG. 16. Similarly as FIGS. 14, 15, the voltage shown in FIG. 19 indicates the potential.

As shown in FIG. 19, the third embodiment is similar to the second embodiment in that the maximum point R of the potential is positioned in the n-type well region 21 and the minimum point Q is positioned in the p-type embedded region 26. Furthermore, the third embodiment is different from the embodiment of FIG. 14 in that the maximum and minimum points are generated on opposite sides of the MOS type gate electrode 31 in a symmetric state.

Figure 20:
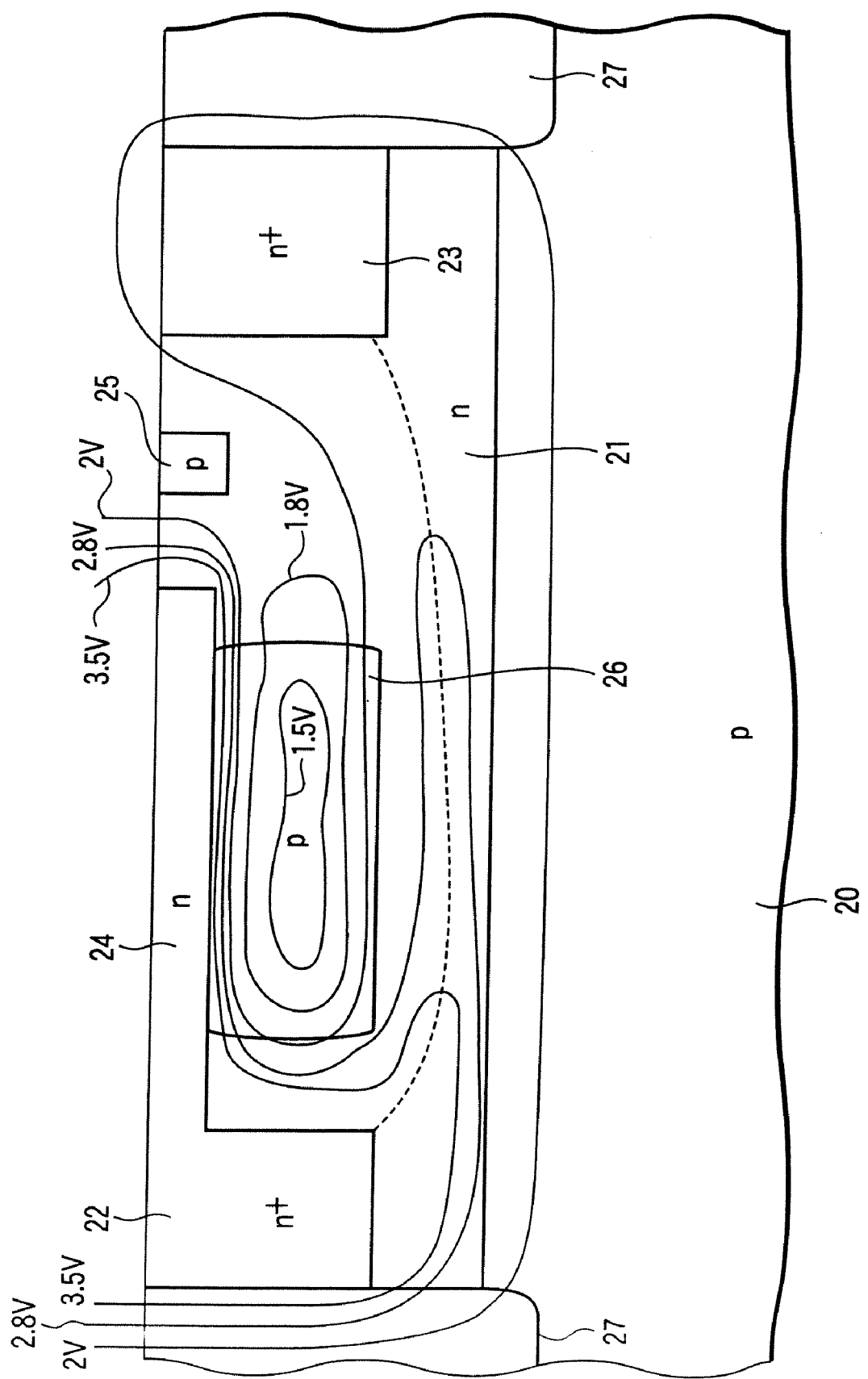
FIG. 20 is a diagram schematically showing an effect of parasitic channel prevention in the first to third embodiments.

FIG. 20 schematically shows an effect of parasitic channel prevention by the formed p-type diffusion region 25 in the first to third embodiments, and shows the potential state in the section taken along line XVII-XVII in FIG. 16. Also in this case, the voltage shown in the drawing indicates the potential.

As shown, when the p-type diffusion region 25 is formed, the generation of the channel is suppressed in the surface, and the electron current flows in a path shown by a broken line in the drawing between the drain region 22 and source region 23. That is, the current is prevented from flowing between the drain region 22 and source region 23 through the surface region of the n-type well region 21.

(First Modification Example of Third Embodiment)

Figure 21:
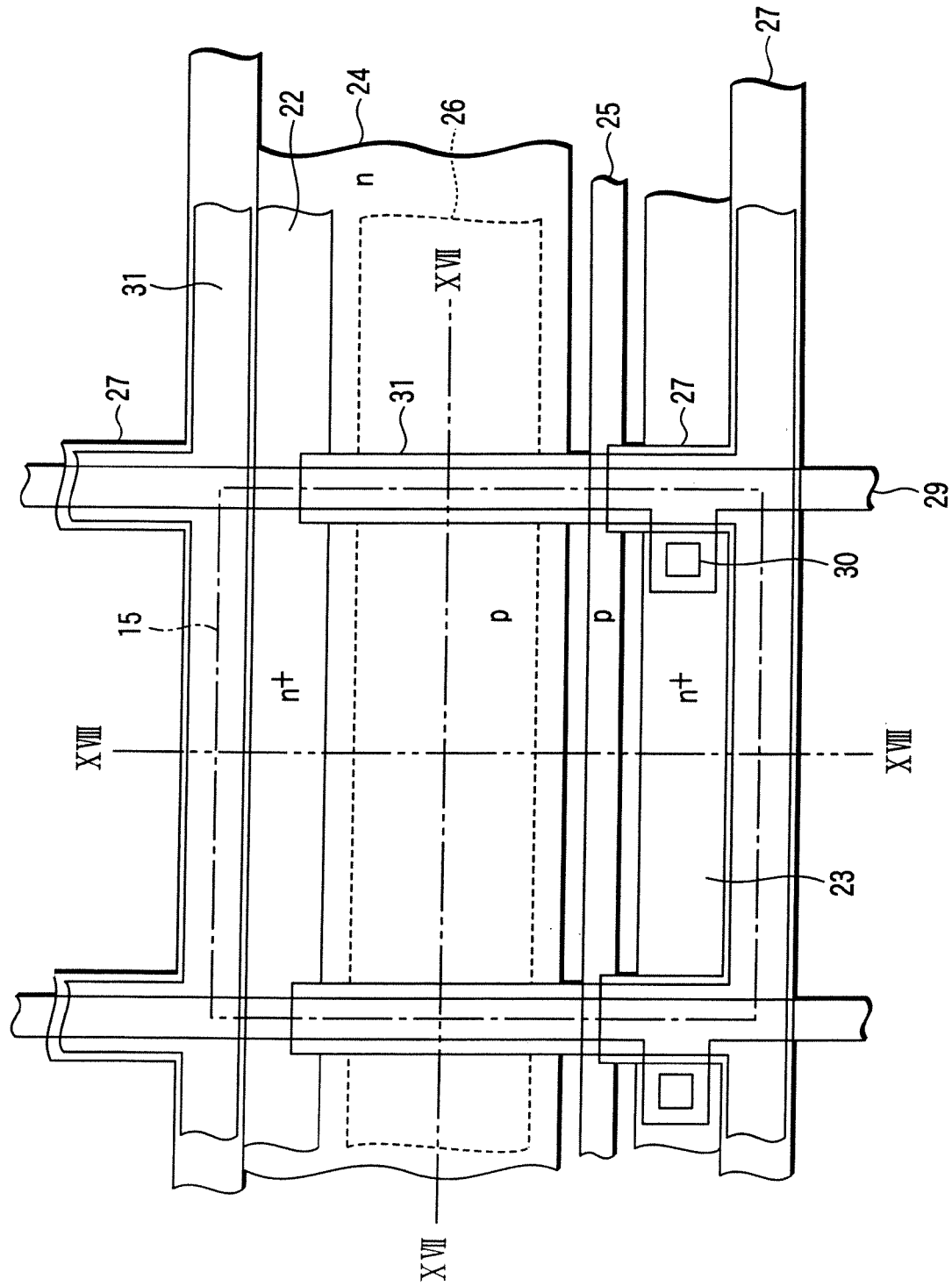
FIG. 21 is a pattern plan view showing the device structure of the pixel according to a first modification example of the third embodiment.

FIG. 21 is a pattern plan view showing the device structure of the pixel 15 which includes a constitution different from that of FIG. 16. In the pixel shown in FIG. 16, the device isolation region 27 is extended in a direction parallel to an extension direction of the source region 23. On the other hand, for the pixel 15 according to the modification example, one portion of the device isolation region 27 is extended, and one portion of the device isolation region 27 is positioned between the source regions 23 of the pixels 15 disposed adjacent to each other in the lateral direction in FIG. 21.

It is to be noted that a section taken along a line XVII-XVII and a section taken along a line XVIII-XVIII in FIG. 21 are similar to those of FIGS. 17 and 18, and are therefore omitted from the drawings.

According to the first modification example, an effect similar to that of the third embodiment is obtained. Additionally, since one portion of the device isolation region 27 is formed between the source regions 23 of the pixels disposed adjacent to each other in the lateral direction in FIG. 21, isolation capability of the pixels can effectively and easily be enhanced as compared with the isolation by the MOS type gate electrode 31. That is, with the isolation by the MOS type gate electrode 31, the value of the voltage applied to the MOS type gate electrode 31 needs to be adjusted in accordance with impurity density of the substrate 20, but with the isolation by the device isolation region 27, such adjustment is not required at all.

(Second Modification Example of Third Embodiment)

FIG. 22 is a sectional view showing the device structure in the vicinity of the MOS type gate electrode 31 of the pixel which includes a constitution different from that of FIG. 16. For the pixel according to the modification example, in the p-type substrate 20 under the MOS type gate electrode 31, an embedded region 33 which has a polarity reverse to the p-type, that is, n-type is formed adjacent to the p-type embedded regions 26, and an embedded region 34 which has a polarity reverse to the n-type, that is, p-type is formed adjacent to the n-type well regions 21. It is to be noted that the n-type embedded region 33 contacts the p-type embedded region 34 in the vertical direction.

When the n-type embedded region 33 is formed adjacent to the embedded region 26 and the p-type embedded region 34 is formed adjacent to the n-type well region 21 in this manner, desired accumulation and discharge operations of the charges can be achieved without so precisely controlling the dosage of impurities in the p-type embedded region 26 and n-type well region 21.

FOURTH EMBODIMENT

FIG. 23 is a whole circuit diagram of the solid-state image sensor according to a fourth embodiment of the present invention.

In the solid-state image sensor of FIG. 2, the drains of the pixels 1 are connected to the corresponding selection lines 2 to 4, but in the fourth embodiment the drains of all the pixels 1 are connected to the ground potential.

Moreover, as switches, connected to the signal lines 6 to 8, for selecting the signal lines, P-channel MOS transistors 9P to 11P are used in the fourth embodiment. Furthermore, the current source 13 is connected between the common connection point of the MOS transistors 9P to 11P and a positive potential such as a power potential Vcc, and the current source 13 supplies the hole and passes the current to each pixel 1.

In the solid-state image sensor shown in FIG. 23, similarly as FIG. 2, a plurality of pixels are integrated in the semiconductor substrate. It is to be noted that as not especially shown, the compensation circuit for offset compensation of each pixel and the signal processing circuit for performing various types of signal processing such as A/D conversion of the output of the impedance conversion circuit 14 are integrated in the same semiconductor substrate.

In the solid-state image sensor shown in FIG. 23, when the light is incident, the signal charges are accumulated in each pixel in accordance with each light amount, and the threshold voltage of each pixel 1 changes in accordance with the accumulated signal charge amount. Moreover, when the pulse signal outputted from the pixel row selection circuit 5 is applied to any one of the selection lines 2 to 4, the pixel row is selected. Furthermore, when the pulse signal outputted from the pixel column selection circuit 12 is applied to any one of the gates of the MOS transistors 9P to 11P, and the MOS transistor is turned on, the pixel column is selected, and thereby one pixel 1 is selected. In this case, as shown by arrows in FIG. 23, the current path is formed to extend to the ground potential via the power source Vcc, current source 13, MOS transistor having the on state (MOS transistor 10P in the present example), signal line (signal line 7 in the present example), and selected pixel, and the signal is outputted via the impedance conversion circuit 14 in accordance with the threshold voltage of the selected pixel.

Figure 24:
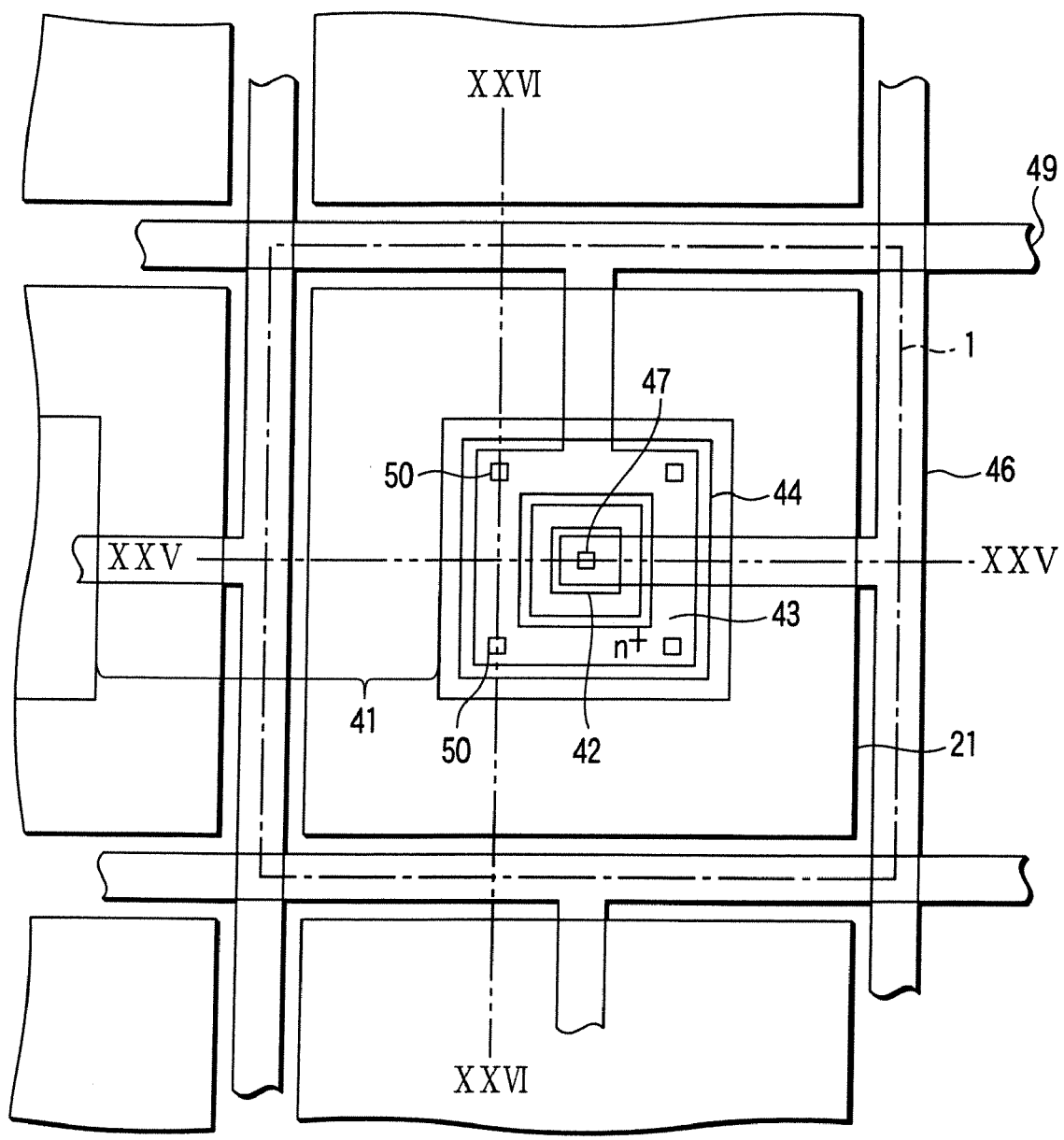
FIG. 24 is a pattern plan view showing the device structure of one pixel of the solid-state image sensor of FIG. 23.

FIG. 24 is a pattern plan view showing the device structure of one pixel 1 in FIG. 23, and FIGS. 25 and 26 are different sectional views.

The n-type well region 21 whose separated plane shape for each pixel is rectangular is formed in the surface region of the p-type semiconductor substrate 20. The ground potential is supplied to the p-type substrate 20. Furthermore, in the surface region of the n-type well region 21, a drain region 41 and source region 42 including P+-type diffusion regions are formed apart from each other. The drain region 41 is disposed over the n-type well region 21 of the adjacent pixel, and the source region 42 is disposed substantially in the middle of the pixel region defined by a one-dot chain line in FIG. 24. Additionally, in the surface region of the n-type well region 21 between the drain region 41 and source region 42, an n+-type diffusion region 43 is formed. Moreover, in the n-type well region 21 under the n+-type diffusion region 43, a p-type diffusion region 44 is formed to contact the n+-type diffusion region 43 in the vertical direction.

The n+-type diffusion region 43 and p-type diffusion region 44 are disposed to surround the source region 42. Furthermore, the drain region 41 is disposed to surround the n+-type diffusion region 43 and p-type diffusion region 44. Additionally, the drain region 41 is extended to be common to the pixels for one row disposed adjacent to each other in the lateral direction in FIG. 24.

A first interlayer insulating film 45 is formed on the n-type well region 21. Furthermore, a wiring layer 46 corresponding to the signal lines 6 to 8 shown in FIG. 23 is formed on the first interlayer insulating film 45. Moreover, an opening connected to the surface of the source region 42 is formed with respect to the first interlayer insulating film 45, and a contact 47 which connects the source region 42 and wiring layer 46 is formed in the opening. Furthermore, a second interlayer insulating film 48 is formed on the wiring layer 46, and a wiring layer 49 is formed on the second interlayer insulating film 48.

Moreover, an opening connected to the surface of the n+-type diffusion region 43 is formed with respect to the second interlayer insulating film 48 and first interlayer insulating film 45, and a contact 50 which connects the n+-type diffusion region 43 and wiring layer 49 is formed in the opening. Furthermore, a third interlayer insulating film 51 is formed on the wiring layer 49.

As shown in FIG. 24, the wiring layer 46 is extended along one side of each pixel in the vertical direction of FIG. 24. Moreover, one portion of the wiring layer 46 is extended to the position of the source region 42 positioned in the middle of the pixel, and electrically connected to the source region 42 via the contact 47. Furthermore, the wiring layer 49 is extended along one side of each pixel different from the above-described side in the horizontal direction of FIG. 24. Additionally, one portion of the wiring layer 49 is extended to the position of the n+-type diffusion region 43 positioned in the middle portion of the pixel, and electrically connected to the n+-type diffusion region 43 via a plurality of (e.g., four in the present example) contacts 50.

It is to be noted that a micro lens for focusing the incident light is formed for each pixel on the third interlayer insulating film 51, but the lens is not shown in the drawing to simplify the description.

In the pixel including the above-described section structure, when the incident light focused by the on-chip micro lens is emitted, the photodiode including the p-type diffusion region 44 and n-type well region 21 under the diffusion region performs photoelectric conversion with the photodiode including the n-type well region 21 and p-type substrate 20, and a photodiode including the drain region 41 and the n-type well region 21 under the drain region, and the plurality of electron-hole pairs are generated. In the generated electron-hole pairs, the holes flow to the outside via the drain region 41. On the other hand, the electrons are accumulated and integrated in the n-type well region 21 under the p-type diffusion region 44. The accumulated amount of the electrons corresponds to the product of the intensity of the incident light and the integration time. Moreover, the threshold voltage of each pixel is modulated in accordance with the accumulated amount of the electron.

Moreover, after the integration of the charge (electrons), each pixel is successively scanned by the pixel row selection circuit 5 and pixel column selection circuit 12, and the change of the threshold voltage of each pixel is read out as the signal. After reading out the signal from the pixel, the electron accumulated in each pixel is discharged to the n+-type diffusion region 43, and the reset operation is performed.

FIG. 27 is a waveform diagram of the major signals in the solid-state image sensor shown in FIG. 23. In FIG. 27, the signals S2, S3, S4 are outputted from the pixel row selection circuit 5, and indicate the waveforms of the pulse signals applied to the gate of each pixel via the selection lines 2 to 4. Signals S9P, S10P, S11P are outputted from the pixel column selection circuit 12, and indicate the waveforms of the pulse signals applied to the gates of the MOS transistors 9P, 10P, 11P. The signal OUT indicates the waveform of the signal outputted from the impedance conversion circuit 14.

As shown in FIG. 27, the pulse signals S2 to S4 having the voltage indicating three values VL, VM, and VH are applied to the selection lines 2 to 4. In the three-valued voltage, VL is lowest, VM is higher than VL, and VH is higher than VM.

An operation of the solid-state image sensor of FIG. 23 will next be described with reference to FIG. 27.

The period in which the signals are read out of all the pixels is referred to as one frame period. In one frame period, the signals S2 to S4 of the selection lines 2 to 4 drop to VM from VH and then drop to VM from VH. In one frame period, the period in which the signals S2 to S4 of the selection lines 2 to 4 indicate VM is the accumulation period of the electrons. The period of VL is the readout period in which the change of the threshold voltage of each pixel is read out as the signal. Furthermore, the period of VH is a reset period in which the electrons integrated in each pixel are discharged.

For example, in the period in which the signal S2 of the selection line 2 indicates VL, three pixels 1 in the same row connected to the selection line 2 are selected. When the signal S9P is set to a low level in this period, the MOS transistor 9P is turned on, the pixel column is selected, and the current flows into the current source 13 via the signal line 6 and the pixels 1 of the selected row and column. The signal indicating the threshold voltage of the selected pixel is outputted as the signal OUT via the impedance conversion circuit 14. Furthermore, when the signals S10P, S11P are successively set to the low level, the MOS transistors 10P, 11P are successively turned on, different pixel columns are successively selected, current flows into the current source 13 via the signal lines 7, 8 and the corresponding pixels 1 of the selected column, and the signal indicating the threshold voltage of the selected pixel is outputted as the signal OUT via the impedance conversion circuit 14. The pixel row is changed and successively subjected to this operation, so that the signals are read out of all the pixels.

Moreover, after the signals are read out of three pixels in each pixel row, the signals S2 to S4 of the selection lines 2 to 4 turn to VH, the electrons are discharged from these three pixels 1, and the reset operation is performed to prepare for the next accumulation of the electrons.

Figure 28:
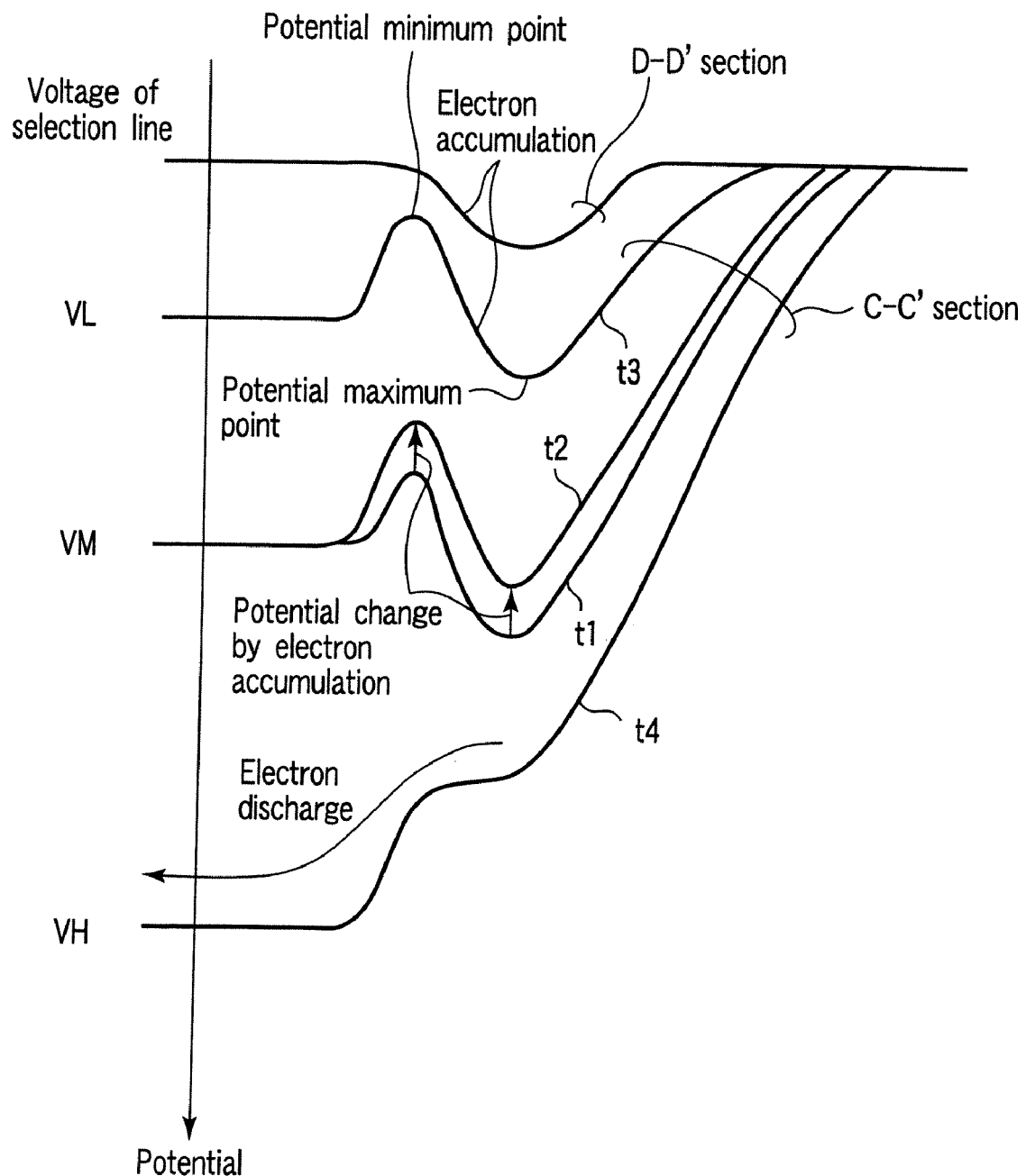
FIG. 28 is a diagram showing the potential states in the sections along lines C-C' and D-D' in FIG. 25 in the respective timings t1 to t4 in the waveform diagram of FIG. 27.

FIG. 28 shows the potential state in the section taken along lines C-C' and D-D' in FIG. 25 in the respective timings t1 to t4 in the waveform diagram of FIG. 27. The accumulation operation of the electrons in each pixel, signal readout operation, and reset operation will next be described in detail with reference to the potential diagram of FIG. 28.

In the timing t1 immediately after the start of the accumulation period immediately after the voltage signal S4 applied to the selection line 4 changes to VM from VH, as described above, for the plurality of electron-holes pair generated in accordance with the incident light, the electrons are accumulated and integrated centering on the minimum point of the potential of the n-type well region 21 under the p-type diffusion region 44. Thereby, the minimum point of the potential of the n-type well region 21 and the maximum point of the potential of the p-type diffusion region 44 are also modulated. In the timing t2 immediately before the end of the accumulation period, the minimum point of the potential of the n-type well region 21 is higher than that of the timing t1.

Subsequently, when the readout period is started, and the pulse signal S4 applied to the selection line 4 changes to VL, the whole potential accordingly increases in proportion to (VM-VL). Additionally, since the p-type substrate 20 is fixed at the ground potential, the potential of the substrate 20 is constant and does not change. Thereafter, when the signal S9P indicates the low level, and the MOS transistor 9P in FIG. 23 turns on, for three pixels of the same row, a hole current flows from the current source 13 via the pixel indicating the highest maximum point of the potential of the p-type diffusion region 44. In this case, while VM is applied to the other selection lines 2, 3 excluding the selection line 4, VL is applied to the selection line 4, the potential of the n+-type diffusion region 43 of the pixel connected to the selection line 4 is highest, and therefore the hole current flows via the pixel connected to the selection line 4. The hole current flowing at this time is shown by arrows a in FIG. 24. That is, the source follower is thereby formed which includes the power potential Vcc, current source 13, MOS transistor 9P, signal line 6, and selected pixel 1, and the potential is outputted as the signal OUT from the impedance conversion circuit 14 in accordance with the maximum point of the potential of the p-type diffusion region 44 of the selected pixel 1. In this case, since the maximum point of the potential of the p-type diffusion region 44 is modulated by the integrated value of the electron generated by the incident light, all the pixels are scanned by the pixel row selection circuit 5 and pixel column selection circuit 12, the signal is successively read out of the impedance conversion circuit 14, and thereby the video signal can be obtained.

Subsequently, in the timing t4 after the readout period ends and the pulse signal S4 applied to the selection line 4 changes to VH, the potential of the n-type diffusion region 43 drops, and the electron accumulated in the minimum point of the potential of the n-type well region 21 is thereby discharged via the n+-type diffusion region 43.

Also in the fourth embodiment, each pixel is constituted by one junction-type FET, and the structure is simple and suitable for miniaturization as compared with the charge coupling device type. Additionally, the n-type well region 21 in which the charges (electrons) are accumulated forms the coupling with the peripheral semiconductor region, and the predetermined voltage is applied to the n-type well region 21, so that the potential is not in the floating state. As a result, after the charges (electrons) are discharged, the background charges do not exist in the n-type well region 21, and the conventional generation of the noise by the fluctuation of the background charge amount can be suppressed.

Moreover, since it is unnecessary to consider the influence of the background charge, the density of the impurity of the n-type well region 21 can be raised to a certain degree. Therefore, since the value of the capacity to ground can sufficiently be secured, and a sufficient amount of signal charges (electrons) can be accumulated, the saturated charge amount can be raised to a certain degree.

Furthermore, the junction gate FET is used in which the polysilicon gate electrode is not used, and the effect that the sensitivity to blue can be prevented from dropping can therefore be obtained. The photodiode including the p-type diffusion region 44 and n-type well region 21 under the diffusion region to perform the photoelectric conversion, the photodiode including the n-type well region 21 and p-type substrate 20, the photodiode including the drain region 41 and n-type well region 21 under the drain region, and the n-type well region 21 in which the charges are accumulated are disposed adjacent to one another, and integrated. Therefore, the effect is obtained that the size of the pixel can be miniaturized as compared with the photodiodes and region formed separately from one another.

FIFTH EMBODIMENT

Figure 29:
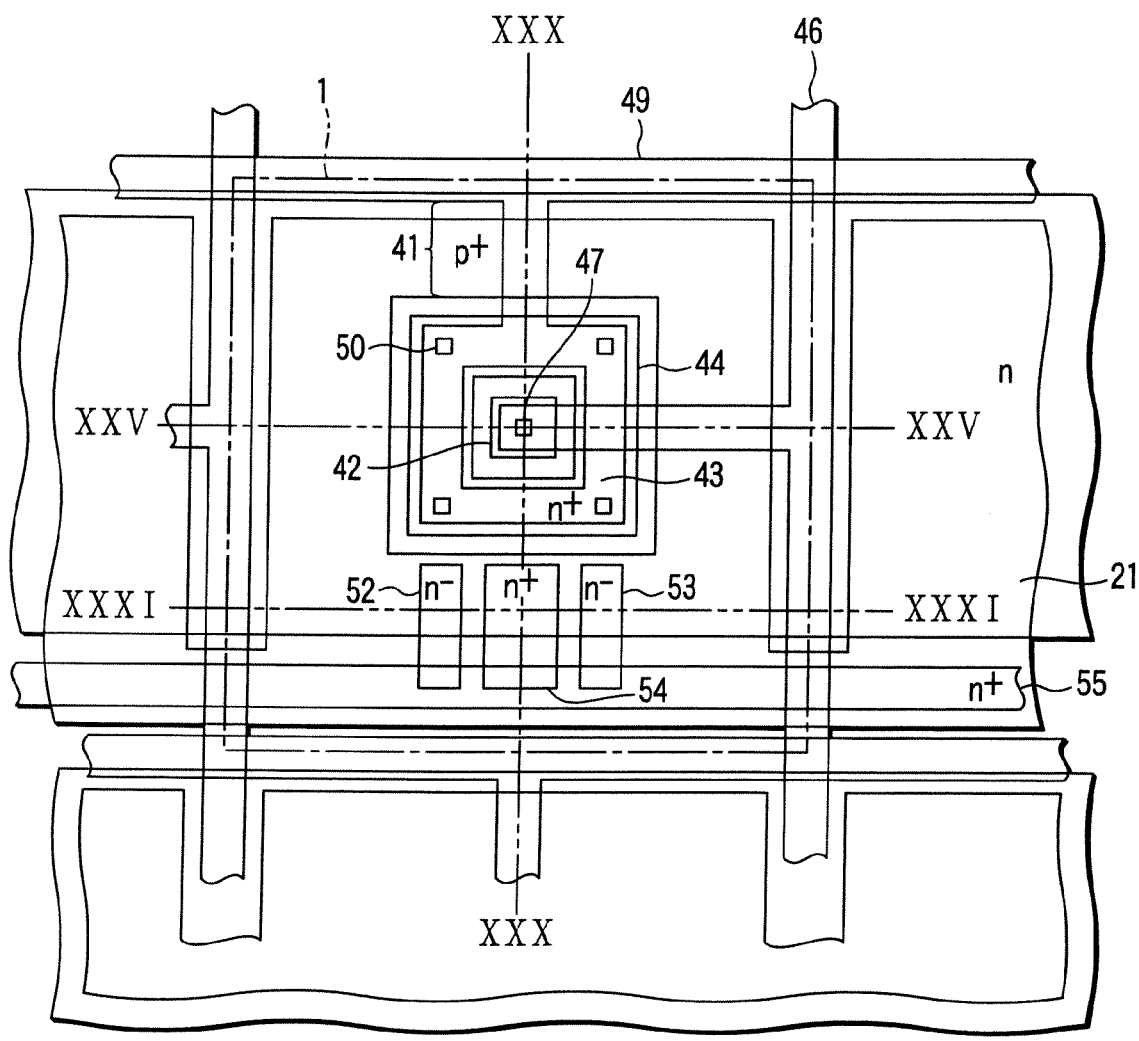
FIG. 29 is a pattern plan view showing the device structure of the pixel according to a fifth embodiment.
Figure 30:
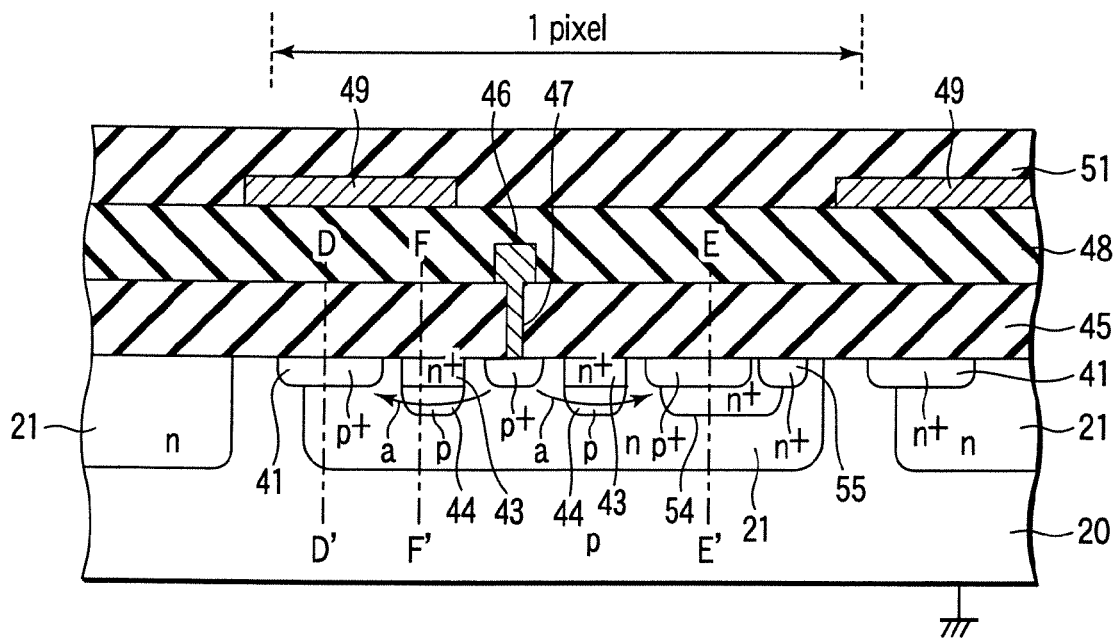
FIG. 30 is a sectional view of the pixel of FIG. 29.
Figure 31:
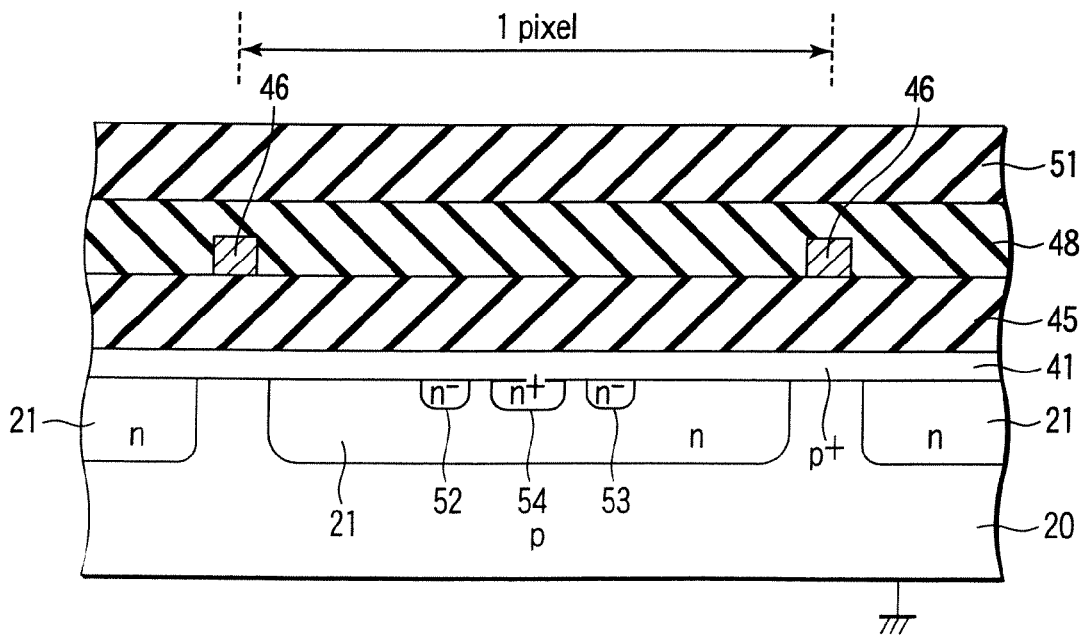
FIG. 31 is a different sectional view of the pixel of FIG. 29.

FIG. 29 is a pattern plan view showing the device structure of the pixel 1 which has a constitution different from that of FIG. 24, and FIGS. 30 and 31 are different sectional views. It is to be noted that a sectional view along a line XXV-XXV in FIG. 29 is the same as that of FIG. 25 of the fourth embodiment, and is therefore omitted.

In the pixel shown in FIG. 24, the n-type well region 21 is formed separately for each pixel. On the other hand, in the fourth embodiment, the pixels disposed adjacent to each other in the horizontal direction in FIG. 29 are separated by the P+-type drain region 41 formed in the surface region of the n-type well region 21. Furthermore, in the fourth embodiment, in the surface region of the n-type well region 21, n-type diffusion regions 52, 53 for potential adjustment, n+-type diffusion region 54, and n+-type diffusion region 55 for discharging the electrons accumulated in the n-type well region 21 under the p-type diffusion region 44 are formed.

The n+-type diffusion region 55 is disposed between the pixels disposed adjacent to each other in the vertical direction in FIG. 29, and extended in the horizontal direction in FIG. 29. Moreover, the n-type diffusion regions 52, 53 and n+-type diffusion region 54 are positioned between the n+-type diffusion region 43 and p-type diffusion region 44, the n+-type diffusion region 55, and the n-type diffusion regions 52, 53 are formed to be positioned on opposite sides of the n+-type diffusion region 54.

Figure 32:
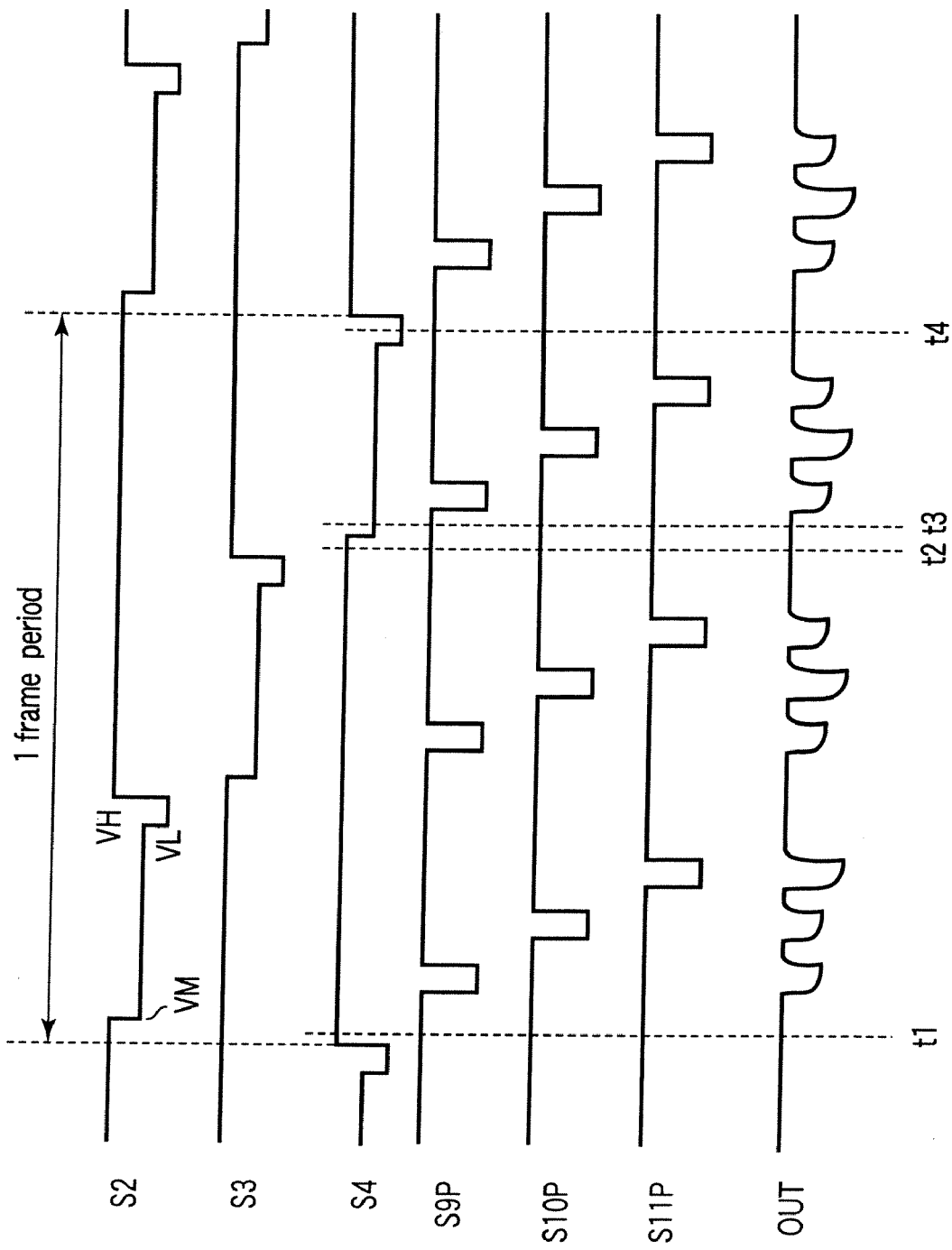
FIG. 32 is a waveform diagram of the major signal in the solid-state image sensor including the pixel shown in FIG. 29.

FIG. 32 is a waveform diagram of the major signals in the solid-state image sensor including the pixel shown in FIG. 29. As shown in FIG. 32, the pulse signals S2 to S4 having the voltages indicating three values VL, VM, and VH are applied to the selection lines 2 to 4. In the three-valued voltage, VL is lowest, VM is higher than VL, and VH is higher than VM.

The operation of the solid-state image sensor including the pixel shown in FIG. 29 will next be described with reference to FIG. 32.

The period in which the signals are read out of all the pixels is referred to as one frame period. In one frame period, the signals S2 to S4 of the selection lines 2 to 4 rise to VH from VL and then rise to VH from VL. In one frame period, the period in which the signals S2 to S4 of the selection lines 2 to 4 indicate VH is the accumulation period of the electrons. The period of VM is the readout period in which the change of the threshold voltage of each pixel is read out as the signal. Furthermore, the period of VH is the reset period in which the electrons integrated in each pixel are discharged.

For example, in the period in which the signal S2 of the selection line 2 indicates VM, three pixels 1 in the same row connected to the selection line 2 are selected. When the signal S9P is set to the low level in this period, the MOS transistor 9P is turned on, the pixel column is selected, and one pixel is selected. In this case, the current flows into the ground potential via the power potential Vcc, current source 13, MOS transistor 9P, signal line 6, and selected pixel, and the signal indicating the threshold voltage of the selected pixel is outputted as the signal OUT via the impedance conversion circuit 14. Furthermore, when the signals S10P, S11P are successively set to the low level, the MOS transistors 10P, lip are successively turned on, different pixel columns are successively selected, the current flows from the current source 13 via the signal lines 7, 8 and the corresponding pixels 1 of the selected column, and the signal indicating the threshold voltage of the selected pixel is outputted as the signal OUT via the impedance conversion circuit 14. The pixel row is changed and successively subjected to this operation, so that the signals are read out of all the pixels.

Moreover, after the signals are read out of three pixels 1 in each pixel row, the signals S2 to S4 of the selection lines 2 to 4 turn to VL, the electrons are discharged to the n+-type diffusion region 55 from these three pixels, and the reset operation is performed to prepare for the next accumulation of the electrons.

Figure 33:
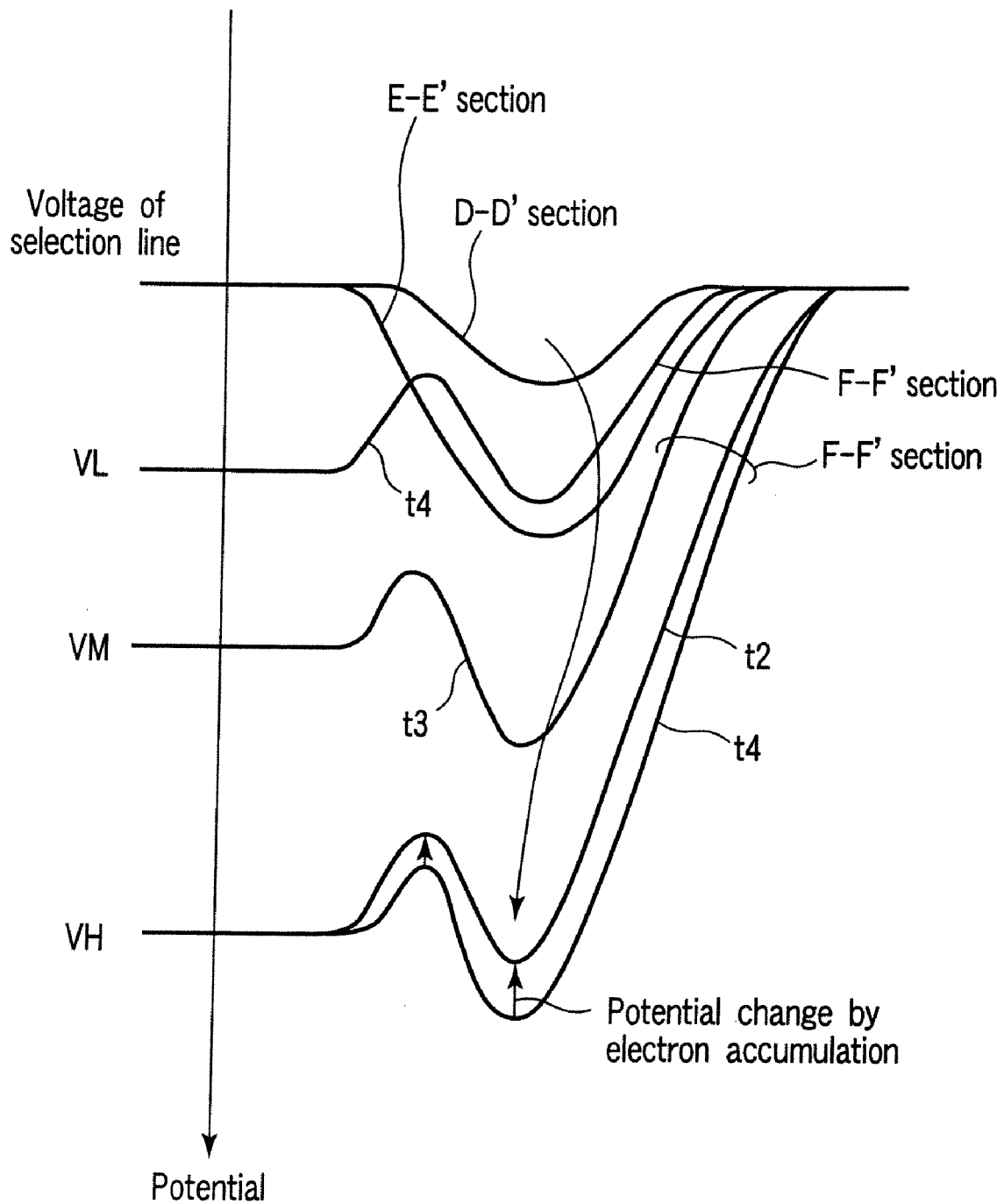
FIG. 33 is a diagram showing the potential states in the sections along lines D-D', E-E', and F-F' in the sectional view of FIG. 30 in the respective timings t1 to t4 in the waveform diagram of FIG. 32.

FIG. 33 shows the potential state in the section taken along lines D-D', E-E', and F-F' in the sectional view of FIG. 30 in the respective timings t1 to t4 in the waveform diagram of FIG. 32.

The accumulation operation of the electrons in each pixel, signal readout operation, and reset operation will next be described in detail with reference to the potential diagram of FIG. 33.

For example, in the timing t1 immediately after the start of the accumulation period immediately after the voltage signal S4 applied to the selection line 4 changes to VH from VL, as described above, for the plurality of electron-hole pairs generated in accordance with the incident light, the electrons are accumulated and integrated centering on the minimum point of the potential of the n-type well region 21 under the p-type diffusion region 44. Thereby, the minimum point of the potential of the n-type well region 21 and the maximum point of the potential of the p-type diffusion region 44 are also modulated. In the timing t2 immediately before the end of the accumulation period, the potential minimum point of the n-type well region 21 is higher than that of the timing t1.

Subsequently, when the readout period is started, and the pulse signal S4 applied to the selection line 4 changes to VM, the whole potential accordingly increases in proportion to (VH-VM). Thereafter, when the signal S9P indicates the low level, and the MOS transistor 9P in FIG. 23 turns on, for three pixels 1 of the same column, the hole current flows from the current source 13 via the pixel indicating the lowest minimum point of the potential of the n+-type diffusion region 43. In this case, while VH is applied to the other selection lines 2, 3 excluding the selection line 4, VM is applied to the selection line 4, the potential of the n+-type diffusion region 43 of the pixel connected to the selection line 4 is highest, and therefore the hole current flows via the pixel connected to the selection line 4. The hole current flowing at this time is shown by arrows a in FIG. 30. That is, the source follower is thereby formed which includes the power potential Vcc, current source 13, MOS transistor 9P, signal line 6, and selected pixel, and the potential is outputted as the signal OUT via the impedance conversion circuit 14 in accordance with the potential of the maximum point of the potential of the p-type diffusion region 44 of the selected pixel. In this case, since the maximum point of the potential of the p-type diffusion region 44 is modulated by the integrated value of the electron generated by the incident light, all the pixels are scanned by the pixel row selection circuit 5 and pixel column selection circuit 12, the signal is successively read out of the impedance conversion circuit 14, and thereby the video signal can be obtained.

Subsequently, in the timing t4 after the readout period ends and the pulse signal S4 applied to the selection line 4 changes to VL, the potential of the n+-type diffusion region 43 rises, and the electron accumulated in the minimum point of the potential of the n-type well region 21 under the p-type diffusion region 44 is thereby discharged to the n+-type diffusion region 55 via the n+-type diffusion region 54.

Also in the fifth embodiment, each pixel is constituted by one junction-type FET, and the structure is simple and suitable for miniaturization as compared with the CCD type. Additionally, the n-type well region 21 in which the charges (electrons) are accumulated forms a p-n junction with the peripheral semiconductor region, and the predetermined voltage is applied to the n-type well region 21, so that the potential is not in the floating state. As a result, after the charges (electrons) are discharged, the background charges do not exist in the n-type well region 21, and the conventional generation of the noise by the fluctuation of the background charge amount can be suppressed.

Moreover, since it is unnecessary to consider the influence of the background charge, the density of the impurity of the n-type well region 21 can be raised to the certain degree. Therefore, the value of the capacitance to the ground potential can sufficiently be secured, the sufficient amount of signal charges (electrons) can be accumulated, and the saturated charge amount can be raised to the certain degree.

Furthermore, the junction gate FET is used in which the polysilicon gate electrode is not used, and the effect that the sensitivity to blue can be prevented from dropping can therefore be obtained. The photodiode including the p-type diffusion region 44 and n-type well region 21 under the diffusion region to perform the photoelectric conversion, the photodiode including the n-type well region 21 and p-type substrate 20, the photodiode including the drain region 41 and n-type well region 21 under the drain region, and the n-type well region 21 under the p-type embedded region 26 in which the charges are accumulated are disposed adjacent to one another, and integrated. Therefore, the effect is obtained that the size of the pixel can be miniaturized as compared with the photodiodes and region formed separately from one another.

SIXTH EMBODIMENT

Figure 34:
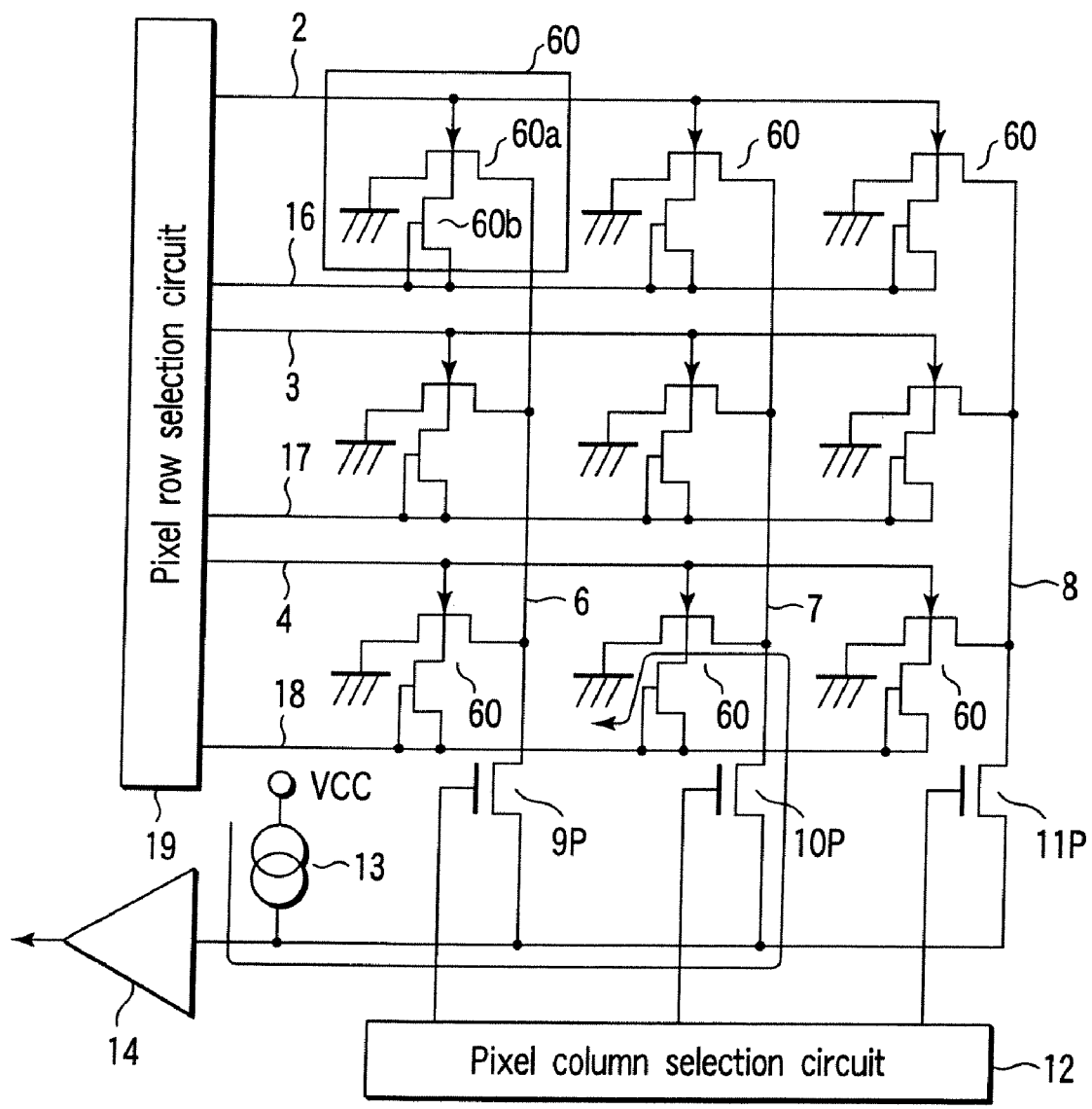
FIG. 34 is a whole circuit diagram of the solid-state image sensor according to a sixth embodiment of the present invention.

FIG. 34 is a whole circuit diagram of the solid-state image sensor according to a sixth embodiment of the present invention.

The solid-state image sensor shown in FIG. 34 is slightly different from that of FIG. 23 in the constitutions of the pixel and pixel row selection circuit, and the other constitution is similar to that of FIG. 23.

In FIG. 34, each pixel 60 includes a junction-type FET portion 60a for photoelectric conversion and a junction-type FET portion 60b for discharging the accumulated charges of the gate of a junction-type FET portion 60a to the ground potential.

The gates of the junction-type FET portions 60a of three pixels 60 of the same row are connected in common to one corresponding line of a plurality of (three in the present example) selection lines 2 to 4 for pixel row selection. Moreover, the sources or drains and gates of the junction-type FET portions 60b in three pixels 60 of the same row are connected in common to one corresponding line of a plurality of (three in the present example) selection lines 16 to 18 for electric discharge. The other source or drain of the junction-type FET portion 60b is connected to the corresponding gate of the junction-type FET portion 60a. It is to be noted that the selection lines 2 to 4 and 16 to 18 are connected to the pixel row selection circuit 19.

In the solid-state image sensor of the sixth embodiment shown in FIG. 34, when the light is incident, the signal charges are accumulated in each pixel 60 in accordance with each light amount, and the threshold voltage of each pixel changes in accordance with the accumulated signal charge amount. Moreover, when the pulse signal outputted from the pixel row selection circuit 19 is applied to any one of the selection lines 2 to 4, the pixel row is selected. Furthermore, when the pulse signal outputted from the pixel column selection circuit 12 is applied to any one of the gates of the MOS transistors 9P to 11P, and the MOS transistor is turned on, the pixel column is selected, and thereby one pixel 60 is selected. In this case, as shown by arrows in FIG. 34, the current path is formed to extend to the ground potential via the power source Vcc, current source 13, MOS transistor having the on state (MOS transistor 10P in the present example), signal line (signal line 7 in the present example), and selected pixel, and the signal is outputted via the impedance conversion circuit 14 in accordance with the threshold voltage of the selected pixel.

When the pulse signal outputted from the pixel row selection circuit 19 is applied to any one of the signal lines 16 to 18, the signal charge accumulated in each pixel 60 is discharged to the ground potential via the junction-type FET portion 60b.

Figure 35:
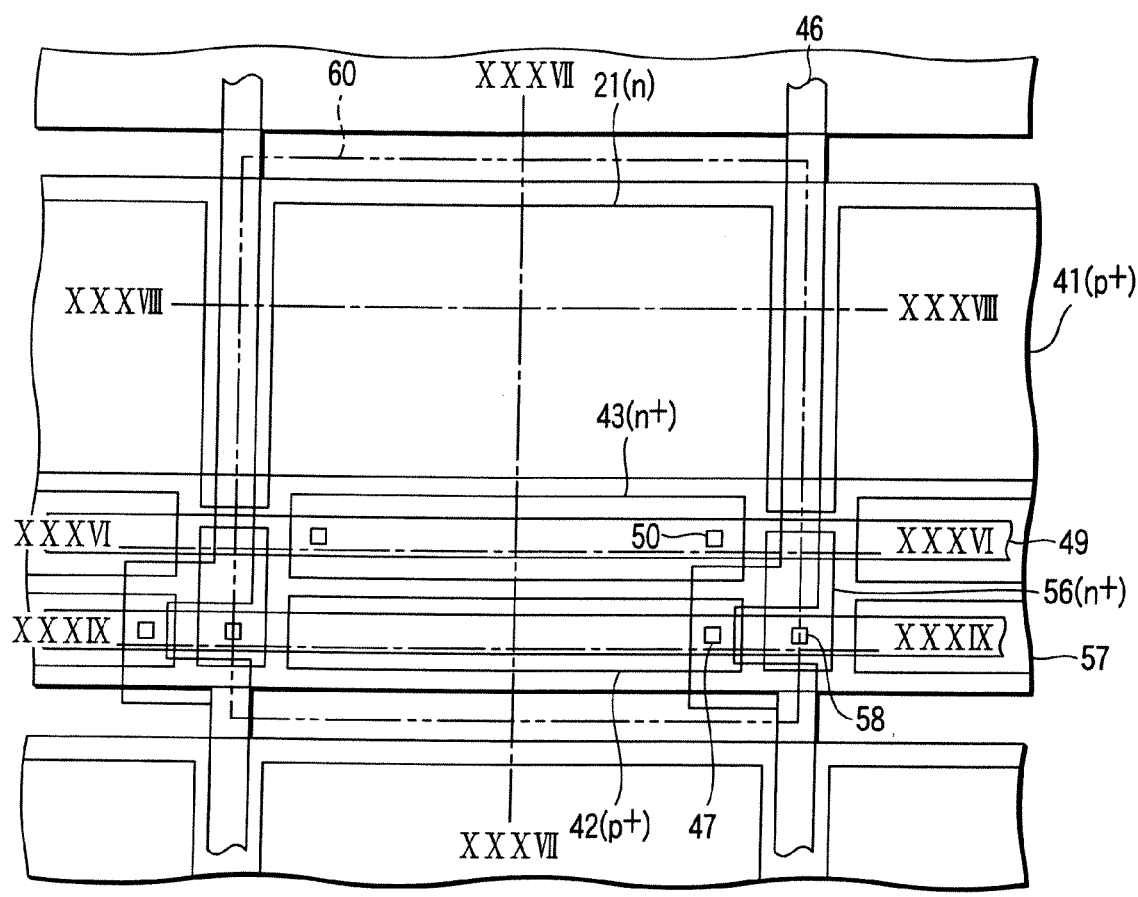
FIG. 35 is a pattern plan view showing the device structure of one pixel in the solid-state image sensor of FIG. 34.

FIG. 35 is a pattern plan view showing the device structure of one pixel in FIG. 34, and FIGS. 36 to 39 is different sectional views.

In the pixel of FIG. 29, the n+-type diffusion region 43 and p-type diffusion region 44 are formed to surround the source region 42 disposed in the middle. On the other hand, in the sixth embodiment, the source region 42 is formed to have the rectangular plane pattern in the peripheral portion of the pixel region defined by a two-dots chain line. Moreover, the n+-type diffusion region 43, p-type diffusion region 44, and drain region 41 are extended in parallel with the source region 42 in the horizontal direction in FIG. 35.

Furthermore, an n+-type diffusion region 56 forming a drain for discharging the signal charges (electrons) accumulated in the n-type well region 21 under the p-type diffusion region 44 is disposed between the p-type diffusion regions 44 of the pixels disposed adjacent to each other in the horizontal direction in FIG. 35. Since the n+-type diffusion region 56 is formed, the wiring layer 46 extended in the vertical direction in FIG. 35 is folded in a substantially U shape in a formed position of the n+ type diffusion region 56. Moreover, a wiring layer 57 is formed in parallel with the wiring layer 49 on the second interlayer insulating film 48, and the n+-type diffusion region 56 is connected to the wiring layer 57 via a contact 58. The wiring layer 57 corresponds to the selection lines 16 to 18 in FIG. 34.

Figure 40:
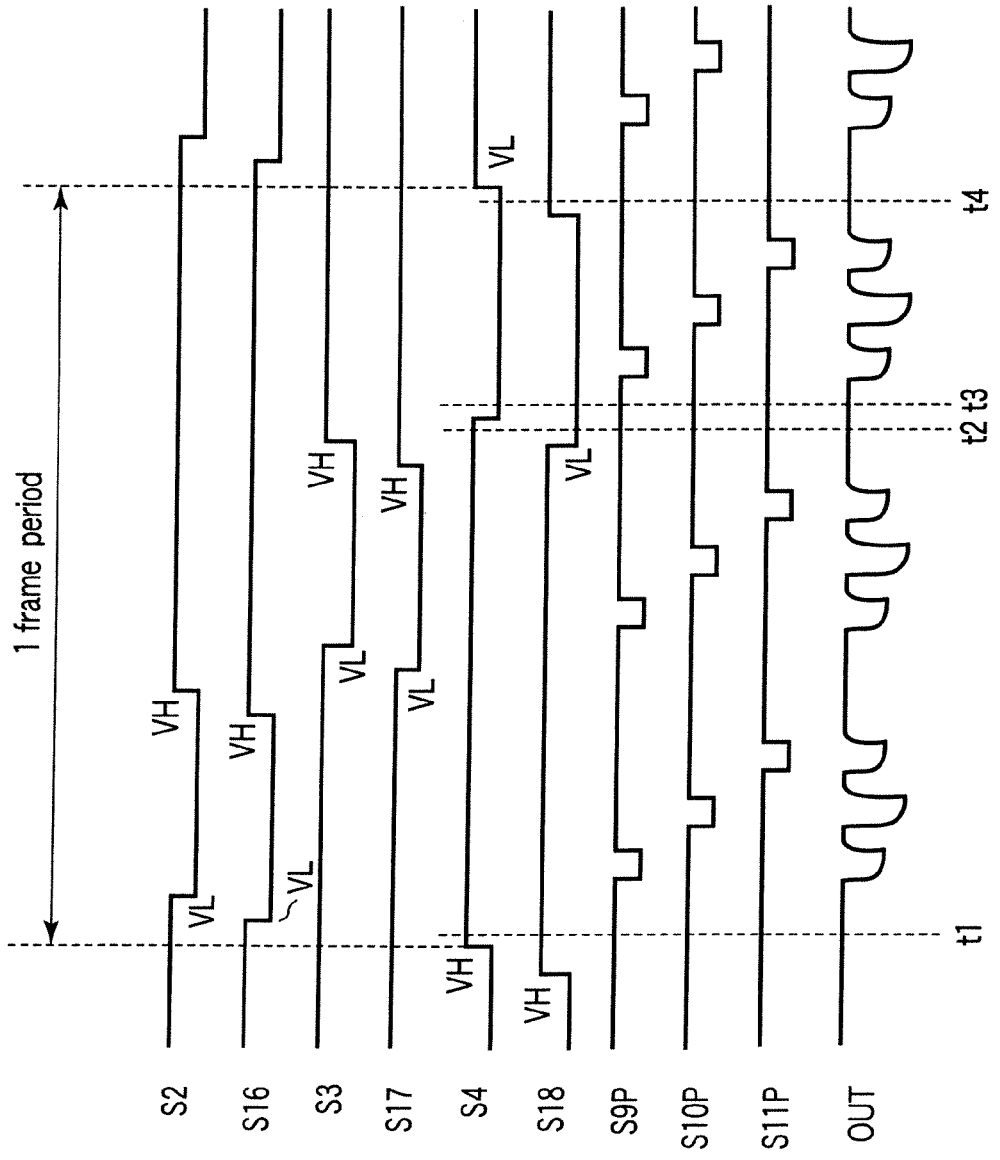
FIG. 40 is a waveform diagram of the major signal in the solid-state image sensor of FIG. 34.

FIG. 40 is a waveform diagram of the major signals in the solid-state image sensor shown in FIG. 34. In FIG. 40, the signals S2, S3, S4 are outputted from the pixel row selection circuit 19, and indicate the waveforms of the pulse signals applied to the selection lines 2 to 4 for row selection. The signals S16, S17, S18 are outputted from the pixel row selection circuit 19, and indicate the waveforms of the pulse signals applied to the selection lines 16 to 18 for electric discharge. The signals S9P, S10P, S11P are outputted from the pixel column selection circuit 12, and indicate the waveforms of the pulse signals applied to the gates of the MOS transistors 9P, 10P, 11P. The signal OUT indicates the waveform of the signal outputted from the impedance conversion circuit 14. As shown in FIG. 40, the pulse signals S2 to S4 having the voltages indicating two values VL, VH are applied to the selection lines 2 to 4. Similarly, the pulse signals S16 to S18 having the voltages indicating two values VL and VH are applied to the selection lines 16 to 18. In the two-valued voltage, VL is lower than VH.

The operation of the solid-state image sensor of FIG. 34 will next be described with reference to FIG. 40.

The period in which the signals are read out of all the pixels 60 is referred to as one frame period. In one frame period, the signals S2 to S4 of the selection lines 2 to 4 rise to VH from VL and then rise to VH from VL. In one frame period, the period in which the signals S2 to S4 of the selection lines 2 to 4 indicate VH is the accumulation period of the signal charges (electrons). The period in which the signals S2 to S4 indicate VL is the readout period. Furthermore, the period in which the signals S2 to S4 indicate VL and the signals S16 to S18 of the selection lines 16 to 18 indicate VH is a discharge period of the signal charges (electrons). Therefore, the substantial signal readout period is a period in which the signals of the selection lines 2 to 4 and 16 to 18 indicate VL.

For example, in the period in which the signal S2 of the selection line 2 indicates the low level (VL), three pixels 60 in the same row connected to the selection line 2 are selected. When the signal S9P is set to the low level in this period, the MOS transistor 9P is turned on, the pixel column is selected, and one pixel 60 is selected. In this case, the current flows into the ground potential via the power potential Vcc, current source 13, MOS transistor 9P, signal line 6, and selected pixel, and the signal indicating the threshold voltage of the selected pixel is outputted as the signal OUT via the impedance conversion circuit 14. Furthermore, when the signals S10P, S11P are successively set to the low level, the MOS transistors 10P, 11P are successively turned on, the different pixel columns are successively selected, the current flows via the signal lines 7, 8 and the corresponding pixels 60 of the selected column, and the signal indicating the threshold voltage of the selected pixel is outputted as the signal OUT via the impedance conversion circuit 14. The pixel row is changed and successively subjected to this operation, so that the signals are read out of all the pixels.

On the other hand, the signals S16 to S18 of the selection lines 16 to 18 are set to VL, before the signal readout period from three pixels 60 in each pixel row is started. Furthermore, the signals S16 to S18 of the selection lines 16 to 18 are set to VH, before the signal readout period ends and the signals S2 to S4 of the selection lines 2 to 4 are set to VL. In the period in which the signals S2 to S4 of the selection lines 2 to 4 indicate VL and the signals of the selection lines 16 to 18 indicate VH, the electrons accumulated in the n-type well region 21 under the p-type diffusion region 44 are discharged to the n+-type diffusion region 56, and the reset operation is performed.

It is to be noted that the reset operation is performed, when the signals S2 to S4 of the signal lines 2 to 4 indicate VL and signals S16 to S18 of the signal lines 16 to 18 indicate VH. Therefore, the signals S16 to S18 of the signal lines 16 to 18 are lowered to VL, before the signals S2 to S4 of the signal lines 2 to 4 are set to VL and the readout period is started.

Figure 41:
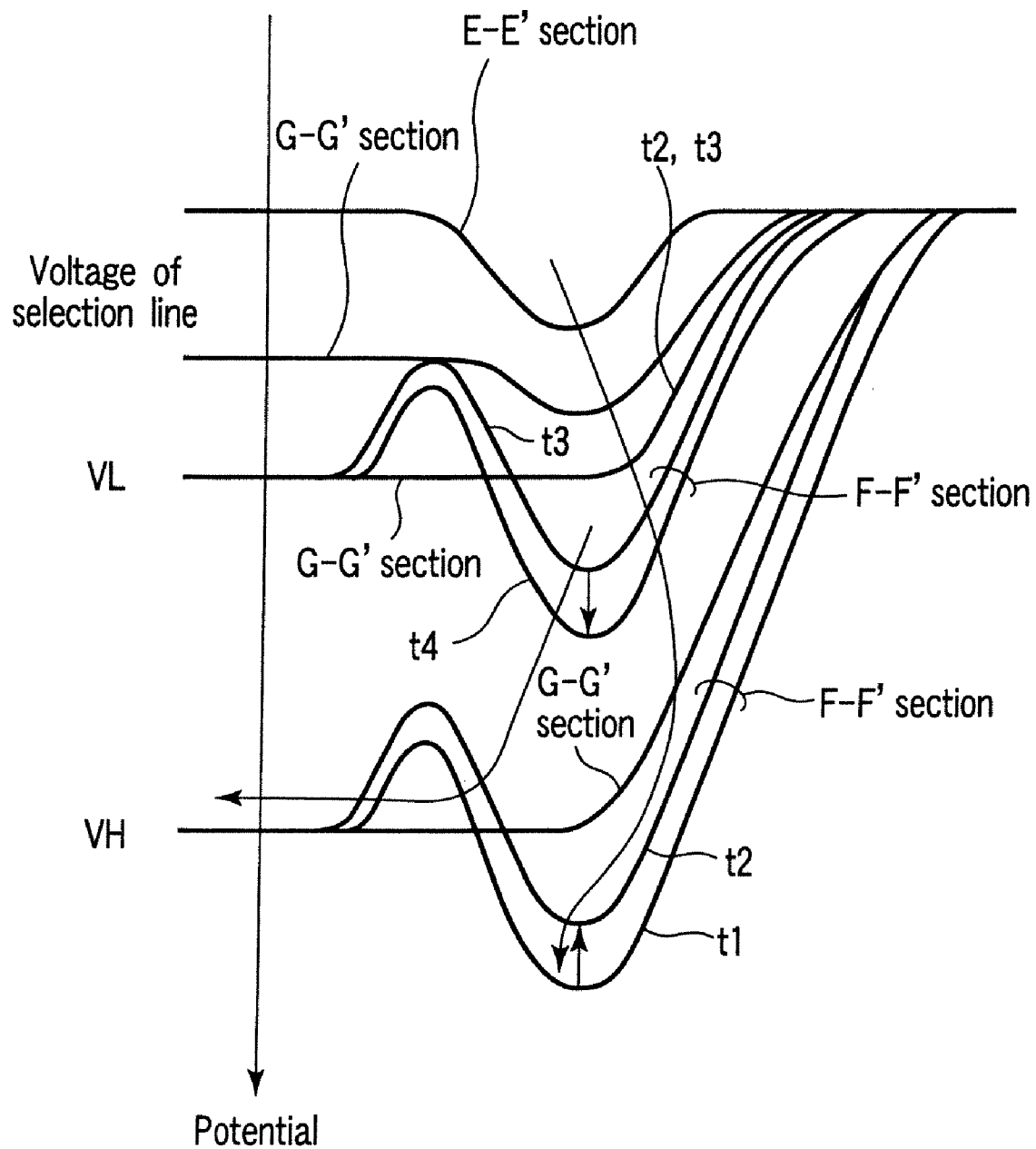
FIG. 41 is a diagram showing the potential states in the sections along lines E-E', F-F', and G-G' of FIG. 37 in the respective timings t1 to t4 in the signal waveform diagram of FIG. 40.

FIG. 41 shows the potential states in the sections taken along lines E-E', F-F', and G-G' of FIG. 37 in the respective timings t1 to t4 in the signal waveform diagram of FIG. 40.

The accumulation operation of the electrons in each pixel, signal readout operation, and reset operation will next be described in detail with reference to the potential diagram of FIG. 41.

In the timing t1 immediately after the start of the accumulation period immediately after the pulse signal S4 applied to the selection line 4 changes to VH, as described above, for the plurality of electron-hole pairs generated in accordance with the incident light, the electrons are accumulated and integrated in the n-type well region 21 under the p-type diffusion region 44. Thereby, the minimum point of the potential of the n-type well region 21 and the maximum point of the potential of the p-type diffusion region 44 are also modulated. In the timing t2 immediately before the end of the accumulation period, the potential of the n-type well region 21 is higher than that of the timing t1.

Subsequently, when the readout period is started, and the pulse signal S4 applied to the selection line 4 changes to VL, the whole potential accordingly increases in proportion to (VH-VL). Additionally, since the p-type substrate 20 is fixed at the ground potential, the potential of the substrate 20 is constant and does not change. Thereafter, when the signal S9 indicates the low level, and the MOS transistor 9P in FIG. 34 turns on, for three pixels 60 of the same column, the hole current flows via the pixel indicating the lowest potential of the n+-type diffusion region 43. At this time, while VH is applied to the other selection lines 2, 3 excluding the selection line 4, VL is applied to the selection line 4, the potential of the n+-type diffusion region 43 of the pixel connected to the selection line 4 is highest, and therefore the hole current flows via the pixel connected to the selection line 4. The current path flowing at this time is shown by arrows a in FIG. 37. That is, the source follower is thereby formed which includes the power potential Vcc, current source 13, MOS transistor 9P, signal line 6, and selected pixel, and the potential is outputted as the signal OUT via the impedance conversion circuit 14 in accordance with the potential indicating the potential value of the maximum point of the potential of the p-type diffusion region 44 of the selected pixel 60. In this case, since the maximum point of the potential of the p-type diffusion region 44 is modulated by the integrated value of the electrons generated by the incident light, all the pixels are scanned by the pixel row selection circuit 19 and pixel column selection circuit 12, the signal is successively read out of the impedance conversion circuit 14, and thereby the video signal can be obtained.

Subsequently, in the timing t4 after the pulse signal S4 applied to the selection line 4 indicates VL and the pulse signal S18 applied to the selection line 18 changes to VH from VL, the electrons accumulated in the n-type well region 21 under the p-type diffusion region 44 in FIG. 36 is discharged to the n+-type semiconductor region 56 in a path shown by an arrow b in the drawings. Thereby, the potential of the p-type diffusion region 44 drops, and the reset operation is performed.

That is, in the sixth embodiment, the photoelectrically converted and accumulated electrons are discharged to the n+-type diffusion region 56 formed in the surface region of the n-type well region 21 without being discharged to the drain region 41 as in the fourth embodiment, or to the n+-type diffusion region 55 as in the fifth embodiment.

It is to be noted that both the n+-type diffusion regions 43 and 56 are formed in the surface of the n-type well region 21. Therefore, when the voltages applied to the regions differ from each other, the current possibly flows between the regions. To prevent this, when the impurity density of the n-type well region 21 surface is adjusted to obtain a high resistance, the current value can be set to be small, and therefore an adverse influence by the flowing of the current can be avoided.

Figure 42:
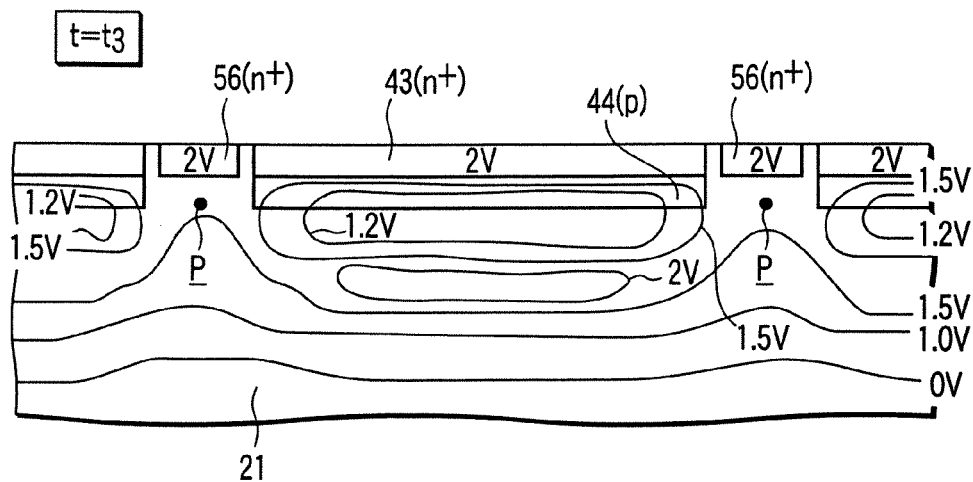
FIG. 42 is a diagram two-dimensionally showing the potential state in the A-A' section of FIG. 35.
Figure 43:
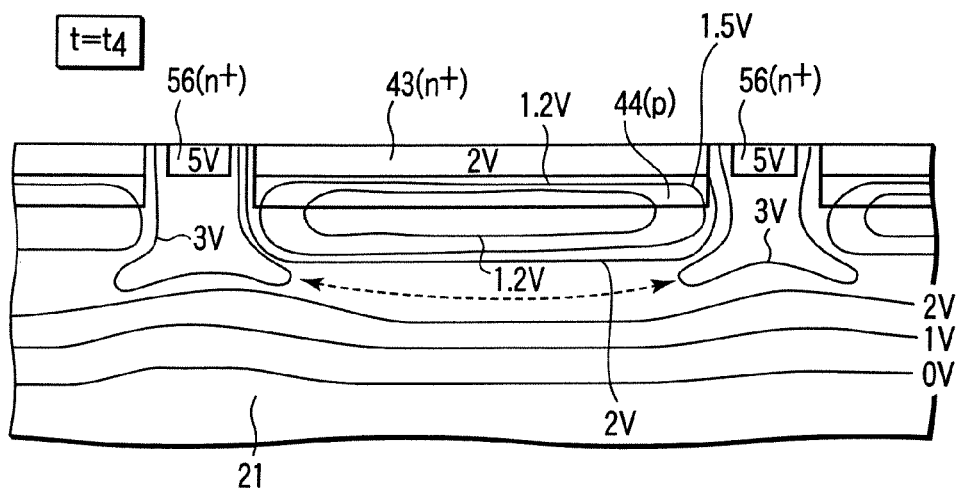
FIG. 43 is a diagram two-dimensionally showing the potential state in the A-A' section of FIG. 35 in the timings different from those of FIG. 42.

FIGS. 42 and 43 two-dimensionally show the potential state in the section along line XXXVI-XXXVI in FIG. 35. It is to be noted that FIG. 42 shows the state in the timing t3 immediately after the readout start, and FIG. 43 shows the state in the timing t4 at the electric discharge time. Moreover, the voltage shown in the drawing indicates the potential. When the voltage increases, the potential deepens.

As shown in FIG. 42, immediately after the readout start (t=t3), the saddle point P of the potential is positioned in the n-type well region 21 under the n+-type diffusion region 56, the signal charges (electrons) are accumulated in the vicinity of the p-type diffusion region 44, and the path in which the hole current flows is formed in the vicinity of the p-type diffusion region 44.

At the electric discharge time (t=t4), as shown by a broken-line arrow in FIG. 43, the potential successively rises toward the n+-type diffusion region 56 from below the p-type diffusion region 44, and the electron charges accumulated under the p-type diffusion region 44 are discharged to the n+-type diffusion region 56. It is to be noted that the supply of the voltage VH of 5V to the n+-type diffusion region 56 at the electric discharge time has been described in this example.

As described above, even in the solid-state image sensor of the sixth embodiment, each pixel is substantially constituted by one junction-type FET, and the structure is simple and suitable for miniaturization as compared with the CCD type. Additionally, the n-type well region 21 in which the charges (electrons) are accumulated forms a p-n junction with the peripheral semiconductor region, and the predetermined voltage is applied to the n-type well region 21, so that the potential is not in the floating state. As a result, after the charges (electrons) are discharged, the background charges do not exist in the n-type well region 21, and the conventional generation of the noise by the fluctuation of the background charge amount can be suppressed.

Moreover, since it is unnecessary to consider the influence of the background charge, the density of the impurity of the n-type well region 21 can be raised to the certain degree. Therefore, the value of the capacity to ground can sufficiently be secured, the sufficient amount of signal charges (electrons) can be accumulated, and the saturated charge amount can therefore be raised by the certain degree.

Furthermore, the junction gate FET is used in which the polysilicon gate electrode is not used, and the effect that the sensitivity to blue can be prevented from dropping can therefore be obtained. The photodiode including the p-type diffusion region 44 and n-type well region 21 under the diffusion region to perform the photoelectric conversion, the photodiode including the n-type well region 21 and p-type substrate 20, and n-type well region 21 under the p-type embedded region 26 in which the charges are accumulated are disposed adjacent to one another, and integrated. Therefore, the effect is obtained that the size of the pixel can be miniaturized as compared with the photodiodes and region formed separately from one another.

APPLICATION EXAMPLE

Figure 44:
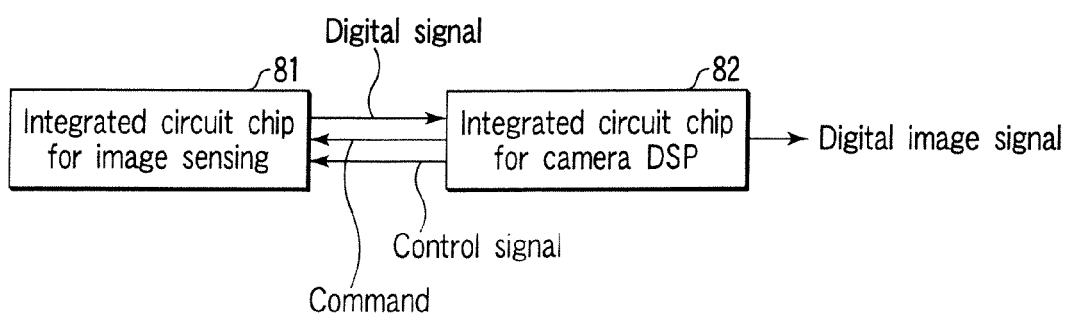
FIG. 44 is a schematic block constitution diagram of a control circuit of an electronic camera using the solid image sensor according to the first to sixth embodiments.

FIG. 44 shows a schematic block constitution of a control circuit of an electronic camera using the solid-state image sensor according to the first to sixth embodiments. In FIG. 44, reference numeral 81 denotes an integrated circuit chip for solid-state image sensing in which in addition to the solid-state image sensor according to the first to sixth embodiment, a timing generator and control circuit such as an A/D conversion circuit are integrated, and 82 denotes an integrated circuit chip for camera digital signal processor (DSP).

The integrated circuit chip 82 supplies commands and various types of control signals to the integrated circuit chip 81. The integrated circuit chip 81 supplies the image signal read by photoelectric conversion as a digital signal to the integrated circuit chip 82. The integrated circuit chip 82 subjects the supplied image signal to various types of signal processing such as white balance adjustment and gamma processing, and outputs a digital image signal.

FIGS. 45A and 45B are plan and sectional views of a camera module in which the integrated circuit chip 81 and integrated circuit chip 82 shown in FIG. 44 are formed as a module together with lenses. In this module, the integrated circuit chip for solid-state image pickup 81 contained in a container 92 is laid on a surface side of a base 91, and an infrared ray (IR) removal filter 93 is attached onto the chip. Furthermore, a lens module 95 including a focusing lens 94 for irradiating the surface of the integrated circuit chip 81 with light is attached onto the IR removal filter 93. Moreover, the integrated circuit chip 82 is laid on a back surface side of the base 91, and the integrated circuit chip 81 is electrically connected to the integrated circuit chip 82. Additionally, the base 91 is connected to a flexible cable 96, and a signal is transmitted/received with respect to the outside via the flexible cable 96.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A solid-state image sensor comprising:
a semiconductor substrate; and
a plurality of pixels formed in the semiconductor substrate and each having an accumulation period of signal charges, signal readout period, and discharge period of the signal charges and each including:
a first semiconductor region of a first conductive type formed in the semiconductor substrate;
a source region which is formed in a surface region of the first semiconductor region and which is of a second conductive type opposite to the first conductive type;
a drain region of the second conductive type which is formed apart from the source region in the surface region of the first semiconductor region;
a second semiconductor region of the first conductive type which is formed in the surface region of the first semiconductor region between the source region and the drain region and to which different voltages are supplied in the accumulation period of the signal charges in the pixel, signal readout period, and discharge period of the signal charges; and
a third semiconductor region of the second conductive type which is formed in the first semiconductor region under the second semiconductor region and electrically connected to the second semiconductor region and which accumulates the signal charges in accordance with an incident light,
wherein one portion of the drain region is positioned in the surface of the semiconductor substrate.

2. The solid-state image sensor according to claim 1, wherein the semiconductor substrate has the second conductive type, and is fixed at a predetermined potential.

3. The solid-state image sensor according to claim 1, wherein the second semiconductor region and third semiconductor region are formed to surround the source region, and the drain region is formed to surround the second semiconductor region and third semiconductor region.

4. The solid-state image sensor according to claim 1, wherein with respect to the second semiconductor region, a first voltage is supplied in the accumulation period of the signal charges, a second voltage lower than the first voltage is supplied in the signal readout period, and a third voltage higher than the second voltage is supplied in the discharge period of the signal charges.

5. A camera module comprising:
a first integrated circuit chip for image sensing which outputs an image signal read by photoelectric conversion of an incident light as a digital signal;
a second integrated circuit chip for signal processing which receives the digital signal outputted from the first integrated circuit chip and which subjects the digital signal to various types of signal processing to output a digital image signal; and
a lens which is disposed on the first integrated circuit chip and which irradiates a surface of the first integrated circuit chip with light,
the first integrated circuit chip including:
a semiconductor substrate; and
a plurality of pixels formed in the semiconductor substrate and each having an accumulation period of signal charges, signal readout period, and discharge period of the signal charges and each including:
a first semiconductor region of a first conductive type formed in the semiconductor substrate;
a source region which is formed in a surface region of the first semiconductor region and which is of a second conductive type opposite to the first conductive type;
a drain region of the second conductive type which is formed apart from the source region in the surface region of the first semiconductor region;
a second semiconductor region of the first conductive type which is formed in the surface region of the first semiconductor region between the source region and the drain region and to which different voltages are supplied in the accumulation period of the signal charges in the pixel, signal readout period, and discharge period of the signal charges; and
a third semiconductor region of the second conductive type which is formed in the first semiconductor region under the second semiconductor region and electrically connected to the second semiconductor region and which accumulates the signal charges in accordance with an incident light,
wherein one portion of the drain region is positioned in the surface of the semiconductor substrate.

6. The camera module according to claim 5, wherein the semiconductor substrate has the second conductive type, and is fixed at a predetermined potential.

7. The camera module according to claim 5, wherein the second semiconductor region and third semiconductor region are formed to surround the source region, and the drain region is formed to surround the second semiconductor region and third semiconductor region.

8. The camera module according to claim 5, wherein with respect to the second semiconductor region, a first voltage is supplied in the accumulation period of the signal charges, a second voltage lower than the first voltage is supplied in the signal readout period, and a third voltage higher than the second voltage is supplied in the discharge period of the signal charges.

* * * * *